(12) United States Patent
Takada et al.

(10) Patent No.: US 10,031,164 B2
(45) Date of Patent: Jul. 24, 2018

(54) SEMICONDUCTOR DEVICE

(71) Applicant: RENESAS ELECTRONICS CORPORATION, Tokyo (JP)

(72) Inventors: Keita Takada, Tokyo (JP); Nobuya Koike, Tokyo (JP); Akihiro Nakahara, Tokyo (JP); Makoto Tanaka, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 125 days.

(21) Appl. No.: 15/271,537

(22) Filed: Sep. 21, 2016

(65) Prior Publication Data

US 2017/0089957 A1    Mar. 30, 2017

(30) Foreign Application Priority Data

Sep. 30, 2015   (JP) ................. 2015-193929

(51) Int. Cl.
*G01R 1/30* (2006.01)
*G01R 17/16* (2006.01)
(Continued)

(52) U.S. Cl.
CPC ......... *G01R 17/16* (2013.01); *G01R 19/0092* (2013.01); *H01L 23/535* (2013.01);
(Continued)

(58) Field of Classification Search
CPC .............. H01L 29/847; H01L 29/7815; H01L 29/7813; H01L 29/7803; H01L 29/41741;
(Continued)

(56) References Cited

U.S. PATENT DOCUMENTS

| 5,034,796 A | 7/1991 | Zommer |
| 5,815,027 A * | 9/1998 | Tihanyi .................. G01R 1/203 |
| | | 327/538 |

(Continued)

FOREIGN PATENT DOCUMENTS

| JP | H08-334534 A | 12/1996 |
| JP | 2006-500780 A | 1/2006 |
| JP | 2010-109076 A | 5/2010 |

OTHER PUBLICATIONS

H. Takaya et al., "Power metal oxide semiconductor field effect transistors with accurate current sensing function over a wide temperature range," IET Power Electron, 2011, vol. 4, Issue 5, pp. 503-507.

(Continued)

*Primary Examiner* — Tung X Nguyen
*Assistant Examiner* — Dominic Hawkins
(74) *Attorney, Agent, or Firm* — McDermott Will & Emery LLP

(57) ABSTRACT

A power MOSFET and a sense MOSFET for detecting a current of the power MOSFET are formed in a semiconductor chip, and a source pad and a Kelvin pad are formed of a source electrode for the power MOSFET. The source pad is a pad for outputting the current flowing to the power MOSFET, and the Kelvin pad is a pad for detecting a source potential of the power MOSFET. The source electrode has a slit, and at least a part of the slit is arranged between the source pad and the Kelvin pad when seen in a plan view.

13 Claims, 34 Drawing Sheets

(51) Int. Cl.
*G01R 19/00* (2006.01)
*H01L 23/535* (2006.01)
*H01L 27/088* (2006.01)
*H01L 29/08* (2006.01)
*H01L 29/417* (2006.01)
*H01L 29/78* (2006.01)
*H01L 27/02* (2006.01)
*H01L 21/8234* (2006.01)

(52) U.S. Cl.
CPC ........ *H01L 27/0207* (2013.01); *H01L 27/088* (2013.01); *H01L 29/0847* (2013.01); *H01L 29/41741* (2013.01); *H01L 29/7803* (2013.01); *H01L 29/7813* (2013.01); *H01L 29/7815* (2013.01); *H01L 21/823487* (2013.01); *H01L 27/0251* (2013.01); *H01L 2224/0603* (2013.01); *H01L 2224/32245* (2013.01); *H01L 2224/48091* (2013.01); *H01L 2224/48137* (2013.01); *H01L 2224/48247* (2013.01); *H01L 2224/73265* (2013.01); *H01L 2924/181* (2013.01)

(58) Field of Classification Search
CPC ... H01L 2224/0603; H01L 2224/73265; H01L 2224/48247; H01L 2224/48137; H01L 2224/48091; H01L 2224/32245
See application file for complete search history.

(56) References Cited

U.S. PATENT DOCUMENTS

| | | | | |
|---|---|---|---|---|
| 7,557,599 | B2* | 7/2009 | Graf | G01R 19/0092 |
| | | | | 324/762.07 |
| 7,759,982 | B2* | 7/2010 | Shimada | G01R 19/0092 |
| | | | | 327/541 |
| 8,493,136 | B2* | 7/2013 | Bellaouar | H03D 7/1458 |
| | | | | 327/540 |
| 8,633,723 | B2 | 1/2014 | Takeuchi | |
| 2005/0286194 | A1 | 12/2005 | Fujiki et al. | |
| 2006/0163652 | A1 | 7/2006 | Lowis | |
| 2006/0252258 | A1* | 11/2006 | Wu | H01L 21/76801 |
| | | | | 438/638 |
| 2010/0289982 | A1* | 11/2010 | Akiyama | G09G 3/342 |
| | | | | 349/61 |
| 2011/0215400 | A1* | 9/2011 | Nakamura | H01L 29/66 |
| | | | | 257/334 |
| 2013/0049137 | A1 | 2/2013 | Uno et al. | |
| 2014/0015046 | A1* | 1/2014 | Thiele | H01L 23/58 |
| | | | | 257/334 |

OTHER PUBLICATIONS

Extended European Search Report issued in corresponding EP Application No. 16189275.7, dated Feb. 16, 2017.

* cited by examiner

SEMICONDUCTOR DEVICE

CROSS-REFERENCE TO RELATED APPLICATION

The present application claims priority from Japanese Patent Application No. 2015-193929 filed on Sep. 30, 2015, the content of which is hereby incorporated by reference into this application.

TECHNICAL FIELD OF THE INVENTION

The present invention relates to a semiconductor device, and can be effectively applied to, for example, a semiconductor device having a power transistor and a transistor for current detection.

BACKGROUND OF THE INVENTION

Japanese Patent Application Laid-Open Publication No. H8-334534 (Patent Document 1), Japanese Patent Application Laid-Open Publication No. 2006-500780 (Patent Document 2), U.S. Pat. No. 5,034,796 (Patent Document 3) and "Power metal oxide semiconductor field effect transistors with accurate current sensing function over a wide temperature range", IET Power Electron., 2011, Vol. 4, Iss5, pp. 503-507 (Non-Patent Document 1) describe techniques relating to a power semiconductor device provided with a current detection circuit.

SUMMARY OF THE INVENTION

There is a demand for improvement in performance of a semiconductor device having a power transistor and a transistor for current detection.

Other problems and novel characteristics will be apparent from description of the present specification and the attached drawings.

According to an embodiment, a semiconductor device having a power MOSFET and a sense MOSFET for detecting a current of the power MOSFET includes a first source pad and a second source pad which are formed of a source electrode for the power MOSFET. The first source pad is a pad for outputting the current flowing to the power MOSFET, and the second source pad is a pad for detecting a source potential of the power MOSFET. The source electrode has a slit, and at least a part of the slit is arranged between the first source pad and the second source pad when seen in a plan view.

According to an embodiment, it is possible to improve the performance of the semiconductor device.

BRIEF DESCRIPTIONS OF THE DRAWINGS

DESCRIPTIONS OF THE PREFERRED EMBODIMENTS

Figure 1:
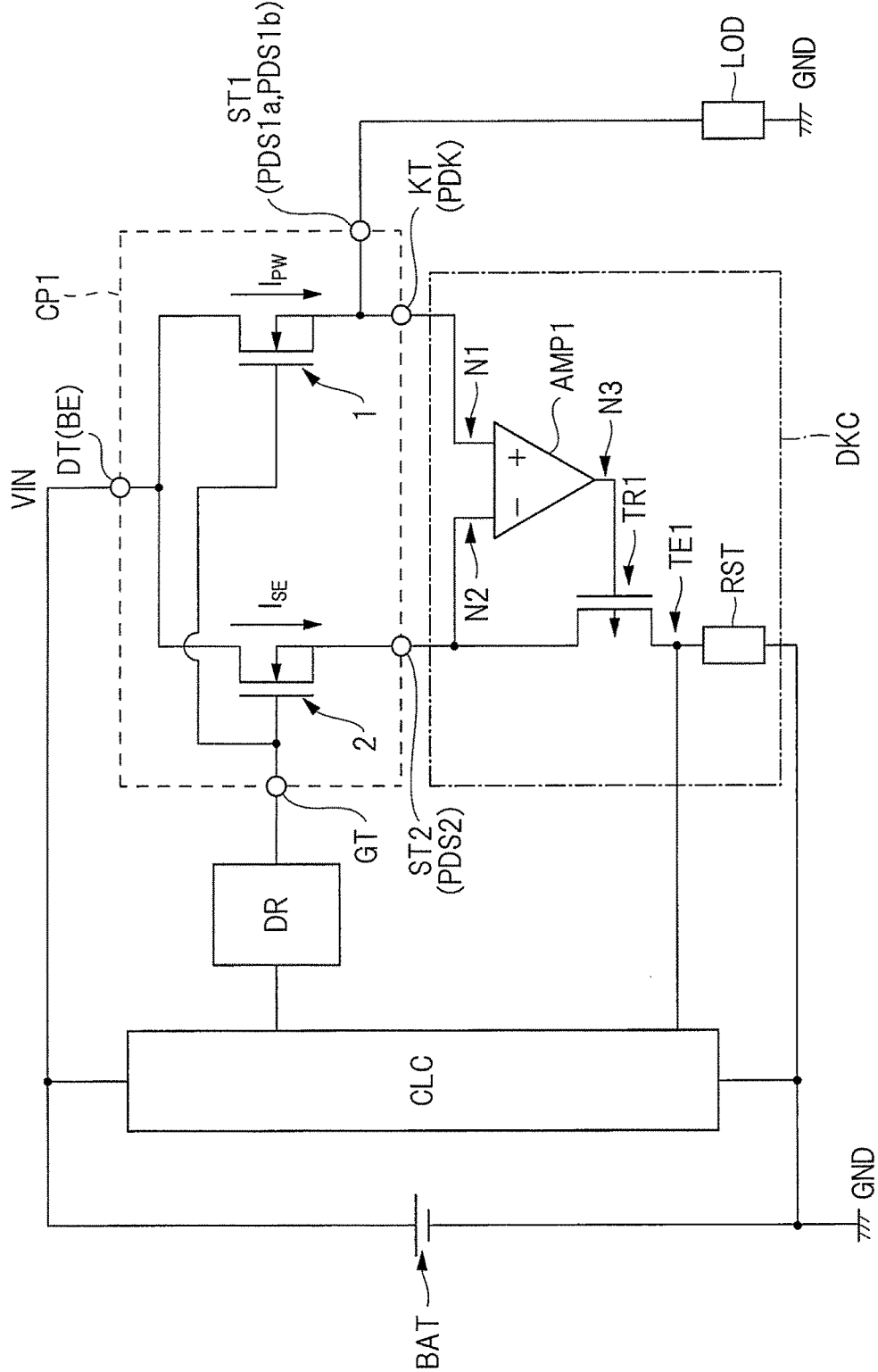
FIG. 1 is a circuit diagram showing an example of an electronic device using a semiconductor chip according to an embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modified example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a cross-sectional view so as to make the drawings easy to see. Further, hatching is used even in a plan view so as to make the drawings easy to see.

In addition, a field effect transistor is described as a MOSFET (Metal Oxide Semiconductor Field Effect Transistor) or simply as a MOS in the present application, but it includes not only the case of using an oxide film as a gate insulating film but also the case of using an insulating film other than the oxide film as the gate insulating film.

First Embodiment

<Circuit Configuration>
FIG. 1 is a circuit diagram showing an example of an electronic device using a semiconductor chip (semiconductor device) CP1 according to an embodiment of the present invention.

The semiconductor chip CP1 used in the electronic device shown in FIG. 1 includes a power MOSFET (Metal Oxide Semiconductor Field Effect Transistor) 1 and a sense MOSFET 2 for detecting a current flowing to the power MOSFET 1. Namely, the part surrounded by the dotted line in FIG. 1 is configured as the semiconductor chip CP1.

The semiconductor chip CP1 incorporates the power MOSFET 1 and the sense MOSFET 2 and further includes a drain terminal DT, a gate terminal GT, a source terminal ST1, a source terminal ST2 and a Kelvin terminal KT. Note that the drain terminal DT corresponds to a back electrode BE to be described later, the gate terminal GT corresponds to a gate pad PDG to be described later, the source terminal ST1 corresponds to source pads PDS1a and PDS1b to be described later, the source terminal ST2 corresponds to a source pad PDS2 to be described later, and the Kelvin terminal KT corresponds to a Kelvin pad PDK to be described later.

A drain, a source and a gate of the power MOSFET 1 formed in the semiconductor chip CP1 are connected to the drain terminal DT, the source terminal ST1 and the gate terminal GT, respectively. In addition, a drain, a source and a gate of the sense MOSFET 2 formed in the semiconductor chip CP1 are connected to the drain terminal DT, the source terminal ST2 and the gate terminal GT, respectively. In addition, the source of the power MOSFET 1 formed in the semiconductor chip CP1 is connected also to the Kelvin terminal KT.

The drain terminal DT (back electrode BE) of the semiconductor chip CP1 is connected to a high-potential side of a power supply (battery) BAT, so that a power-supply potential (power-supply voltage) VIN is supplied from the power supply BAT to the drain terminal DT of the semiconductor chip CP1. The source terminal ST1 of the semiconductor chip CP1 is connected to one end of a load LOD, and the other end of the load LOD is connected to a ground potential (grounded potential or fixed potential) GND. Namely, the load LOD is interposed between the source terminal ST1 of the semiconductor chip CP1 and the ground potential GND. Thus, the source of the power MOSFET 1 is connected to the load LOD via the source terminal ST1. Accordingly, the power MOSFET 1 and the load LOD are connected in series between the power-supply potential VIN (the high-potential side of the power supply BAT) and the ground potential GND. A lamp, a solenoid, a motor or the like can be exemplified as the load LOD.

The gate terminal GT of the semiconductor chip CP1 is electrically connected to a driver circuit (drive circuit) DR. The driver circuit DR is a circuit that controls a potential of the gate of the power MOSFET 1 to control an operation of the power MOSFET 1. The driver circuit DR is connected to a control circuit unit CLC and is controlled by the control circuit unit CLC. The driver circuit DR controlled by the control circuit unit CLC supplies a gate signal (gate voltage) to the gate terminal GT of the semiconductor chip CP1, and the gate signal (gate voltage) is thus supplied to the respective gates of the power MOSFET 1 and the sense MOSFET 2. ON/OFF state of the power MOSFET 1 and the sense MOSFET 2 is controlled by the gate signal supplied from the driver circuit DR to the respective gates of the power MOSFET 1 and the sense MOSFET 2. Note that, since the gate of the power MOSFET 1 and the gate of the sense MOSFET 2 are connected to the gate terminal GT, the common gate signal is supplied from the driver circuit DR to the gate of the power MOSFET 1 and the gate of the sense MOSFET 2. In addition, there may be a case in which a resistive element (not shown) is interposed between the gate terminal GT of the semiconductor chip CP1 and the driver circuit DR and a gate signal is supplied from the driver circuit DR to the gate terminal GT of the semiconductor chip CP1 via the resistive element.

The power MOSFET 1 is a switching transistor (switching element). When an ON-voltage (gate voltage equal to or higher than a threshold voltage) is applied to the gate of the power MOSFET 1 and the power MOSFET 1 is turned into an ON-state (conducting state), a current flows to the power MOSFET 1 and the load LOD connected in series between the power-supply potential VIN and the ground potential GND. On the other hand, when an OFF-voltage (gate voltage lower than a threshold voltage) is applied to the gate of the power MOSFET 1 and the power MOSFET 1 is turned into an OFF-state (non-conducting state), it is possible to prevent the current from flowing to the power MOSFET 1 and the load LOD connected in series. Thus, it is possible to control the current flowing to the load LOD by controlling the power MOSFET 1.

The power MOSFET 1 is formed in the semiconductor chip CP1. In addition, the power MOSFET 1 is formed of, for example, an n-channel field effect transistor. Herein, a channel of the field effect transistor is formed in a thickness direction of the semiconductor chip CP1. In this case, a channel width per unit area can be increased and an ON-resistance can be reduced as compared to a field effect transistor whose channel is formed along a main surface of the semiconductor chip CP1 (a surface orthogonal to the thickness direction of the semiconductor chip CP1), and thus, it is possible to achieve the reduction in size of the semiconductor chip and the semiconductor package.

The sense MOSFET 2 is a field effect transistor for detecting the current flowing to the power MOSFET 1. In addition, the electronic device shown in FIG. 1 includes a current detection circuit unit DKC that detects a current flowing to the sense MOSFET 2. The current detection circuit unit DKC includes a transistor TR1, a resistor (sense resistor) RST and an operational amplifier (differential amplifier or amplifier circuit) AMP1 as a differential amplifier. The current flowing to the power MOSFET 1 can be indirectly detected by the sense MOSFET 2 and the current detection circuit unit DKC.

The sense MOSFET 2 is formed in the semiconductor chip CP1 together with the power MOSFET 1. On the other hand, the current detection circuit unit DKC is formed outside the semiconductor chip CP1. The sense MOSFET 2 is formed inside the semiconductor chip CP1 so as to form a current mirror circuit together with the power MOSFET 1, and has a size of, for example, 1/20000 of that of the power MOSFET 1. Although this size ratio can be changed if necessary, the following description is given with the size ratio of 1/20000.

The sense MOSFET 2 shares the drain and the gate with the power MOSFET 1. Namely, the drains of the sense MOSFET 2 and the power MOSFET 1 are electrically connected to be a common drain, and this common drain is connected to the drain terminal DT to supply the same potential (power-supply potential VIN) to the drain of the sense MOSFET 2 and the drain of the power MOSFET 1. In addition, the gates of the sense MOSFET 2 and the power MOSFET 1 are electrically connected to be a common gate, and this common gate is connected to the gate terminal GT to input the same gate signal (gate voltage) to the gate of the sense MOSFET 2 and the gate of the power MOSFET 1.

On the other hand, the source of the sense MOSFET 2 is not common to the source of the power MOSFET 1. While the source of the power MOSFET 1 is connected to the source terminal ST1 and the load LOD is connected to the source terminal ST1, the source of the sense MOSFET 2 is connected to the source terminal ST2 and the source terminal ST2 is connected to a source of the transistor TR1. Thus, the source of the sense MOSFET 2 is connected to (the source of) the transistor TR1 via the source terminal ST2. The transistor TR1 is a p-channel MOSFET. The transistor TR1 can function as a resistive element (variable resistive element) controlled by the operational amplifier AMP1.

A drain of the transistor TR1 is connected to the resistor RST, and this resistor RST is a resistive element for current-voltage conversion. To be specific, the drain of the transistor TR1 is connected to one end of the resistor RST, and the other end of the resistor RST is connected to the ground potential GND. Namely, the drain of the transistor TR1 is connected to the ground potential GND via the resistor RST. Accordingly, the sense MOSFET 2, the transistor TR1 and the resistor RST are connected in series in this order from the side of the power-supply potential VIN between the power-supply potential VIN (the high-potential side of the power supply BAT) and the ground potential GND.

The Kelvin terminal KT and the source terminal ST2 are connected to two input nodes (N1, N2) of the operational amplifier AMP1, respectively. To be specific, the source of the power MOSFET 1 is connected to a non-inverting input node (first input node) N1 of the operational amplifier AMP1 via the Kelvin terminal KT, and the source of the sense MOSFET 2 is connected to an inverting input node (second input node) N2 of the operational amplifier AMP1 via the source terminal ST2. Further, the gate of the transistor TR1 is connected to an output node N3 of the operational amplifier AMP1. The gate of the transistor TR1 is driven by a gate voltage supplied from the output node N3 of the operational amplifier AMP1 to the gate of the transistor TR1, and accordingly, the resistance (resistance between the source and the drain) of the transistor TR1 is controlled.

The sense MOSFET 2 is an element for detecting a current $I_{PW}$ flowing to the power MOSFET 1. When the source voltage of the sense MOSFET 2 and the source voltage of the power MOSFET 1 are equal, a current with a predetermined ratio (herein, 1/20000) of the current $I_{PW}$ flows to the sense MOSFET 2 due to the above-described current mirror configuration. Namely, a size ratio between the power MOSFET 1 and the sense MOSFET 2 is set so that a current $I_{SE}$ flowing to the sense MOSFET 2 becomes 1/20000 the current $I_{PW}$ (that is, $I_{SE}=I_{PW}/20000$) when the current $I_{PW}$ flows to the power MOSFET 1. The operational amplifier AMP1 and the transistor TR1 are provided so as to make the source voltage of the sense MOSFET 2 and the source voltage of the power MOSFET 1 equal to each other and to detect the current $I_{PW}$ of the power MOSFET 1 with high accuracy.

Namely, the gate voltage of the transistor TR1 is adjusted by the operational amplifier AMP1 so that the potential of the node N1 and the potential of the node N2 are made equal, and accordingly, a resistance value (resistance value between the source and the drain) of the transistor TR1 is controlled. In other words, it is possible to control the resistance value of the transistor TR1 by adjusting the gate voltage of the transistor TR1, and further, it is possible to control the potential of the source terminal ST2 by adjusting the resistance value of the transistor TR1. Thus, it becomes possible to control the potential of the source terminal ST2 by the gate voltage of the transistor TR1. Further, the operational amplifier AMP1 controls the gate voltage to be supplied to the gate of the transistor TR1 so that the potential of the node N1 and the potential of the node N2 are equal, and thus the potential of the Kelvin terminal KT connected to the node N1 and the potential of the source terminal ST2 connected to the node N2 are equal. Accordingly, since the potential of the Kelvin terminal KT and the potential of the source terminal ST2 become equal and operating points of the power MOSFET 1 and the sense MOSFET 2 become equal, it is possible to accurately copy the current $I_{PW}$ flowing to the power MOSFET 1 (thus, load current flowing to the load LOD) to the current $I_{SE}$ flowing to the sense MOSFET 2 with the predetermined ratio (herein, 1/20000).

The current $I_{SE}$ flowing to the sense MOSFET 2 flows to the resistor RST via the transistor TR1, and the current-voltage conversion is performed by the resistor RST. Namely, by connecting the resistor RST to the drain of the transistor TR1, the current value ($I_{SE}$) flowing in the sense MOSFET 2 can be converted into a voltage value of a terminal (sense terminal) TE1 between the drain of the transistor TR1 and the resistor RST. Thus, the current value ($I_{SE}$) flowing in the sense MOSFET 2 is output as a voltage (sense voltage) from the terminal TE1. Note that the terminal TE1 is interposed between the drain of the transistor TR1 and the resistor RST, and the drain of the transistor TR1 is connected to one end of the resistor RST via the terminal TE1.

The voltage value of the terminal TE1 increases as the current $I_{SE}$ flowing in the sense MOSFET 2 increases. To be specific, the voltage value of the terminal TE1 substantially proportional to a value of the current $I_{SE}$ flowing in the sense MOSFET 2. For example, the voltage value of the terminal TE1 becomes a value which is substantially corresponds to a product of the resistance value of the resistor RST and the current value of the current $I_{SE}$. Thus, it is possible to detect or monitor the current value ($I_{SE}$) flowing in the sense MOSFET 2 by detecting or monitoring the voltage value of the terminal TE1. Note that, since the current $I_{SE}$ flowing to the sense MOSFET 2 flows to the resistor RST via the source terminal ST2 and the transistor TR1, the current flowing to the resistor RST is substantially the same as the current $I_{SE}$ flowing to the sense MOSFET 2.

If the size ratio (herein, 1/20000) between the power MOSFET 1 and the sense MOSFET 2 is given in advance, it is possible to calculate (inverse operation) the current $I_{PW}$ flowing to the power MOSFET 1 by detecting or monitoring the voltage value of the terminal TE1, and accordingly, it is possible to calculate (inverse operation) the current flowing to the load LOD. Namely, when the voltage value of the terminal TE1 is detected and the current value ($I_{SE}$) flowing in the sense MOSFET 2 is calculated from the voltage value, this means that the current (In) which is 20000 times the current value ($I_{SE}$) flows to the power MOSFET 1, and thus flows to the load LOD. Note that, since the current $I_{PW}$ flowing to the power MOSFET 1 flows to the load LOD via the source terminal ST1, the current flowing to the load LOD is substantially the same as the current $I_{PW}$ flowing to the power MOSFET 1.

The current detection circuit unit DKC is configured of the operational amplifier AMP1, the transistor TR1 and the resistor RST, and the current $I_{SE}$ flowing in the sense MOSFET 2 can be detected by the current detection circuit unit DKC. Since it is possible to indirectly detect the current $I_{PW}$ flowing to the power MOSFET 1 by the sense MOSFET 2 which is provided in the semiconductor chip CP1 together with the power MOSFET 1 and the current detection circuit unit DKC, the current flowing to the load LOD can be indirectly detected.

The terminal TE1 is connected to, for example, the control circuit unit CLC, and the voltage value of the terminal TE1 is detected or monitored by the control circuit unit CLC. The control circuit unit CLC can detect or monitor the current $I_{SE}$ flowing to the sense MOSFET 2 by detecting or monitoring the voltage value of the terminal TE1, and accordingly can indirectly detect or monitor the current $I_{PW}$ (thus, the current flowing to the load LOD) flowing to the power MOSFET 1.

When the load LOD is a lamp, for example, it is possible to promptly detect the occurrence of disconnection or the like in the lamp by indirectly monitoring the current value flowing to the power MOSFET 1 (thus, the current value flowing to the load LOD) by monitoring the voltage value of the terminal TE1. In addition, when the load LOD is a motor (coil for motor), it is possible to detect the rotation speed of the motor or the like by indirectly monitoring the current value flowing to the power MOSFET 1 (thus, the current value flowing to the load LOD) by monitoring the voltage value of the terminal TE1.

The control circuit unit CLC includes a control circuit that controls the driver circuit DR and a control circuit that detects or monitors the voltage value of the terminal TE1. In addition, the control circuit unit CLC can further include a voltage generation circuit (regulator) that converts the power-supply potential VIN supplied from the power supply BAT into a predetermined operating voltage (power-supply voltage for operation). The control circuit unit CLC can be formed of one or a plurality of electronic components. In addition, the current detection circuit unit DKC can be formed of one or a plurality of electronic components. It is also possible to form a part or a whole of the control circuit unit CLC and a part or a whole of the current detection circuit unit DKC in a common electronic component (semiconductor chip).

In this manner, it is possible to indirectly detect the current $I_{PW}$ flowing to the power MOSFET 1 from the current $I_{SE}$ flowing in the sense MOSFET 2. Thus, it is possible to achieve the highly accurate current detection with respect to the power MOSFET 1 if various variation factors caused in a ratio (sense ratio) between the current $I_{SE}$ flowing in the sense MOSFET 2 and the current $I_{PW}$ flowing to the power MOSFET 1 can be removed.

<Configuration of Semiconductor Chip>

Next, a configuration of the semiconductor chip CP1 in which the power MOSFET 1 and the sense MOSFET 2 described above are formed will be described. Note that the semiconductor chip CP1 can be regarded as a semiconductor device.

Figure 2:
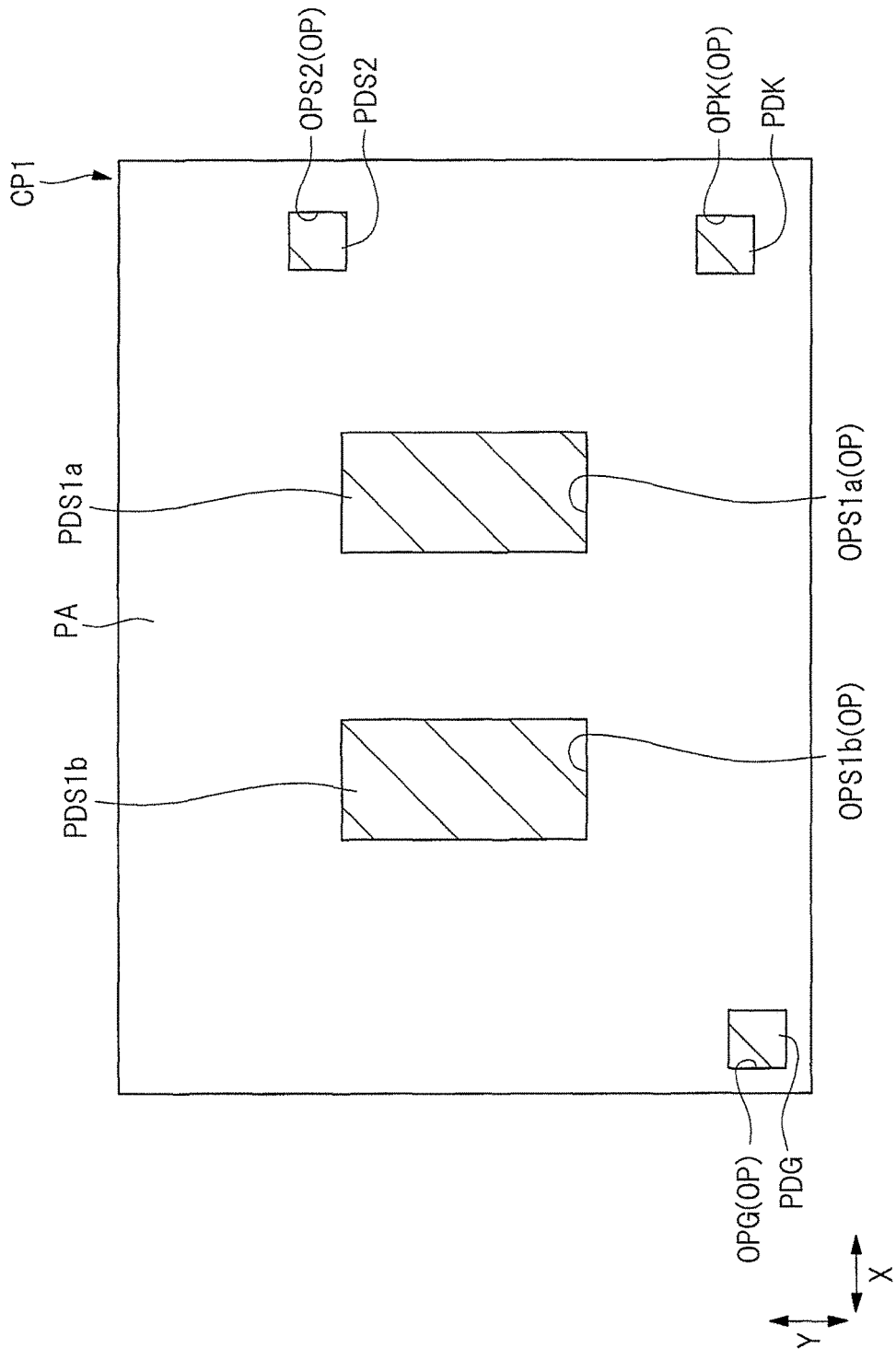
FIG. 2 is a plan view showing a chip layout of the semiconductor chip according to the embodiment.
Figure 3:
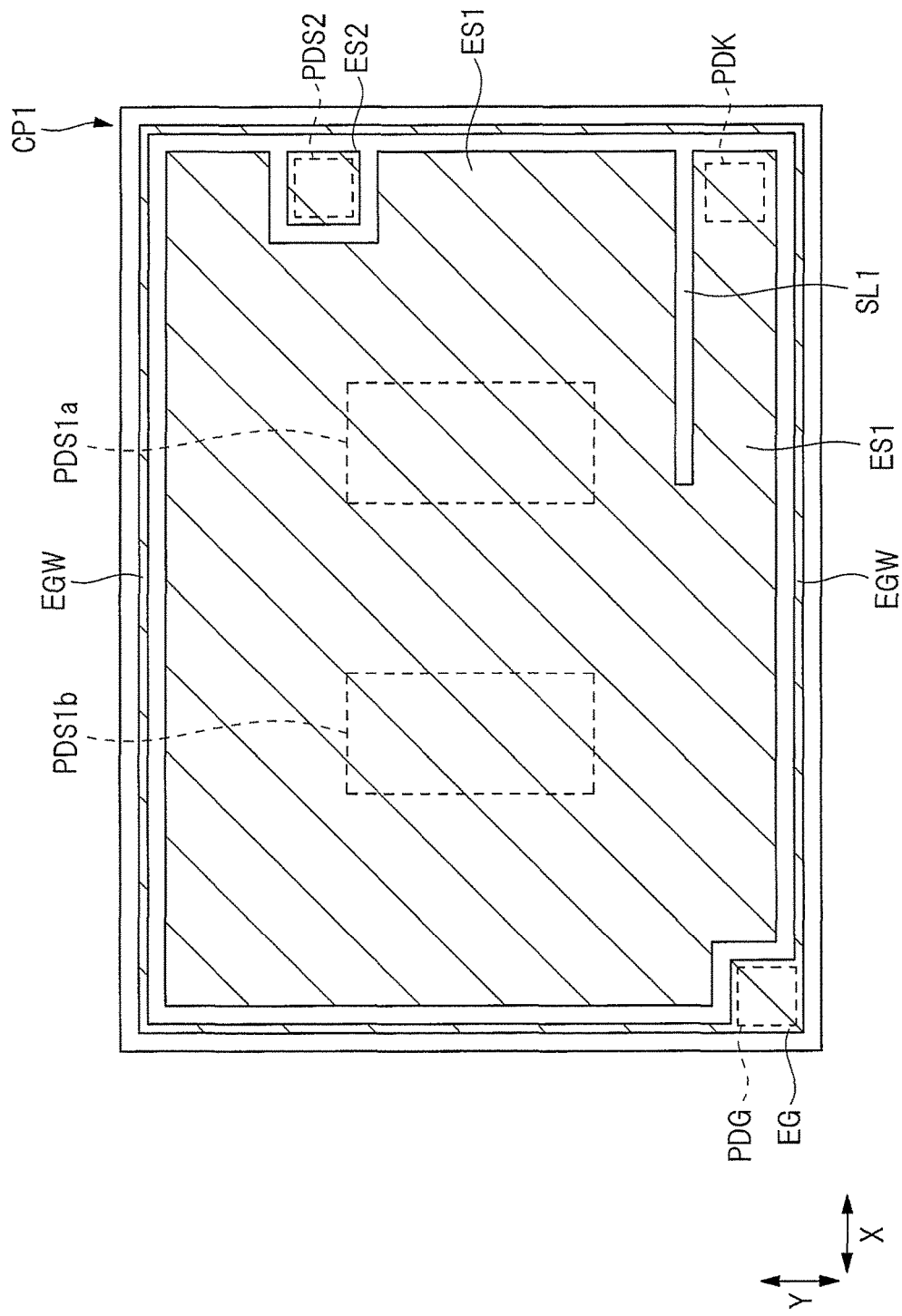
FIG. 3 is a plan view showing a chip layout of the semiconductor chip according to the embodiment.
Figure 4:
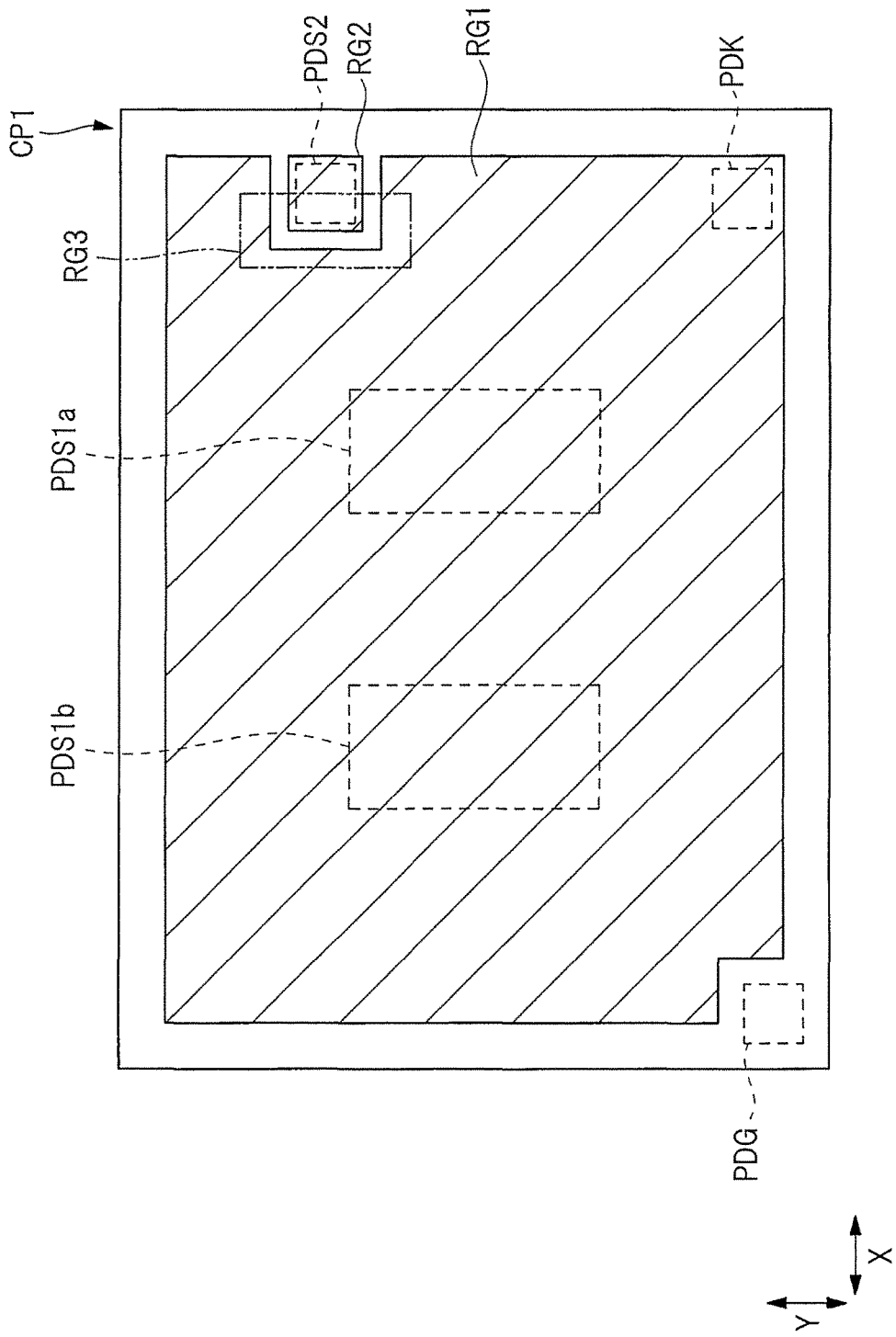
FIG. 4 is a plan view showing a chip layout of the semiconductor chip according to the embodiment.
Figure 5:
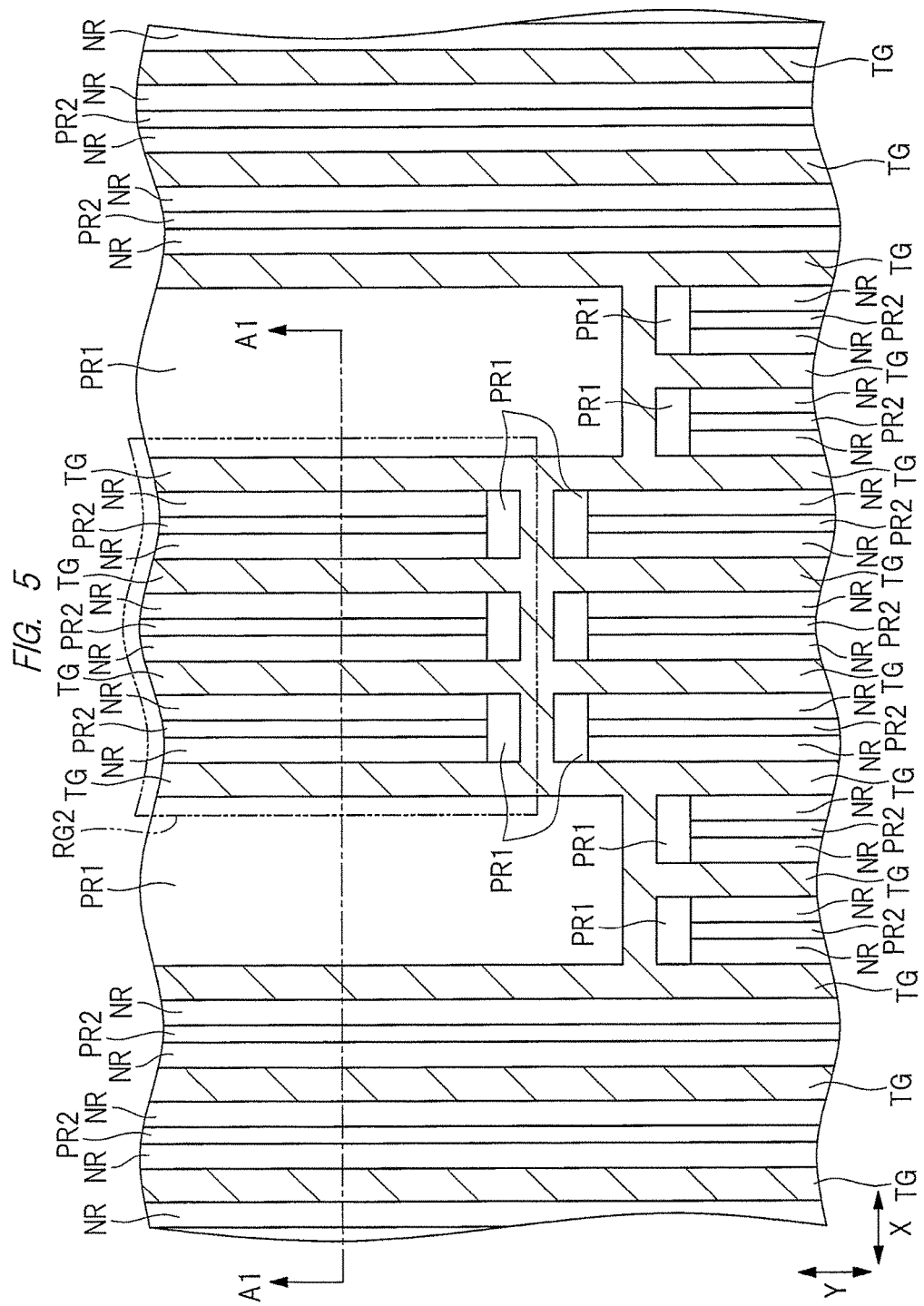
FIG. 5 is a partially enlarged plan view of the semiconductor chip according to the embodiment.
Figure 6:
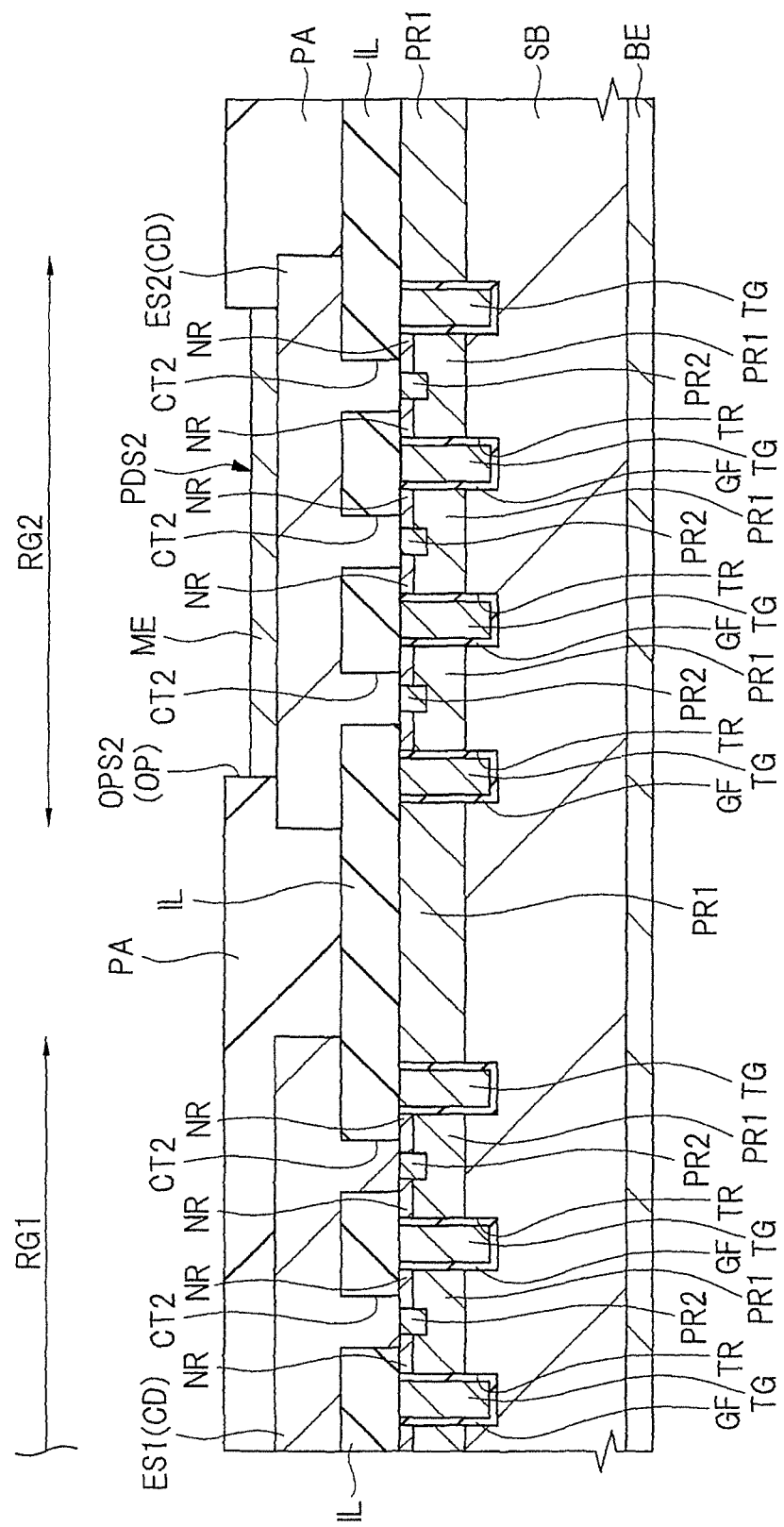
FIG. 6 is a cross-sectional view showing a principal part of the semiconductor chip according to the embodiment.
Figure 7:
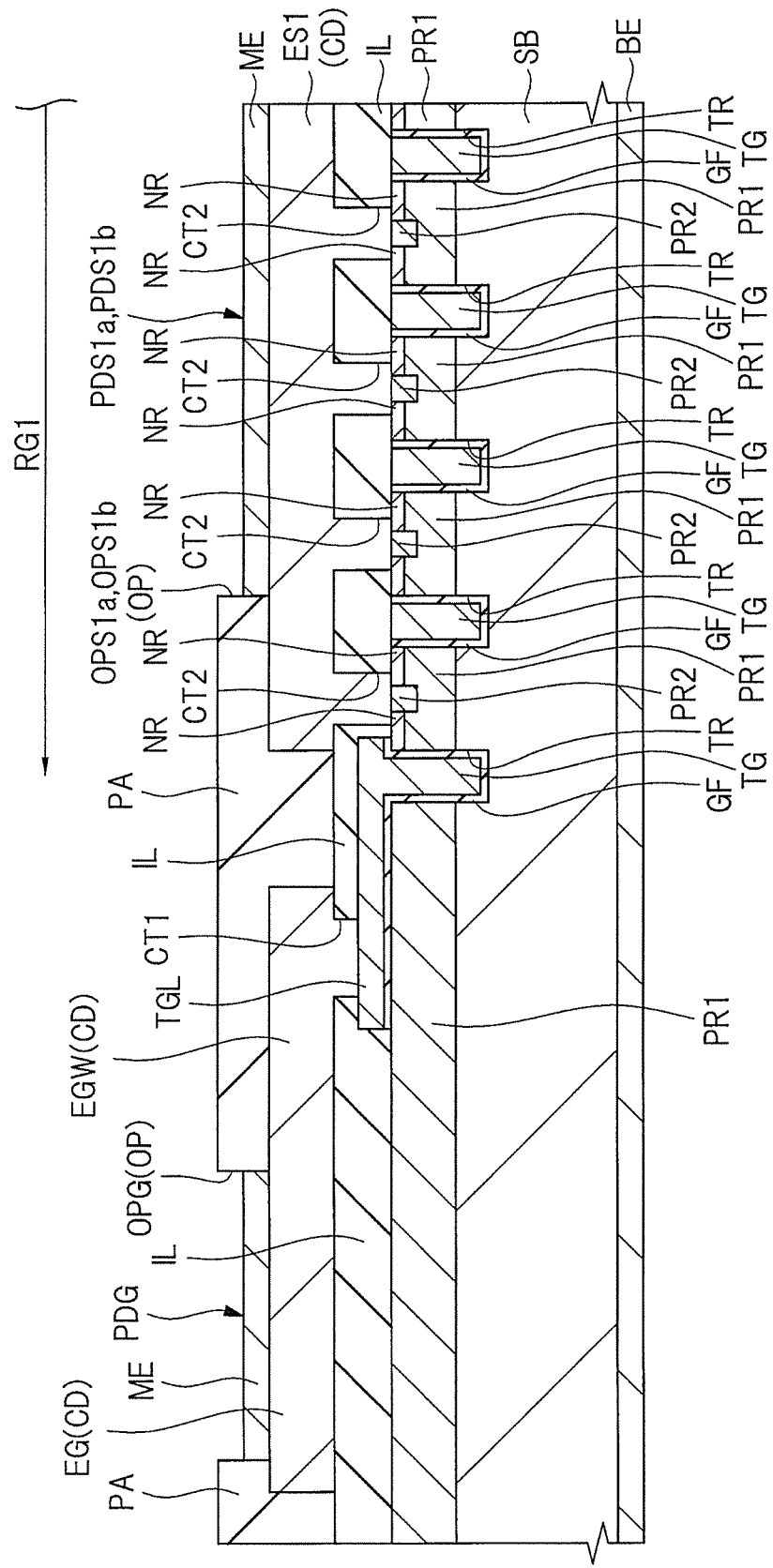
FIG. 7 is a cross-sectional view showing a principal part of the semiconductor chip according to the embodiment.

FIGS. 2 to 4 are plan views showing a chip layout of the semiconductor chip CP1, FIG. 5 is a partially enlarged plan view (plan view showing a principal part) of the semiconductor chip CP1, and FIGS. 6 and 7 are cross-sectional views showing a principal part of the semiconductor chip CP1. Among the drawings, FIG. 2 corresponds to a top view of the semiconductor chip CP1 and shows a front surface side (that is, a main surface of a side on which a bonding pad is formed) of the semiconductor chip CP1. Although FIG. 2 is a plan view, bonding pads (a gate pad PDG, source pads PDS1*a* and PDS1*b*, a source pad PDS2 and a Kelvin pad PDK) are shown with hatching in order to make the drawing easy to see. Also, FIG. 3 shows metal layers (a gate electrode EG, a gate wiring EGW and source electrodes ES1 and ES2) in the semiconductor chip CP1 with hatching, and further shows each position of the bonding pads (the gate pad PDG, the source pads PDS1*a* and PDS1*b*, the source pad PDS2 and the Kelvin pad PDK) with the dotted line. Also, FIG. 4 shows a main MOS region RG1 and a sense MOS region RG2 in the semiconductor chip CP1 with hatching, and further shows each position of the bonding pads (the gate pad PDG, the source pads PDS1*a* and PDS1*b*, the source pad PDS2 and the Kelvin pad PDK) with the dotted line. Note that each position of the bonding pads (the gate pad PDG, the source pads PDS1*a* and PDS1*b*, the source pad PDS2 and the Kelvin pad PDK) shown with the dotted line in FIGS. 3 and 4 corresponds to each region shown with hatching in FIG. 2. FIG. 5 is a partially enlarged plan view in which a region RG3 surrounded by the two-dot chain line in FIG. 4 is enlarged, and shows a layout of a trench gate electrode TG, an $n^+$ semiconductor region NR and a $p^+$ semiconductor region PR2 in the main MOS region RG1 and the sense MOS region RG2. Note that FIG. 5 shows the trench gate electrode TG with hatching in order to make the drawing easy to see. In addition, FIG. 6 substantially corresponds to a cross-sectional view taken along a line A1-A1 of FIG. 5, the part (range) denoted by reference character RG1 in FIG. 6 corresponds to a cross-sectional view showing a principal part of the main MOS region RG1, and the part (range) denoted by reference character RG2 in FIG. 6 corresponds to a cross-sectional view showing a principal part of the sense MOS region RG2. In addition, FIG. 7 shows the cross-sectional view showing a principal part of the main MOS region RG1 and a cross-sectional view showing a principal part of a region in which the gate wiring EGW and the gate electrode EG are formed. Note that an X-direction and a Y-direction shown in each plan view are directions that intersect each other, and are preferably directions that are orthogonal to each other. In addition, the X-direction and the Y-direction are common in each plan view. The semiconductor chip CP1 has a quadrangular planar shape formed to have two sides that are parallel in the X-direction and two sides that are parallel in the Y-direction.

The power MOSFET 1 and the sense MOSFET 2 described above are formed on a main surface of a semiconductor substrate SB constituting the semiconductor chip CP1. As shown in FIGS. 6 and 7, the semiconductor substrate SB is made of an n-type monocrystalline silicon or the like into which an n-type impurity such as arsenic (As) is introduced.

It is also possible to use a so-called epitaxial wafer as the semiconductor substrate SB. When the epitaxial wafer is used as the semiconductor substrate SB, the epitaxial wafer is configured of a substrate body (semiconductor substrate) made of an $n^+$ monocrystalline silicon into which an n-type impurity such as arsenic (As) is introduced and an epitaxial semiconductor layer which is formed on a main surface of the substrate body and is made of, for example, an $n^-$ monocrystalline silicon.

A field insulating film (not shown here) made of, for example, a silicon oxide film is formed on the main surface of the semiconductor substrate SB if necessary. This field insulating film can function as an element isolation region that defines (demarcates) an active region.

A plurality of unit transistor cells constituting the power MOSFET 1 are formed on the semiconductor substrate SB in the main MOS region RG1, and the power MOSFET 1 is formed by connecting the plurality of unit transistor cells in the main MOS region RG1 in parallel. In addition, a plurality of unit transistor cells constituting the sense MOSFET 2 are formed on the semiconductor substrate SB in the sense MOS region RG2, and the sense MOSFET 2 is formed by connecting the plurality of unit transistor cells in the sense MOS region RG2 in parallel.

Each of the unit transistor cells formed in the main MOS region RG1 and each of the unit transistor cells formed in the sense MOS region RG2 basically have the same structure (configuration), but the area of the main MOS region RG1 and the area of the sense MOS region RG2 are different from each other, and the main MOS region RG1 is an area which is larger than the sense MOS region RG2. In other words, the sense MOS region RG2 is an area which is smaller than the main MOS region RG1. Thus, the number of the connected unit transistor cells is different between the power MOSFET 1 and the sense MOSFET 2, and the number of the unit transistor cells connected in parallel to constitute the sense MOSFET 2 is smaller than the number of the unit transistor cells connected in parallel to constitute the power MOSFET 1. Thus, a current which is lower than a current flowing to the power MOSFET 1 flows to the sense MOSFET 2 if the sense MOSFET 2 and the power MOSFET 1 have the same source potential. Each of the unit transistor cells of the main MOS region RG1 and the sense MOS region RG2 is formed of, for example, an n-channel MOSFET having a trench gate structure.

The semiconductor substrate SB has a function as a drain region of the above-described unit transistor cell. The back electrode BE for drain (a back drain electrode or a drain electrode) is formed on a back surface of the semiconductor substrate SB (that is, a back surface of the semiconductor chip CP1). The back electrode BE is formed on the entire back surface of the semiconductor substrate SB, that is, on the entire back surface of the semiconductor chip CP1. The back electrode BE is formed by, for example, stacking a titanium (Ti) layer, a nickel (Ni) layer and a gold (Au) layer sequentially from the back surface of the semiconductor substrate SB. The back electrode BE corresponds to the drain terminal DT of FIG. 1 described above.

In addition, a p-type semiconductor region (p-type body region) PR1 which is formed in the semiconductor substrate SB in the main MOS region RG1 and the sense MOS region RG2 has a function as a channel formation region of the above-described unit transistor cell. Further, the $n^+$ semiconductor region NR formed in an upper part of the p-type semiconductor region PR1 has a function as a source region of the above-described unit transistor cell. Accordingly, the $n^+$ semiconductor region NR is a semiconductor region for source. Namely, the $n^+$ semiconductor region NR formed in the main MOS region RG1 is a semiconductor region for the source of the power MOSFET 1 described above, and the $n^+$ semiconductor region NR formed in the sense MOS region RG2 is a semiconductor region for the source of the sense MOSFET 2 described above.

In addition, trenches TR which extend from the main surface of the semiconductor substrate SB in the thickness direction thereof are formed in the semiconductor substrate SB in the main MOS region RG1 and the sense MOS region RG2. The trenches TR are formed to penetrate the $n^+$ semiconductor region NR and the p-type semiconductor region PR1 from an upper surface of the $n^+$ semiconductor region NR and terminate in the middle of the semiconductor substrate SB. From another viewpoint, the p-type semiconductor region PR1 is formed between the neighboring trenches TR, and the $n^+$ semiconductor region NR for source is formed at a position adjacent to the trench TR in an upper part of the p-type semiconductor region PR1.

A gate insulating film GF made of silicon oxide or the like is formed on a bottom surface and a side surface of the trench TR. In addition, the trench gate electrode TG is embedded in the trench TR with the above-described gate insulating film GF interposed therebetween. The trench gate electrode TG is made of, for example, a polycrystalline silicon film into which an n-type impurity (for example, phosphorus) is introduced. The trench gate electrode TG has a function as a gate (gate electrode) of the above-described unit transistor cell. Accordingly, the trench gate electrode TG formed in the main MOS region RG1 serves as the gate of the power MOSFET 1 described above, and the trench gate electrode TG formed in the sense MOS region RG2 serves as the gate of the sense MOSFET 2 described above.

In addition, a gate lead-out wiring portion TGL which is made of a conductive film in the same layer as the trench gate electrode TG is formed on the semiconductor substrate SB in a peripheral portion of the main MOS region RG1 and a peripheral portion of the sense MOS region RG2, and the trench gate electrode TG and the gate lead-out wiring portion TGL are integrally formed and electrically connected to each other. Note that the trench gate electrode TG is embedded in the trench TR, and the gate lead-out wiring portion TGL is arranged to extend on the semiconductor substrate SB instead of in the trench TR. The gate lead-out wiring portion TGL is electrically connected to the gate wiring EGW through a contact hole (an opening portion or a through-hole) CT1 formed in an insulating film IL which covers the gate lead-out wiring portion TGL.

The gate wiring EGW is electrically connected to the plurality of trench gate electrodes TG formed in the main MOS region RG1 through the gate lead-out wiring portion TGL, and electrically connected to the plurality of trench gate electrodes TG formed in the sense MOS region RG2 through the gate lead-out wiring portion TGL. Thus, the gate wiring EGW is electrically connected to the trench gate electrode TG in the main MOS region RG1 and the trench gate electrode TG in the sense MOS region RG2. The gate wiring EGW extends along an outer circumference of the semiconductor chip CP1 on the main surface thereof. The gate electrode EG is an electrode portion (conductor portion) to form the gate pad PDG, and a width of the gate electrode EG is larger than a width of the gate wiring EGW. The gate electrode EG and the gate wiring EGW are integrally formed, and accordingly, the gate electrode EG and the gate wiring EGW are electrically connected to each other. Thus, the gate electrode EG is electrically connected to the plurality of trench gate electrodes TG formed in the main MOS region RG1 and the plurality of trench gate electrodes TG formed in the sense MOS region RG2 through the gate wiring EGW and the gate lead-out wiring portion TGL.

On the other hand, the source electrode ES1 is electrically connected to the $n^+$ semiconductor region NR for source formed in the main MOS region RG1 through a contact hole (an opening portion or a through-hole) CT2 formed in the insulating film IL of the main MOS region RG1. In addition, this source electrode ES1 is electrically connected to the $p^+$ semiconductor region PR2, which is formed between the neighboring $n^+$ semiconductor regions NR in an upper part of the p-type semiconductor region PR1 in the main MOS region RG1, and is electrically connected to the p-type semiconductor region PR1 for channel formation in the main MOS region RG1 through the $p^+$ semiconductor region PR2. The $p^+$ semiconductor region PR2 has a higher impurity concentration (p-type impurity concentration) than the p-type semiconductor region PR1, and it is possible to reduce the contact resistance of the source electrode ES1 by providing the $p^+$ semiconductor region PR2. The source electrode ES1 is formed over substantially the entire main MOS region RG1 when seen in a plan view. Namely, the source electrode ES1 is formed to cover substantially the entire main MOS region RG1 when seen in a plan view.

In addition, the source electrode ES2 is electrically connected to the $n^+$ semiconductor region NR for source formed in the sense MOS region RG2 through the contact hole CT2 formed in the insulating film IL of the sense MOS region RG2. In addition, this source electrode ES2 is electrically connected to the $p^+$ semiconductor region PR2, which is formed between the neighboring $n^+$ semiconductor regions NR in an upper part of the p-type semiconductor region PR1 in the sense MOS region RG2, and is electrically connected to the p-type semiconductor region PR1 for channel formation in the sense MOS region RG2 through the $p^+$ semiconductor region PR2. The source electrode ES2 is formed over substantially the entire sense MOS region RG2 when seen in a plan view. Namely, the source electrode ES2 is formed to cover substantially the entire sense MOS region RG2 when seen in a plan view.

The gate electrode EG, the gate wiring EGW and the source electrodes ES1 and ES2 are formed by forming a conductor film CD on the insulating film IL in which the contact holes CT1 and CT2 are formed so as to fill the contact holes CT1 and CT2 and then patterning this conductor film CD. Namely, the gate electrode EG, the gate wiring EGW and the source electrodes ES1 and ES2 are formed of the patterned conductor film CD. The conductor film CD is made of a metal film, and preferably an aluminum film or an aluminum alloy film. Thus, the gate electrode EG, the gate wiring EGW, the source electrode ES1 and the source electrode ES2 are formed of the conductor film CD in the same layer, but are isolated from each other except that the gate electrode EG and the gate wiring EGW are integrally formed.

Note that the portion (plug portion) of the gate wiring EGW embedded in the contact hole CT1 is integrally formed with the gate wiring EGW outside the contact hole CT1 in FIG. 6, but these may be separately formed. Similarly, the portion (plug portion) of the source electrode ES1 embedded in the contact hole CT2 is integrally formed with the source electrode ES1 outside the contact hole CT2 in FIGS. 6 and 7, but these may be separately formed. Similarly, the portion (plug portion) of the source electrode ES2 embedded in the contact hole CT2 is integrally formed with the source electrode ES2 outside the contact hole CT2 in FIG. 7, but these may be separately formed. Specifically, it is also possible to form the gate electrode EG, the gate wiring EGW and the source electrodes ES1 and ES2 by forming conductive plugs in the contact holes CT1 and CT2, then forming the conductor film CD on the insulating film IL in which the plugs have been embedded, and patterning the conductor film CD.

The conductor film CD (the gate electrode EG, the gate wiring EGW and the source electrodes ES1 and ES2) is covered with an insulating protection film (an insulating film or a passivation film) PA which is made of polyimide resin or the like. Namely, the protection film PA is formed on the insulating film IL so as to cover the conductor film CD (the gate electrode EG, the gate wiring EGW and the source electrodes ES1 and ES2). This protection film PA is a film (insulating film) of the uppermost layer of the semiconductor chip CP1. The protection film PA is made of an insulating film, and thus can be regarded as the insulating film. A plurality of opening portions OP are formed in the protection film PA, and a part of the conductor film CD is exposed from each of the opening portions OP. The conductor film CD exposed from the opening portion OP serves as a pad electrode (bonding pad), and each of the gate pad PDG, the source pads PDS1$a$ and PDS1$b$, the source pad PDS2 and the Kelvin pad PDK is formed of the conductor film CD exposed from the opening portion OP.

Namely, the gate pad (pad electrode) PDG for the power MOSFET 1 and the sense MOSFET 2 described above is formed of the gate electrode EG which is exposed from a gate opening portion OPG among the opening portions OP. Also, the source pads (pad electrodes) PDS1$a$ and PDS1$b$ for the power MOSFET 1 described above are formed of the source electrodes ES1 which are exposed from source opening portions OPS1$a$ and OPS1$b$ among the opening portions OP. Further, the Kelvin pad (pad electrode) PDK for the power MOSFET 1 described above is formed of the source electrode ES1 which is exposed from a Kelvin opening portion OPK among the opening portions OP. In addition, the source pad (pad electrode) PDS2 for the sense MOSFET 2 described above is formed of the source electrode ES2 which is exposed from a source opening portion OPS2 among the opening portions OP. The gate pad PDG corresponds to the gate terminal GT of FIG. 1 described above, the source pads PDS1a and PDS1b correspond to the source terminal ST1 of FIG. 1 described above, the Kelvin pad PDK corresponds to the Kelvin terminal KT of FIG. 1 described above, and the source pad PDS2 corresponds to the source terminal ST2 of FIG. 1 described above.

The source pad PDS1a, the source pad PDS1b and the Kelvin pad PDK are separated from each other by the protection film PA of the uppermost layer, but are electrically connected to each other through the source electrode ES1. Thus, the source pad PDS1a, the source pad PDS1b and the Kelvin pad PDK are electrically connected to the source regions ($n^+$ semiconductor regions NR) of the plurality of unit transistor cells formed in the main MOS region RG1 through the source electrode ES1. Since the Kelvin pad PDK is also formed of the source electrode ES1 exposed from the opening portion OP of the protection film PA like the source pads PDS1a and PDS1b, the Kelvin pad can be regarded as the source pad. However, the source pads PDS1a and PDS1b and the Kelvin pad PDK are provided for different purposes, the source pads PDS1a and PDS1b are the pads for outputting the current flowing in the power MOSFET 1, and the Kelvin pad PDK is the pad for detecting the source potential of the power MOSFET. In the case of FIGS. 2 to 4, the Kelvin pad PDK is arranged near a corner of the main surface of the semiconductor chip CP1.

Meanwhile, since the source electrode ES2 is isolated from the source electrode ES1, the source pad PDS2 is not short-circuited with and is electrically isolated from the source pad PDS1a, the source pad PDS1b and the Kelvin pad PDK. The source pad PDS2 is electrically connected to the source regions ($n^+$ semiconductor regions NR) of the plurality of unit transistor cells formed in the sense MOS region RG2 through the source electrode ES2.

A plating layer ME is formed on each surface of the pads (PDG, PDK, PDS1a, PDS1b and PDS2), that is, on the part of the conductor film CD exposed at a bottom portion of the opening portion OP in some cases. This plating layer ME is made of, for example, a stacked film including a copper (Cu) film, a nickel (Ni) film and a gold (Au) film formed in this order from the bottom or a stacked film including a titanium (Ti) film, a nickel (Ni) film and a gold (Au) film formed in this order from the bottom. It is possible to suppress or prevent the oxidation of a surface of aluminum of the conductor film CD by forming the plating layer ME.

The trench gate electrodes TG of the plurality of unit transistor cells formed in the main MOS region RG1 and the trench gate electrodes TG of the plurality of unit transistor cells formed in the sense MOS region RG2 are electrically connected to each other through the gate lead-out wiring portion TGL, the gate wiring EGW and the gate electrode EG. Thus, the common gate voltage is supplied from the gate pad PDG to the gate of the power MOSFET 1 (the trench gate electrodes TG of the plurality of unit transistor cells formed in the main MOS region RG1) and the gate of the sense MOSFET 2 (the trench gate electrodes TG of the plurality of unit transistor cells formed in the sense MOS region RG2) through the gate wiring EGW and the wiring portion TGL.

In addition, the drain regions of the plurality of unit transistor cells formed in the main MOS region RG1 and the drain regions of the plurality of unit transistor cells formed in the sense MOS region RG2 are electrically connected to each other through the semiconductor substrate SB and the back electrode BE. Note that the drain regions of the plurality of unit transistor cells formed in the main MOS region RG1 and the drain regions of the plurality of unit transistor cells formed in the sense MOS region RG2 are configured of a part of the semiconductor substrate SB which maintains the n-type under the p-type semiconductor region PR1. Thus, the common drain voltage (power-supply potential VIN described above) is supplied from the back electrode BE to the drain region of the power MOSFET 1 (the plurality of unit transistor cells formed in the main MOS region RG1) and the drain region of the sense MOSFET 2 (the plurality of unit transistor cells formed in the sense MOS region RG2).

In addition, the source regions ($n^+$ semiconductor regions NR) of the plurality of unit transistor cells formed in the main MOS region RG1 are electrically connected to the source electrode ES1, and are electrically connected to each other through the source electrode ES1. In addition, the source regions ($n^+$ semiconductor regions NR) of the plurality of unit transistor cells formed in the sense MOS region RG2 are electrically connected to the source electrode ES2, and are electrically connected to each other through the source electrode ES2. The source pads PDS1a and PDS1b are connected to the above-described load LOD, and the Kelvin pad PDK and the source pad PDS2 are connected to the above-described current detection circuit unit DKC.

In addition, each of the main MOS region RG1 and the sense MOS region RG2 serves as the active region, and an outer circumferential region of the main MOS region RG1 and an outer circumferential region of the sense MOS region RG2 serve as non-active regions. Herein, the active region corresponds to a region that can function as a current path, and the non-active region corresponds to a region that does not function as a current path. Each of the main MOS region RG1 and the sense MOS region RG2 is surrounded by the non-active region when seen in a plan view. Thus, the non-active region is interposed between the main MOS region RG1 and the sense MOS region RG2 when seen in a plan view.

As shown in FIG. 5, the trench TR (trench gate electrode TG) of the main MOS region RG1 and the trench TR (trench gate electrode TG) of the sense MOS region RG2 are linked to each other. However, the source region ($n^+$ semiconductor region NR) of the main MOS region RG1 and the source region ($n^+$ semiconductor region NR) of the sense MOS region RG2 are not linked to each other, and are electrically isolated from each other by the trench TR and the p-type semiconductor region PR1 disposed therebetween.

In the semiconductor chip CP1 with the configuration described above, an operating current of the unit transistors of the power MOSFET 1 and the sense MOSFET 2 flows in the thickness direction of the semiconductor substrate SB along the side surface of the trench gate electrode TG (that is, the side surface of the trench TR) between the semiconductor substrate SB for the drain and the $n^+$ semiconductor region NR for the source. Namely, the channel is formed along the thickness direction of the semiconductor chip CP1.

In this manner, the semiconductor chip CP1 is the semiconductor chip in which a vertical MOSFET having the trench gate structure is formed, and each of the power MOSFET 1 and the sense MOSFET 2 described above is formed of a trench gate MOSFET. Herein, the vertical MOSFET corresponds to a MOSFET in which a current between a source and a drain flows in a thickness direction of a semiconductor substrate (SB) (direction approximately perpendicular to a main surface of the semiconductor substrate).

In addition, all the source pads PDS1a and PDS1b and the Kelvin pad PDK of the semiconductor chip CP1 are electrically connected to the source of the power MOSFET 1 (the plurality of unit transistor cells formed in the main MOS region RG1), but the purpose (function) as the pad electrode is different between the source pads PDS1a and PDS1b and the Kelvin pad PDK.

Namely, the source pads PDS1a and PDS1b of the semiconductor chip CP1 are the pad electrodes for outputting the current ($I_{PW}$) flowing to the power MOSFET 1. Thus, the source pads PDS1a and PDS1b of the semiconductor chip CP1 are electrically connected to the above-described load LOD, so that the current ($I_{PW}$) flowing to the power MOSFET 1 flows to the above-described load LOD via the source pads PDS1a and PDS1b.

On the other hand, the Kelvin pad PDK of the semiconductor chip CP1 is the pad electrode for measuring (detecting) the source potential (source voltage) of the power MOSFET 1. Thus, the Kelvin pad PDK of the semiconductor chip CP1 is electrically connected to the above-described current detection circuit unit DKC (specifically, the operational amplifier AMP1 of the current detection circuit unit DKC) instead of the above-described load LOD. The current ($I_{PW}$) flowing to the power MOSFET 1 is hardly output from the Kelvin pad PDK, and flows to the above-described load LOD via the source pads PDS1a and PDS1b.

Namely, the source pads PDS1a and PDS1b are the pad electrodes for current output in the semiconductor chip CP1, and the Kelvin pad PDK is the pad electrode for voltage measurement (voltage detection).

<Structure of Semiconductor Package>

Next, an example of a semiconductor device (semiconductor package) PKG using the above-described semiconductor chip CP1 will be described.

Figure 8:
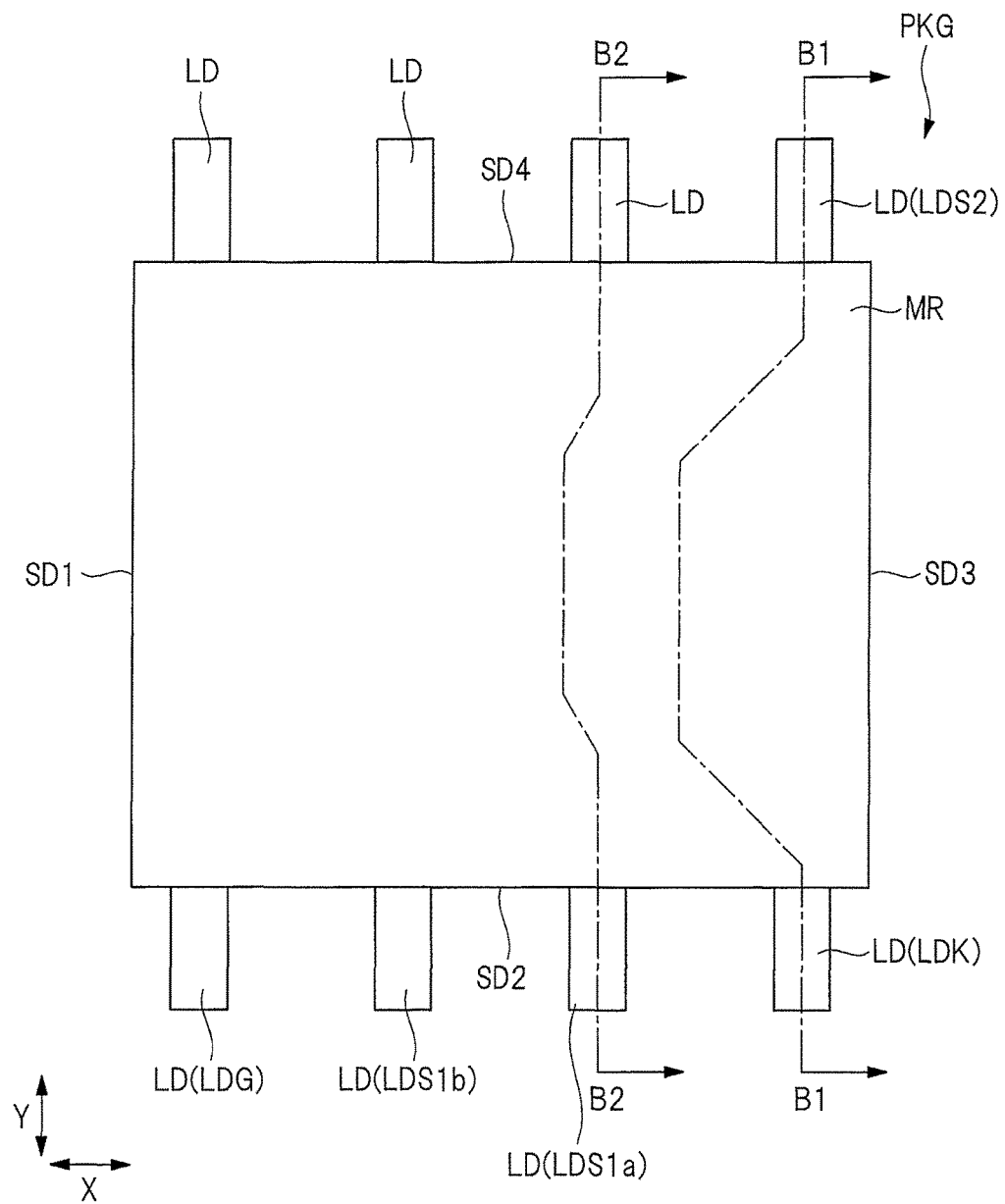
FIG. 8 is a top view of a semiconductor device according to an embodiment.
Figure 9:
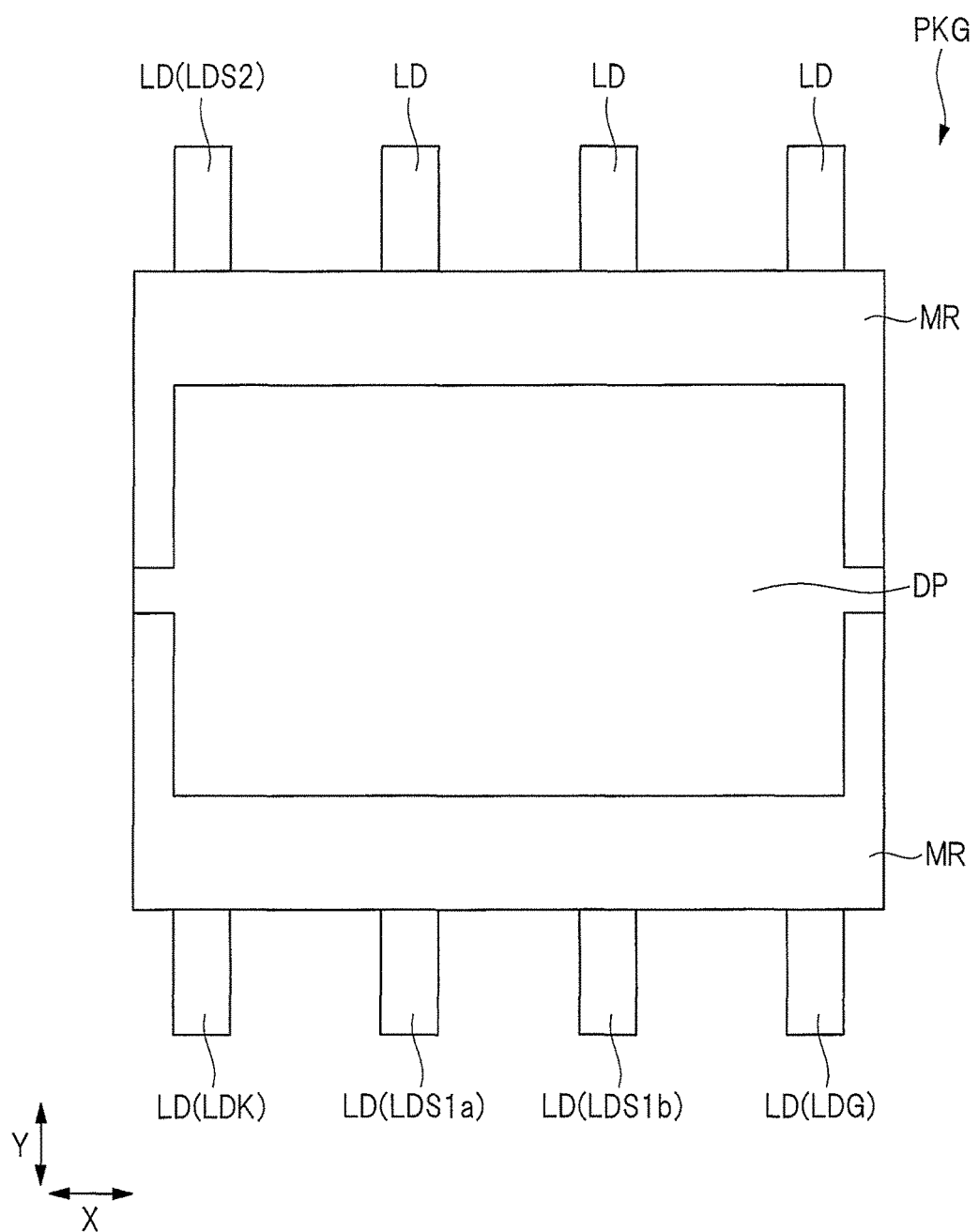
FIG. 9 is a bottom view of the semiconductor device according to the embodiment.
Figure 10:
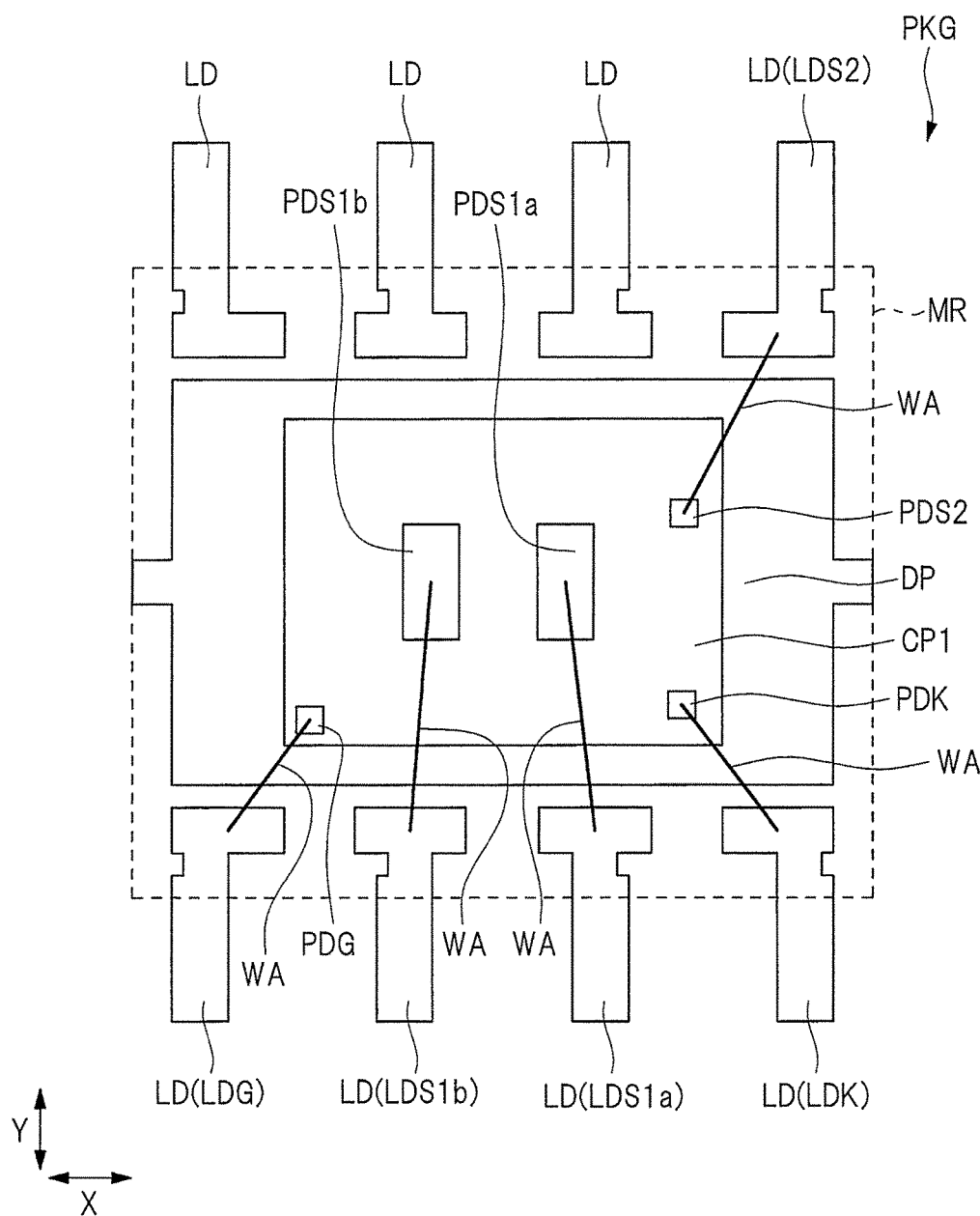
FIG. 10 is a perspective plan view of the semiconductor device according to the embodiment.
Figure 11:
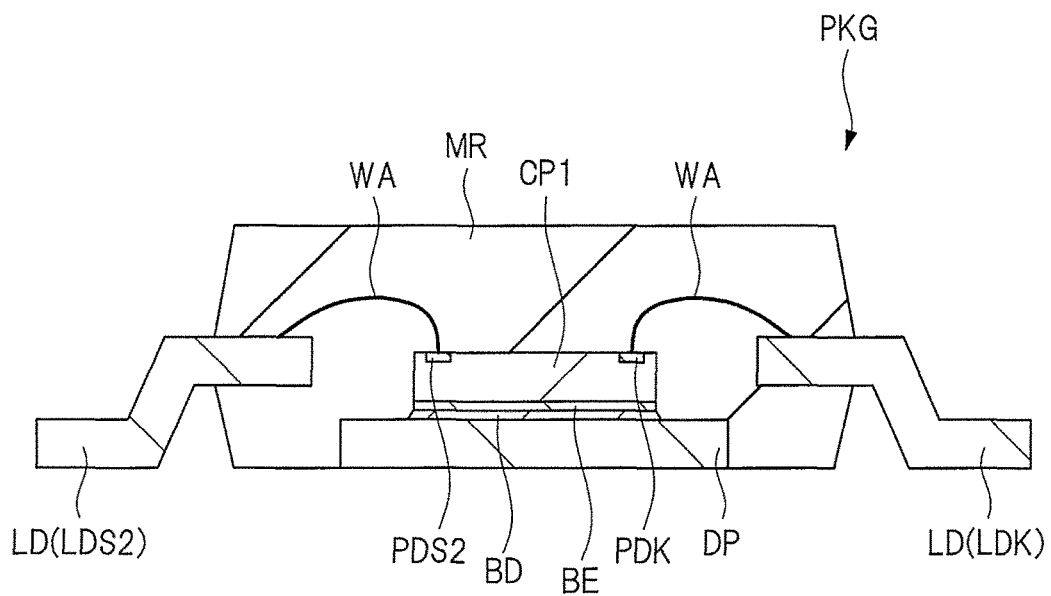
FIG. 11 is a cross-sectional view of the semiconductor device according to the embodiment.
Figure 12:
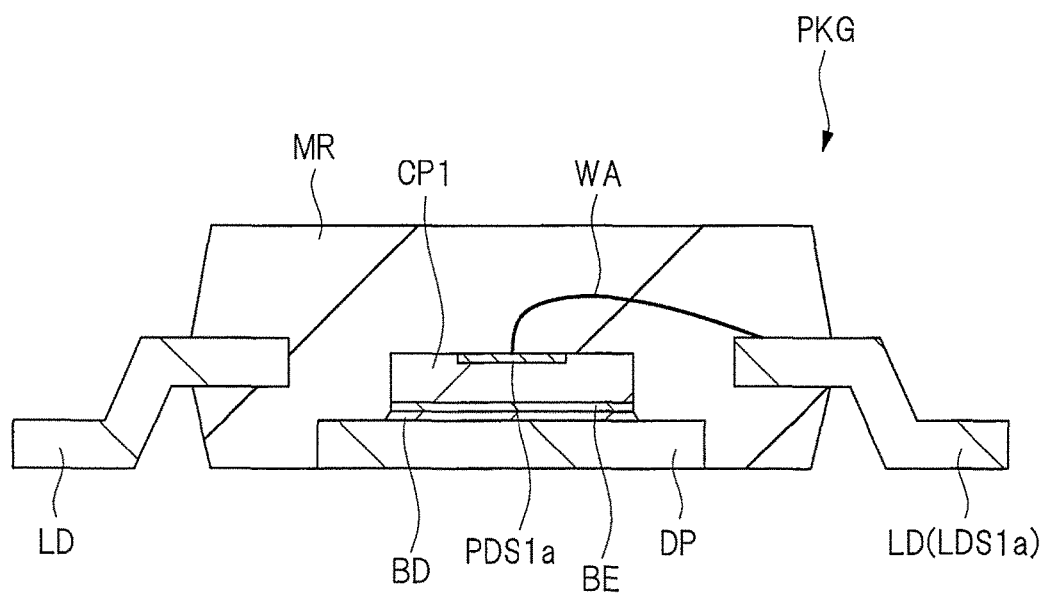
FIG. 12 is a cross-sectional view of the semiconductor device according to the embodiment.

FIG. 8 is a top view of the semiconductor device PKG and FIG. 9 is a bottom view of the semiconductor device PKG. FIG. 10 is a perspective plan view of the semiconductor device PKG, and shows a perspective plan view on an upper surface side of the semiconductor device PKG seen through a sealing portion MR. In FIG. 10, an outer circumferential position of the sealing portion MR is shown with the dotted line. FIGS. 11 and 12 are cross-sectional views (side cross-sectional views) of the semiconductor device PKG. A cross-sectional view taken along a line B1-B1 of FIG. 8 substantially corresponds to FIG. 11, and a cross-sectional view taken along a line B2-B2 of FIG. 8 substantially corresponds to FIG. 12.

The semiconductor device PKG shown in FIGS. 8 to 12 is a semiconductor package including the semiconductor chip CP1 in which the power MOSFET 1 for switching and the sense MOSFET 2 for current detection are incorporated.

The semiconductor device PKG includes a die pad (a tab or a chip mounting portion) DP, the semiconductor chip CP1 mounted on an upper surface (main surface) of the die pad DP, a plurality of leads LD, a plurality of bonding wires (hereinafter, simply referred to as wires) WA and the sealing portion (the sealing resin portion or the sealing body) MR that seals the above-described members.

The sealing portion MR is made of a resin material such as a thermosetting resin material or the like, and can contain filler or the like. For example, the sealing portion MR can be formed of epoxy resin containing filler or the like. Biphenyl-based thermosetting resin to which phenolic curing agent, silicone rubber, filler and the like are added may be used as a material of the sealing portion MR other than the epoxy-based resin for achievement of reduction in stress or the like.

Herein, a surface-mount semiconductor package is shown as an example of the semiconductor device PKG. To be specific, the semiconductor device PKG is a surface-mount semiconductor package of the HSON (Small Outline No Lead Package with Heat Sink) type. However, the configuration of the semiconductor device PKG is not limited thereto and various changes can be made therein, and another flat package configuration such as QFN (Quad Flat Non-leaded Package) configuration, QFP (Quad Flat Package) configuration or SOP (Small Out-line Package) configuration may be adopted.

As described above, the gate pad PDG, the source pads PDS1a and PDS1b, the Kelvin pad PDK and the source pad PDS2 are formed on the front surface side of the semiconductor chip CP1, and the back electrode BE is formed on the back surface side of the semiconductor chip CP1. The semiconductor chip CP1 is mounted and bonded onto the upper surface of the die pad DP via a conductive bonding material BD, with the front surface thereof being directed upward and the back electrode BE opposing the upper surface of the die pad DP. In other words, the back electrode BE of the semiconductor chip CP1 is bonded to the upper surface of the die pad DP via the conductive bonding material BD. Thus, the back electrode BE of the semiconductor chip CP1 is electrically connected to the die pad DP via the conductive bonding material BD.

The plurality of leads LD provided in the semiconductor device PKG include a gate lead LDG, source leads LDS1a, LDS1b and LDS2 and a Kelvin lead LDK.

The gate pad PDG of the semiconductor chip CP1 is electrically connected to the gate lead LDG via the wire WA. Namely, one end of the wire WA is connected to the gate pad PDG of the semiconductor chip CP1, and the other end of the wire WA is connected to the gate lead LDG. In addition, the source pad PDS1a of the semiconductor chip CP1 is electrically connected to the source lead LDS1a via the wire WA. Namely, one end of the wire WA is connected to the source pad PDS1a of the semiconductor chip CP1, and the other end of the wire WA is connected to the source lead LDS1a. In addition, the source pad PDS1b of the semiconductor chip CP1 is electrically connected to the source lead LDS1b via the wire WA. Namely, one end of the wire WA is connected to the source pad PDS1b of the semiconductor chip CP1, and the other end of the wire WA is connected to the source lead LDS1b. In addition, the Kelvin pad PDK of the semiconductor chip CP1 is electrically connected to the Kelvin lead LDK via the wire WA. Namely, one end of the wire WA is connected to the Kelvin pad PDK of the semiconductor chip CP1, and the other end of the wire WA is connected to the Kelvin lead LDK. In addition, the source pad PDS2 of the semiconductor chip CP1 is electrically connected to the source lead LDS2 via the wire WA. Namely, one end of the wire WA is connected to the source pad PDS2 of the semiconductor chip CP1, and the other end of the wire WA is connected to the source lead LDS2.

Thus, the gate pad PDG can be regarded as the gate terminal in the semiconductor chip CP1, the gate lead LDG can be regarded as the gate terminal in the semiconductor device PKG, and both the gate pad PDG and the gate lead LDG are electrically connected to the gate of the power MOSFET 1 and the gate of the sense MOSFET 2 described above. In addition, the source pads PDS1a and PDS1b can be regarded as the source terminals in the semiconductor chip CP1, the source leads LDS1a and LDS1b can be regarded as the source terminals in the semiconductor device PKG, and all the source pads PDS1a and PDS1b and the source leads LDS1a and LDS1b are electrically connected to the source of the power MOSFET 1 described above. In addition, the Kelvin pad PDK can be regarded as the Kelvin terminal in the semiconductor chip CP1, the Kelvin lead LDK can be regarded as the Kelvin terminal in the semiconductor device PKG, and both the Kelvin pad PDK and the Kelvin lead LDK are electrically connected to the source of the power MOSFET 1 described above. In addition, the source pad PDS2 can be regarded as the source terminal in the semiconductor chip CP1, the source lead LDS2 can be regarded as the source terminal in the semiconductor device PKG, and both the source pad PDS2 and the source lead LDS2 are electrically connected to the source of the sense MOSFET 2 described above. In addition, the back electrode BE can be regarded as the drain terminal in the semiconductor chip CP1, the die pad DP can be regarded as the drain terminal in the semiconductor device PKG, and both the back electrode BE and the die pad DP are electrically connected to the drain of the power MOSFET 1 and the drain of the sense MOSFET 2 described above.

Note that FIG. 10 shows a case in which the source lead LDS1a and the source pad PDS1a of the semiconductor chip CP1 are connected by the single wire WA and the source lead LDS1b and the source pad PDS1b of the semiconductor chip CP1 are connected by the single wire WA. In consideration of the flow of high current, the source lead LDS1a and the source pad PDS1a of the semiconductor chip CP1 may be connected by a plurality of the wires WA, and the source lead LDS1b and the source pad PDS1b of the semiconductor chip CP1 may be connected by a plurality of the wires WA. In addition, in consideration of the flow of high current, the source lead LDS1a and the source pad PDS1a of the semiconductor chip CP1 may be connected by a metal plate (conductor plate) instead of the wire WA, and the source lead LDS1b and the source pad PDS1b of the semiconductor chip CP1 may be connected by a metal plate (conductor plate) instead of the wire WA.

The gate lead LDG, the source lead LDS1b, the source lead LDS1a and the Kelvin lead LDK are arranged at positions spaced apart from the die pad DP in a negative Y-direction, and the plurality of (herein, four) leads LD including the source lead LDS2 are arranged at positions spaced apart from the die pad DP in a positive Y-direction. The gate lead LDG, the source lead LDS1b, the source lead LDS1a and the Kelvin lead LDK are disposed in this order in the positive X-direction. In addition, the plurality of (herein, four) leads LD including the source lead LDS2 arranged at the positions spaced apart from the die pad DP in the positive Y-direction are disposed in the positive X-direction, and the source lead LDS2 is arranged at a side close to an end portion in the positive X-direction in FIGS. 8 to 10.

Note that the X-direction and the Y-direction are directions that intersect each other, and preferably, directions that are orthogonal to each other. In addition, the Y-direction indicates the positive Y-direction or the negative Y-direction, and the positive Y-direction and the negative Y-direction are directions opposite to each other. In addition, the X-direction indicates the positive X-direction or the negative X-direction, and the positive X-direction and the negative X-direction are directions opposite to each other.

A planar shape of the sealing portion MR is a substantially rectangular shape, and has sides (side surfaces) SD1 and SD3 which are parallel in the Y-direction and oppose each other in the X-direction and sides (side surfaces) SD2 and SD4 which are parallel in the X-direction and oppose each other in the Y-direction. The gate lead LDG, the source lead LDS1b, the source lead LDS1a and the Kelvin lead LDK are arranged on the side SD2, and the plurality of (herein, four) leads LD including the source lead LDS2 are arranged on the side SD4.

The die pad DP and the plurality of leads LD (including the gate lead LDG, the source leads LDS1a, LDS1b and LDS2 and the Kelvin lead LDK) are sealed by the sealing portion MR. However, each lower surface of the die pad DP and the plurality of leads LD (including the gate lead LDG, the source leads LDS1a, LDS1b and LDS2 and the Kelvin lead LDK) is exposed from the lower surface of the sealing portion MR, and serves as an external connection terminal of the semiconductor device PKG.

The die pad DP and the plurality of leads LD are isolated from each other, and a part of the sealing portion MR is interposed therebetween.

When the semiconductor device PKG is used in the electronic device of FIG. 1 described above, the power-supply potential VIN is supplied from the above-described power supply BAT to the die pad DP of the semiconductor device PKG, and the power-supply potential VIN is supplied to the back electrode BE (the above-described drain terminal DT) of the semiconductor chip CP1 via the die pad DP and the conductive bonding material BD. In addition, the gate signal (gate voltage) is supplied from the above-described driver circuit DR to the gate lead LDG of the semiconductor device PKG, and the gate signal is supplied to the gate pad PDG (the above-described gate terminal GT) of the semiconductor chip CP1 via the gate lead LDG and the wire WA. In addition, the source leads LDS1a and LDS1b of the semiconductor device PKG are connected to one end of the above-described load LOD, and the other end of the load LOD is connected to the ground potential GND. Thus, the above-described current $I_{PW}$ flowing to the power MOSFET 1 is output from the source pads PDS1a and PDS1b of the semiconductor chip CP1 to the outside of the semiconductor device PKG via the wire WA and the source leads LDS1a and LDS1b, and flows in the load LOD. Also, the source lead LDS2 of the semiconductor device PKG is connected to the source of the transistor TR1 described above, and is further connected also to the inverting input node N2 of the operational amplifier AMP1 described above. In addition, the Kelvin lead LDK of the semiconductor device PKG is connected to the non-inverting input node N1 of the operational amplifier AMP1.

Examination Example

Figure 13:
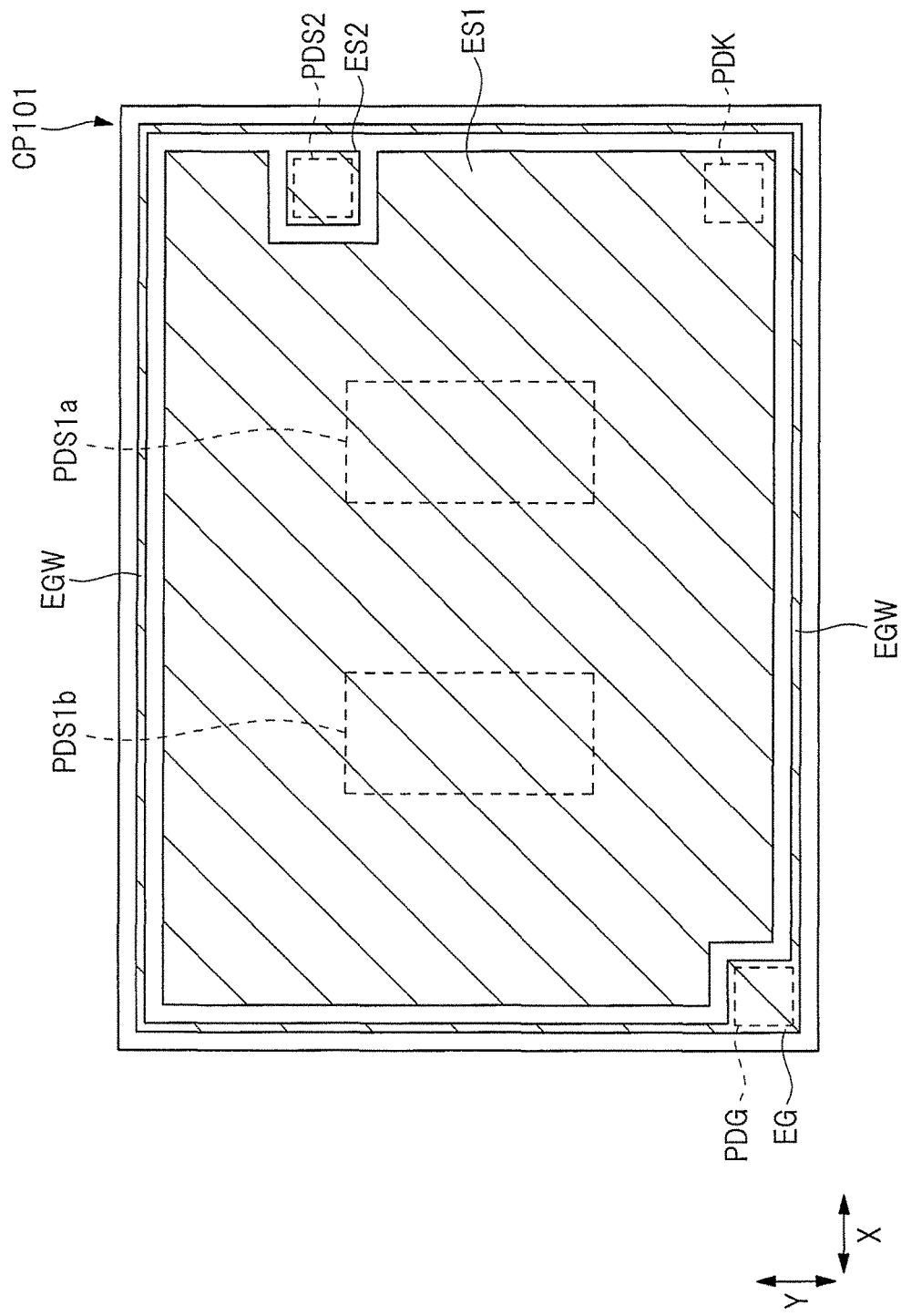
FIG. 13 is a plan view of a semiconductor chip according to an examination example.

FIG. 13 is a plan view showing a semiconductor chip CP101 according to an examination example that has been examined by the inventor, and it corresponds to FIG. 3 described above.

A difference of the semiconductor chip CP101 according to the examination example shown in FIG. 13 from the semiconductor chip CP1 in FIG. 3 described above is that a slit SL1 is not formed in the source electrode ES1 in the case of the semiconductor chip CP101 according to the examination example in FIG. 13 while the slit SL1 is formed in the source electrode ES1 in the case of the semiconductor chip CP1 in FIG. 3 described above. The other configuration of the semiconductor chip CP101 according to the examination example in FIG. 13 is substantially the same as that of the semiconductor chip CP1 in FIG. 3 described above.

The inventor has found out that there is a risk of occurrence of detection error when the current ($I_{PW}$) flowing to the power MOSFET 1 in the semiconductor chip CP101 is indirectly detected by using the current ($I_{SE}$) flowing to the sense MOSFET 2 in the semiconductor chip CP101 in the case of using the semiconductor chip CP101 according to the examination example in FIG. 13. Hereinafter, this problem will be described in detail.

Figure 14:
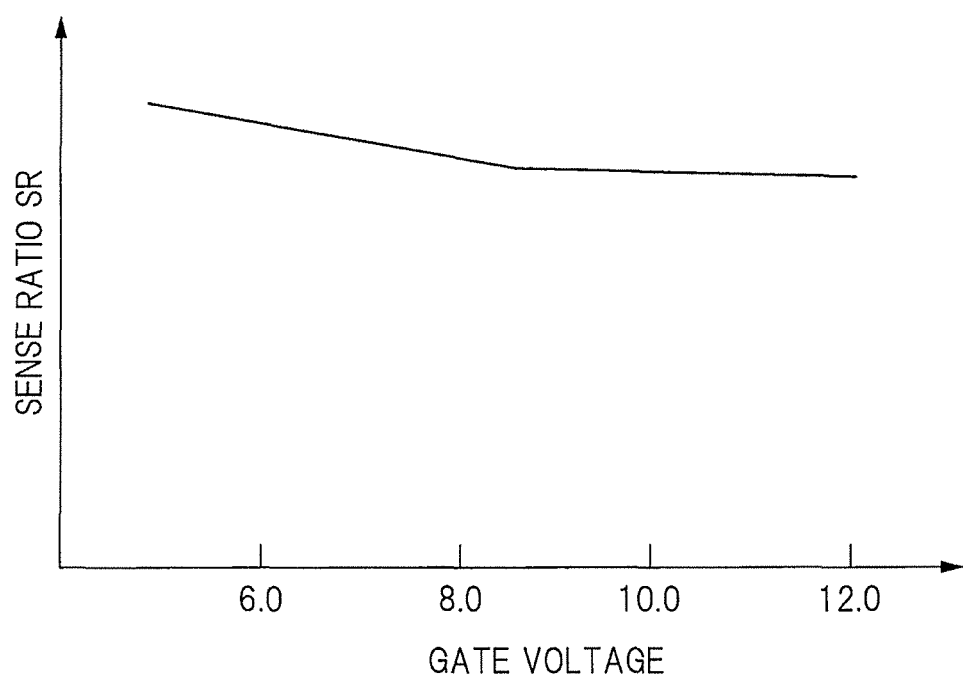
FIG. 14 is a graph showing a current sensing characteristic of the semiconductor chip according to the examination example.

FIG. 14 is a graph showing a current sensing characteristic of the semiconductor chip CP101 according to the examination example. The horizontal axis of the graph in FIG. 14 represents the gate voltage (more specifically, the voltage between the gate and the source) which is supplied to the trench gate electrode TG, and the vertical axis of the graph in FIG. 14 represents the sense ratio.

Herein, the sense ratio indicates a ratio of the current ($I_{PW}$) flowing to the power MOSFET 1 to the current ($I_{SE}$) flowing to the sense MOSFET 2. When the current flowing to the power MOSFET 1 is denoted by $I_{PW}$, the current flowing to the sense MOSFET 2 is denoted by $I_{SE}$ and the sense ratio is denoted by SR, $I_{PW}/I_{SE}$ corresponds to the sense ratio SR, and "SR=$I_{PW}/I_{SE}$" is established.

As can be seen from the graph in FIG. 14, the sense ratio has the dependence with respect to the gate voltage in the semiconductor chip CP101 according to the examination example. Namely, as shown in the graph in FIG. 14, the sense ratio is saturated and becomes a substantially constant value when the voltage between the gate and the source increases to a certain degree (increases to about 9 V or higher in FIG. 14). However, the sense ratio becomes a value higher than a saturation value when the gate voltage is low (lower than about 9 V in FIG. 14).

If the sense ratio is constant (herein, assuming 20000) regardless of a value of the gate voltage, the current ($I_{PW}$) flowing to the power MOSFET 1 becomes 20000 times the current ($I_{SE}$) flowing to the sense MOSFET 2 regardless of the gate voltage, and thus, the detection error hardly occurs at the time of indirectly detecting the current ($I_{PW}$) flowing to the power MOSFET 1 by using the current ($I_{SE}$) flowing to the sense MOSFET 2. This is because it is possible to properly determine that the current which is 20000 times the current ($I_{SE}$) flowing to the sense MOSFET 2 flows in the power MOSFET 1 by monitoring the current ($I_{SE}$) flowing to the sense MOSFET 2 if the fact that the sense ratio is 20000 regardless of the value of the gate voltage is known in advance.

However, when the sense ratio has the dependence with respect to the gate voltage like in the graph in FIG. 14, the detection error occurs at the time of indirectly detecting the current ($I_{PW}$) flowing to the power MOSFET 1 by using the current ($I_{SE}$) flowing to the sense MOSFET 2. For example, it is assumed that the sense ratio is 21000 when the gate voltage is 6 V and the sense ratio is 20000 when the gate voltage is 9 V or higher in the graph in FIG. 14. In this case, it is possible to properly determine that the current which is 20000 times the current ($I_{SE}$) flowing to the sense MOSFET 2 flows in the power MOSFET 1 by monitoring the current ($I_{SE}$) flowing to the sense MOSFET 2 when the gate voltage is 9 V or higher. However, it is incorrect to determine that the current ($I_{SE} \times 20000$) which is 20000 times the current value ($I_{SE}$) flows to the power MOSFET 1 if the current value flowing to the sense MOSFET 2 is $I_{SE}$ when the gate voltage is 6 V, and actually, the current ($I_{SE} \times 21000$) which is 21000 times the current value ($I_{SE}$) flows to the power MOSFET 1. Such a difference ($I_{SE} \times 21000 - I_{SE} \times 20000 = I_{SE} \times 1000$) becomes the detection error of the current ($I_{PW}$) flowing to the power MOSFET 1.

Namely, in the case in which the sense ratio has the dependence with respect to the gate voltage like in the graph in FIG. 14, it is possible to properly calculate the current ($I_{PW}$) flowing to the power MOSFET 1 from the current ($I_{SE}$) flowing to the sense MOSFET 2 when the gate voltage is 9 V or higher. However, when the gate voltage is low, the current of the power MOSFET 1 calculated from the current ($I_{SE}$) flowing to the sense MOSFET 2 does not match the current actually flowing to the power MOSFET 1, and the detection error in the current ($I_{PW}$) flowing to the power MOSFET 1 occurs.

Thus, it is necessary to suppress the dependence of the sense ratio with respect to the gate voltage as much as possible in order to decrease the detection error of the current ($I_{PW}$) flowing to the power MOSFET 1 as much as possible. In this embodiment, though details will be described later, the dependence of the sense ratio with respect to the gate voltage is suppressed by forming the slit SL1 (see FIG. 3) in a source wiring ES, and accordingly, the occurrence of detection error is suppressed or prevented at the time of indirectly detecting the current ($I_{PW}$) flowing to the power MOSFET 1 by using the current ($I_{SE}$) flowing to the sense MOSFET 2.

Figure 15:
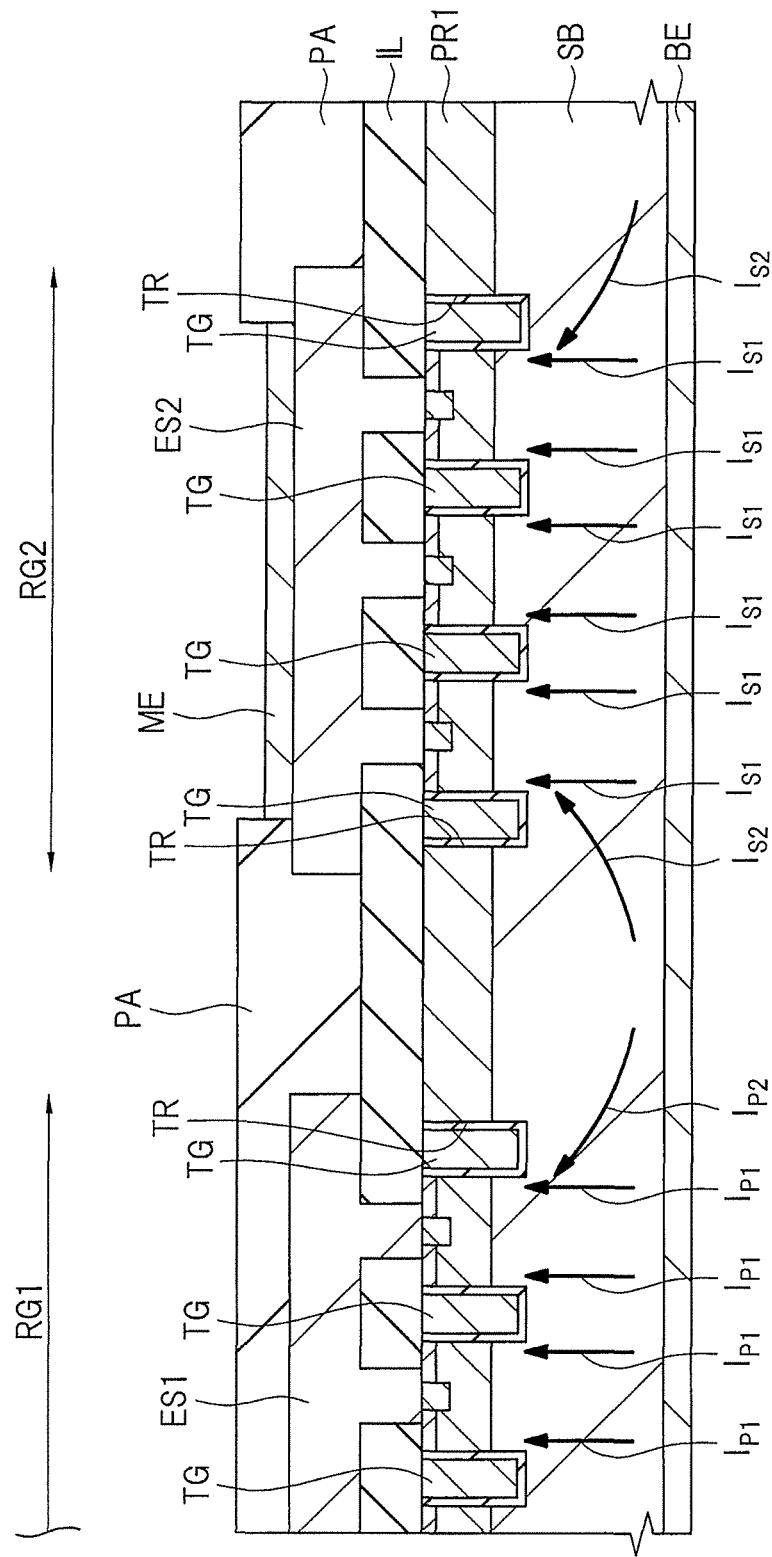
FIG. 15 is a cross-sectional view showing a principal part of the semiconductor chip according to the examination example.

Here, a factor that causes the dependence of the sense ratio with respect to the gate voltage like in the graph in FIG. 14 will be described with reference to FIG. 15. FIG. 15 is a cross-sectional view showing a principal part of the semiconductor chip CP101 according to the examination example, and shows the same cross section as FIG. 6 described above.

When the ON-voltage that turns the power MOSFET 1 and the sense MOSFET 2 into the ON-state (conducting state) is supplied to the above-described gate pad PDG, the current flows in the vertical direction (direction approximately perpendicular to the main surface of the semiconductor substrate SB) in each of the power MOSFET 1 and the sense MOSFET 2. When a channel width (total channel width) of the power MOSFET 1 is denoted by $W_P$ and a channel width (total channel width) of the sense MOSFET 2 is denoted by $W_S$, the current ($I_{PW}$) flowing to the power MOSFET 1 and the current ($I_{SE}$) flowing to the sense MOSFET 2 are allocated ideally with a ratio between $W_P$ and $W_S$, and an ideal sense ratio is $W_P/W_S$.

Practically, however, a current ($I_{P2}$, $I_{S2}$) flowing in an oblique direction is generated near the bottom portion of the trench TR in the vicinity of the outer circumference of the main MOS region RG1 and the outer circumference of the sense MOS region RG2 due to the influence of the non-active regions in the outer circumference of the main MOS region RG1 and the outer circumference of the sense MOS region RG2 as shown in FIG. 15.

Namely, currents $I_{P1}$ and $I_{P2}$ flow to the main MOS region RG1 and currents $I_{S1}$ and $I_{S2}$ flow to the sense MOS region RG2 as shown in FIG. 15. Herein, the current $I_{P1}$ is the current flowing in the semiconductor substrate SB in the vertical direction (direction approximately perpendicular to the main surface of the semiconductor substrate SB) in the main MOS region RG1, and the current $I_{S1}$ is the current flowing in the semiconductor substrate SB in the vertical direction in the sense MOS region RG2. In addition, the current $I_{P2}$ is the current that flows from the outer circumferential portion (the non-active region) of the main MOS region RG1 toward the main MOS region RG1 in the oblique direction (direction inclined from the normal direction of the main surface of the semiconductor substrate SB). In addition, the current $I_{S2}$ is the current that flows from the outer circumferential portion (the non-active region) of the sense MOS region RG2 toward the sense MOS region RG2 in the oblique direction (direction inclined from the normal direction of the main surface of the semiconductor substrate SB).

Specifically, the current $I_{P1}$ in the vertical direction flows inside the main MOS region RG1, but the current $I_{P2}$ which flows from the non-active region toward the main MOS region RG1 in the oblique direction is generated near the outer circumferential portion of the main MOS region RG1. In addition, the current $I_{S1}$ in the vertical direction flows inside the sense MOS region RG2, but the current $I_{S2}$ which flows from the non-active region toward the sense MOS region RG2 in the oblique direction is generated near the outer circumferential portion of the sense MOS region RG2.

Unless these currents $I_{P2}$ and $I_{S2}$ in the oblique direction are generated, the ratio $(I_{PW}/I_{SE})$ between the current $(I_{PW})$ flowing to the power MOSFET 1 and the current $(I_{SE})$ flowing to the sense MOSFET 2 becomes substantially the same value as the channel width ratio $(W_P/W_S)$. However, when these currents $I_{P2}$ and $I_{S2}$ in the oblique direction are generated, the ratio $(I_{PW}/I_{SE})$ between the current $(I_{PW})$ flowing to the power MOSFET 1 and the current $(I_{SE})$ flowing to the sense MOSFET 2 becomes a value different from the channel width ratio $(W_P/W_S)$ due to the influence thereof.

Herein, the area of the sense MOS region RG2 is smaller than the area of the main MOS region RG1. Thus, the sense MOS region RG2 (the sense MOSFET 2) is more likely to be affected by the outer circumferential portion (the non-active region) than the main MOS region RG1 (the power MOSFET 1), and is easily affected by the current $(I_{P2}, I_{S2})$ flowing from the non-active region in the oblique direction. Namely, a proportion $(I_{S3}/I_{S1})$ of the current $I_{S2}$ in the oblique direction to the current $I_{S1}$ in the vertical direction in the sense MOS region RG2 is higher than a proportion $(I_{P2}/I_{P1})$ of the current $I_{P2}$ in the oblique direction to the current $I_{P1}$ in the vertical direction in the main MOS region RG1. Namely, "$I_{S2}/I_{S1} > I_{P2}/I_{P1}$" is established, and accordingly, the following expression is established:

$$(I_{S1}+I_{S2})/I_{S1} > (I_{P1}+I_{P2})/I_{P1} \qquad \text{(Expression 1)}$$

In addition, a generation condition of the currents $I_{P2}$ and $I_{S2}$ in the oblique direction greatly depends on the gate voltage. To be specific, the currents $I_{P2}$ and $I_{S2}$ in the oblique direction are hardly generated when the gate voltage is low even though the power MOSFET 1 and the sense MOSFET 2 are turned into the ON-state (conducting state), and the currents $I_{P2}$ and $I_{S2}$ in the oblique direction are significantly generated when the gate voltage is high. This is because since each channel resistance of the unit transistor cells formed in the semiconductor substrate SB is high when the gate voltage to be supplied to the trench gate electrode TG is low, a potential difference in the drain region is relatively small and the currents $I_{P2}$ and $I_{S2}$ in the oblique direction are hardly generated, so that only the current $(I_{P1}, I_{S1})$ in the vertical direction flows in the main MOS region RG1 and the sense MOS region RG2. Further, this is because since each channel resistance of the unit transistor cells formed in the semiconductor substrate SB is low when the gate voltage is high, the potential difference in the drain region becomes relatively large, and accordingly, not only the current $(I_{P1}, I_{S1})$ in the vertical direction but also the currents $I_{P2}$ and $I_{S2}$ in the oblique direction are likely to flow, so that a proportion of the current $(I_{P2}, I_{S2})$ in the oblique direction to the current $(I_{P1}, I_{S1})$ in the vertical direction becomes high.

Thus, the sense MOS region RG2 is likely to be affected by the current $(I_{S2})$ flowing in the oblique direction from the outer circumferential portion (the non-active region) of the sense MOS region RG2, and the current $(I_{S2})$ in the oblique direction is hardly generated when the gate voltage is low, but it increases when the gate voltage is high. Accordingly, the proportion $(I_{S2}/I_{S1})$ of the current $I_{S2}$ in the oblique direction to the current $I_{S1}$ in the vertical direction in the sense MOS region RG2 is high at a certain degree in the case in which the gate voltage is high as compared to the case in which the gate voltage is low. On the other hand, the main MOS region RG1 is less likely to be affected by the current $(I_{P2})$ flowing in the oblique direction from the outer circumferential portion (the non-active region) of the main MOS region RG1, and thus, the proportion $(I_{P2}/I_{P1})$ of the current $I_{P2}$ in the oblique direction to the current $I_{P1}$ in the vertical direction in the main MOS region RG1 is hardly changed between the case in which the gate voltage is low and the case in which the gate voltage is high.

The sense ratio is the ratio of the current $(I_{PW})$ flowing to the power MOSFET 1 to the current $(I_{SE})$ flowing to the sense MOSFET 2. Further, the current $(I_{SE})$ flowing to the sense MOSFET 2 is a sum of the current $I_{S1}$ in the vertical direction and the current $I_{S2}$ in the oblique direction (that is, $I_{SE}=I_{S1}+I_{S2}$). Also, the current $(I_{PW})$ flowing to the power MOSFET 1 is a sum of the current $I_{P1}$ in the vertical direction and the current $I_{P2}$ in the oblique direction (that is, $I_{PW}=I_{P1}+I_{P2}$). Accordingly, when the sense ratio is denoted by SR, the sense ratio SR is expressed as follows:

$$SR=I_{PW}/I_{SE}=(I_{P1}+I_{P2})/(I_{S1}+I_{S2}) \qquad \text{(Expression 2)}$$

The current $(I_{P2}, I_{S2})$ in the oblique direction hardly flows and can be regarded as substantially zero when the gate voltage is low, and thus, the above-described Expression 1 becomes as follows:

$$SR=I_{PW}/I_{SE}=I_{P1}/I_{S1}=W_P/W_S \qquad \text{(Expression 3)}$$

Namely, the sense ratio SR becomes substantially equal to the channel width ratio $(W_P/W_S)$ when the gate voltage is low.

On the other hand, the current $(I_{P2}, I_{S2})$ in the oblique direction flows and the above-described Expression 1 is established when the gate voltage is high. The above-described Expression 1 may be modified as follows:

$$I_{P1}/I_{S1} > (I_{P1}+I_{P2})/(I_{S1}+I_{S2}) \qquad \text{(Expression 4)}$$

Since "$I_{P1}/I_{S1}=W_P/W_S$" is substantially established regardless of the gate voltage, the following expression is established from the above-described Expression 2 and the above-described Expression 4:

$$SR=I_{PW}/I_{SE}=(I_{P1}+I_{P2})/(I_{S1}+I_{S2}) < W_P/W_S \qquad \text{(Expression 5)}$$

Namely, the sense ratio SR is lower than the channel width ratio $(W_P/W_S)$ when the gate voltage is high.

Specifically, since the currents $I_{P2}$ and $I_{S2}$ in the oblique direction are hardly generated when the gate voltage is low, the sense ratio SR becomes substantially the same value as the channel width ratio $(W_P/W_S)$. Meanwhile, the currents $I_{P2}$ and $I_{S2}$ in the oblique direction are generated when the gate voltage is high and the influence thereof is relatively greater in the sense MOS region RG2 than in the main MOS region RG1, and thus, the sense ratio SR becomes the value lower than the channel width ratio $(W_P/W_S)$. Therefore, the sense ratio SR in the case of the high gate voltage is lower than the sense ratio SR in the case of the low gate voltage, in other words, the sense ratio SR in the case of the low gate voltage is higher than the sense ratio SR in the case of the high gate voltage, and the dependence of the sense ratio with respect to the gate voltage is generated like in the graph in FIG. 14 described above. This leads to the detection error at the time of indirectly detecting the current $(I_{PW})$ flowing to the power MOSFET 1 by using the current $(I_{SE})$ flowing to the sense MOSFET 2.

<Major Characteristics and Effects>

The semiconductor chip (semiconductor device) CP1 according to this embodiment includes the semiconductor substrate SB, the power MOSFET 1 (first MOSFET) formed in the main MOS region RG1 (first region) of the main surface of the semiconductor substrate SB and the sense MOSFET 2 (second MOSFET) formed in the sense MOS region RG2 (second region) of the main surface of the semiconductor substrate SB. The semiconductor chip CP1 further includes the source electrode ES1 (first source electrode) which is formed over the main MOS region RG1 and is electrically connected to the source of the power MOSFET 1 and the source electrode ES2 (second source electrode) which is formed over the main surface of the semiconductor substrate SB and is electrically connected to the source of the sense MOSFET 2. The semiconductor chip CP1 further includes the gate electrode EG which is formed over the main surface of the semiconductor substrate SB and is electrically connected to the gate of the power MOSFET 1 and the gate of the sense MOSFET 2 and the back electrode BE (drain electrode) which is formed on the back surface of the semiconductor substrate SB and is electrically connected to the drain of the power MOSFET 1 and the drain of the sense MOSFET 2. The semiconductor chip CP1 further includes the protection film PA (insulating film) which is formed over the main surface of the semiconductor substrate SB and covers the source electrode ES1, the source electrode ES2 and the gate electrode EG. The semiconductor chip CP1 further includes the source pad PDS1a (first source pad) which is formed of the source electrode ES1 exposed from the source opening portion OPS1a (first opening portion) of the protection film PA and the Kelvin pad PDK (second source pad) which is formed of the source electrode ES1 exposed from the Kelvin opening portion OPK (second opening portion) of the protection film PA. The semiconductor chip CP1 further includes the source pad PDS2 (third source pad) which is formed of the source electrode ES2 exposed from the source opening portion OPS2 (third opening portion) of the protection film PA and the gate pad PDG which is formed of the gate electrode EG exposed from the gate opening portion OPG (fourth opening portion) of the protection film PA.

The sense MOSFET 2 is the element for detecting the current flowing to the power MOSFET 1, and the sense MOS region RG2 is an area which is smaller than the main MOS region RG1 on the main surface of the semiconductor substrate SB. The source pad PDS1a and the Kelvin pad PDK are arranged over the main MOS region RG1, the source pad PDS1a is the pad for outputting the current flowing to the power MOSFET 1, and the Kelvin pad PDK is the pad for detecting the source potential of the power MOSFET 1.

One of the major characteristics of this embodiment is that the source electrode ES1 has the slit SL1. Further, at least a part of the slit SL1 is arranged between the source pad PDS1a and the Kelvin pad PDK when seen in a plan view. The slit SL1 is shown in FIG. 3 described above.

The slit SL1 is provided to generate a potential difference between the source pad PDS1a and the Kelvin pad PDK. The potential difference is generated between the source pad PDS1a and the Kelvin pad PDK by providing the slit SL1, and accordingly, it is possible to suppress the dependence of the sense ratio with respect to the gate voltage. Hereinafter, this point will be described in detail.

Figure 16:
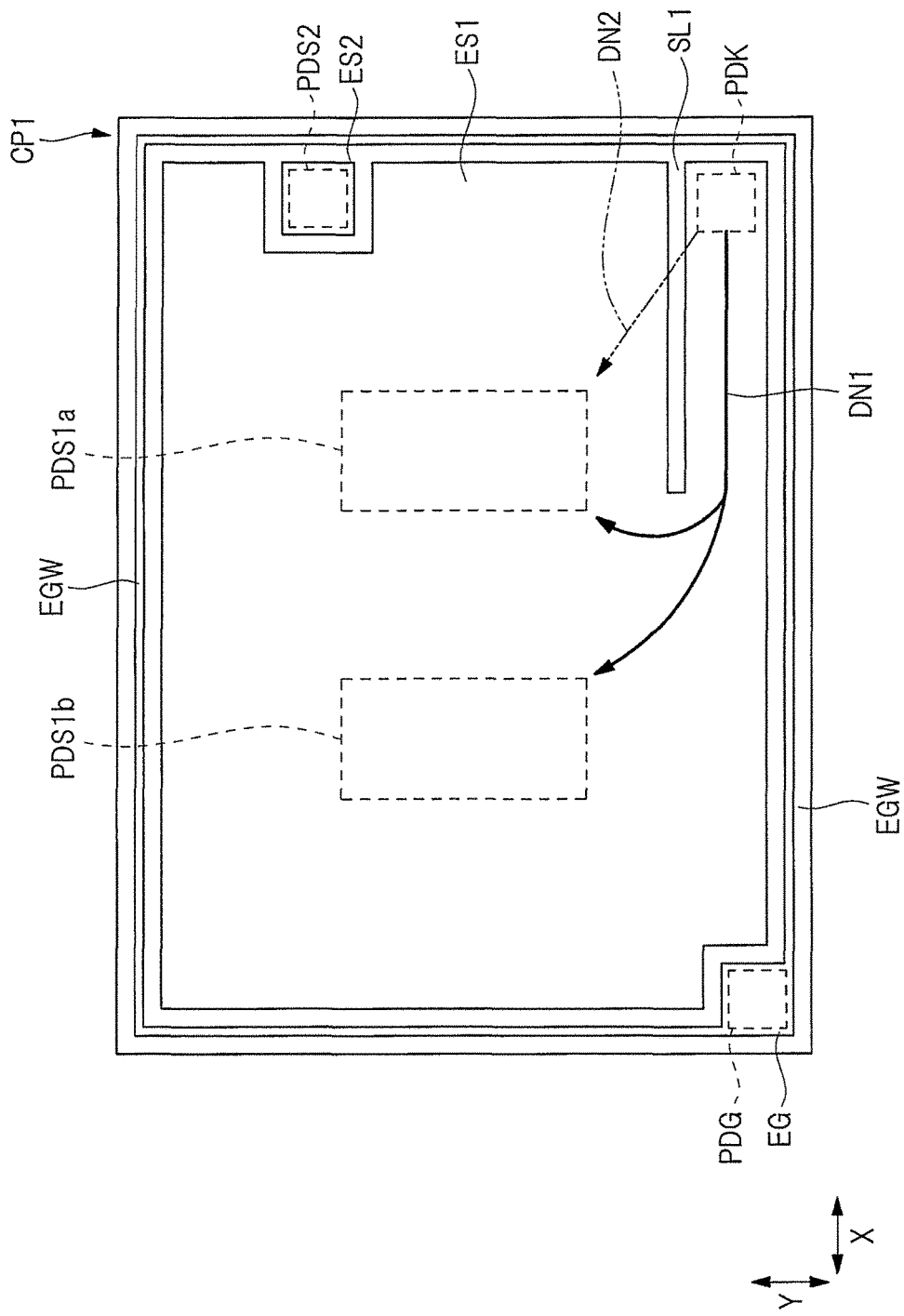
FIG. 16 is a plan view showing a chip layout of the semiconductor chip according to the embodiment.

FIG. 16 is a plan view showing a chip layout of the semiconductor chip CP1, and corresponds to FIG. 3 described above. FIG. 16 also shows a planar layout of the metal layers (the gate electrode EG, the gate wiring EGW and the source electrodes ES1 and ES2) in the semiconductor chip CP1 like FIG. 3 described above. In FIG. 3 described above, the metal layers are shown with hatching, but the metal layers are shown without hatching in FIG. 16. In addition, FIG. 16 also shows each position of the bonding pads (the gate pad PDG, the source pads PDS1a and PDS1b, the source pad PDS2 and the Kelvin pad PDK) with the dotted line like FIG. 3 described above.

As can be seen from FIG. 1 described above, the load LOD is connected to the source pads PDS1a and PDS1b of the semiconductor chip CP1, and the current flowing to the power MOSFET 1 is output from the source pads PDS1a and PDS1b and flows to the load LOD. The Kelvin pad PDK is the pad for detecting the source potential of the power MOSFET 1, and is arranged over the main MOS region RG1. Thus, the potential of the source region ($n^+$ semiconductor region NR) of the unit transistor cell which is formed in a region positioned immediately under the Kelvin pad PDK in the main MOS region RG1 is detected as the potential of the Kelvin pad PDK.

However, the current flowing to the unit transistor cell which is formed in the semiconductor substrate SB of the region positioned immediately under the Kelvin pad PDK in the main MOS region RG1 is output from the source pads PDS1a and PDS1b via the source electrode ES1. Namely, the current flowing to the unit transistor cell which is formed in the semiconductor substrate SB of the region positioned immediately under the Kelvin pad PDK flows from the Kelvin pad PDK to the source pads PDS1a and PDS1b through the source electrode ES1, and this current path is shown with reference character DN1 in FIG. 16. The slit SL1 is a region in which the source electrode ES1 is not present. Thus, the current path DN1 cannot pass across the slit SL1. The current path DN1 is a path that links the Kelvin pad PDK with the source pads PDS1a and PDS1b while bypassing the slit SL1.

Meanwhile, when the slit SL1 is not provided (corresponding to the case of the semiconductor chip CP101 according to the examination example in FIG. 13) unlike this embodiment, the current flowing to the unit transistor cell which is formed in the semiconductor substrate SB of the region positioned immediately under the Kelvin pad PDK flows from the Kelvin pad PDK to the source pad PDS1a through the source electrode ES1 along a current path DN2 shown with the two-dot chain line in FIG. 16. The current path DN2 is a path that links the Kelvin pad PDK with the source pad PDS1a which is closer to the Kelvin pad PDK between the source pads PDS1a and PDS1b.

Namely, in FIG. 16, the current flows along the current path DN1 from the Kelvin pad PDK to the source pad PDS1a through the source electrode ES1 when the slit SL1 is formed, and the current flows along the current path DN2 from the Kelvin pad PDK to the source pad PDS1a through the source electrode ES1 when the slit SL1 is not formed. As can be seen from FIG. 16, the current path DN1 is longer than the current path DN2, and the current path DN1 has a higher resistance than the current path DN2.

Herein, each channel resistance of the unit transistor cells formed in the semiconductor substrate SB is high when the gate voltage to be supplied to the trench gate electrode TG is low, and the resistance of the source electrode ES1 is extremely low as compared to the channel resistance, and thus, the potential becomes substantially uniform in the source electrode ES1 and a potential gradient is hardly generated. Accordingly, when the gate voltage is low, the potential difference is hardly generated between the Kelvin pad PDK and the source pad PDS1a regardless of presence or absence of the slit SL1. Note that the gate voltage supplied to the trench gate electrode TG corresponds to the gate voltage supplied to the gate pad PDG, and thus, corresponds to the gate voltage supplied to each gate of the power MOSFET 1 and the sense MOSFET 2.

On the other hand, each channel resistance of the unit transistor cells formed in the semiconductor substrate SB is low when the gate voltage to be supplied to the trench gate electrode TG is high, and a ratio of the resistance of the source electrode ES1 in the entire resistance (conduction resistance) of the semiconductor chip increases, and thus, the potential is not uniform in the source electrode ES1 and the potential gradient is generated. Therefore, the potential difference is generated between the Kelvin pad PDK and the source pad PDS1a when the gate voltage is high, and this potential difference increases as the resistance between the Kelvin pad PDK and the source pad PDS1a is high. The resistance between the Kelvin pad PDK and the source pad PDS1a increases as the current path (DN1, DN2) between the Kelvin pad PDK and the source pad PDS1a becomes longer. Accordingly, the potential difference is generated between the Kelvin pad PDK and the source pad PDS1a when the gate voltage is high, and this potential difference becomes larger in the case in which the slit SL1 is provided (the case of the current path DN1) than in the case in which the slit SL1 is not provided (the case of the current path DN2).

Namely, the potential of the Kelvin pad PDK and the potential of the source pad PDS1a are substantially equal when the gate voltage to be supplied to the trench gate electrode TG is low, but when the gate voltage to be supplied to the trench gate electrode TG is high, it is possible to make the potential of the Kelvin pad PDK higher than the potential of the source pad PDS1a and to increase the potential difference therebetween by providing the slit SL1.

In this manner, the resistance of the current path between the Kelvin pad PDK and the source pad PDS1a is increased by providing the slit SL1, and accordingly, it is possible to generate the potential difference between the source pad PDS1a and the Kelvin pad PDK when the gate voltage is high, and to increase the potential difference therebetween.

Next, a point that the generation of the potential difference between the source pad PDS1a and the Kelvin pad PDK leads to the suppression of the dependence of the sense ratio with respect to the gate voltage when the gate voltage is high will be described.

The Kelvin pad PDK of the semiconductor chip CP1 is the pad for detecting the source potential of the power MOSFET 1, and is connected to the current detection circuit unit DKC provided outside the semiconductor chip CP1 as can be seen from FIG. 1 described above, and more specifically, is electrically connected to one input node (the node N1) of the two input nodes of the operational amplifier AMP1 (differential amplifier) of the current detection circuit unit DKC. Further, the source pad PDS2 of the semiconductor chip CP1 is electrically connected to the other input node (the node N2) of the two input nodes of the operational amplifier AMP1 (differential amplifier) of the current detection circuit unit DKC. The operational amplifier AMP1 of the current detection circuit unit DKC controls the transistor TR1 (more specifically, the gate voltage to be supplied to the gate of the transistor TR1) so that the node N1 is equal in potential to the node N2, and accordingly, the potential of the Kelvin pad PDK connected to the node N1 is equal to the potential of the source pad PDS2 connected to the node N2. Accordingly, the potential of the Kelvin pad PDK becomes equal to the potential of the source pad PDS2, and the current $I_{PW}$ flowing to the power MOSFET 1 can be indirectly detected by detecting the current ($I_{SE}$) flowing to the sense MOSFET 2 at this time by the current detection circuit unit DKC.

Herein, the operational amplifier AMP1 (differential amplifier) of the current detection circuit unit DKC functions to make the potential of the Kelvin pad PDK and the potential of the source pad PDS2 equal to each other. Thus, the potential of the source pad PDS2 becomes equal to the potential of the Kelvin pad PDK when the Kelvin pad PDK and the source pad PDS2 are electrically connected to the current detection circuit unit DKC (specifically, the operational amplifier AMP of the current detection circuit unit DKC). Therefore, when the potential of the Kelvin pad PDK is equal to the potential of the source pad PDS1a, the potential of the source pad PDS2 also becomes equal to the potential of the source pad PDS1a, and when the potential of the Kelvin pad PDK is higher than the potential of the source pad PDS1a, the potential of the source pad PDS2 also becomes higher than the potential of the source pad PDS1a.

As described above, when the gate voltage to be supplied to the trench gate electrode TG is low, the potential gradient is hardly generated in the source electrode ES1, and thus, the potential difference is hardly generated between the Kelvin pad PDK and the source pad PDS1a regardless of presence or absence of the slit SL1. Therefore, when the gate voltage to be supplied to the trench gate electrode TG is low, the potential difference is hardly generated also between the source pad PDS2 and the source pad PDS1a, and the potential of the source pad PDS2 and the potential of the source pad PDS1a become substantially equal to each other.

On the other hand, as described above, when the gate voltage to be supplied to the trench gate electrode TG is high, the potential gradient is generated in the source electrode ES1, and thus, the potential difference is generated between the Kelvin pad PDK and the source pad PDS1a, and this potential difference is increased by providing the slit SL1. Therefore, when the gate voltage to be supplied to the trench gate electrode TG is high, the potential difference is generated also between the source pad PDS2 and the source pad PDS1a, so that the potential of the source pad PDS2 becomes higher than the potential of the source pad PDS1a and the potential difference between the source pad PDS2 and the source pad PDS1a is increased by providing the slit SL1.

Herein, making the potential of the source pad PDS2 higher than the potential of the source pad PDS1a leads to the decrease of the current ($I_{SE}$) flowing to the sense MOSFET 2.

For example, the case in which a predetermined gate voltage is applied to the gate pad PDG, the drain voltage (the power-supply potential VIN) to be supplied to the back electrode BE of the semiconductor chip CP1 is 12 V, and the potential of the source pad PDS1a is 10 V is assumed. At this time, if a potential difference is not present between the source pad PDS1a and the Kelvin pad PDK, the potential of the source pad PDS2 is also 10 V which is equal to the potential of the source pad PDS1a. However, when the gate voltage is high to a certain degree and the slit SL1 is provided, the potential difference is generated between the Kelvin pad PDK and the source pad PDS1a as described above, and thus, the potential of the source pad PDS2 becomes higher than the potential of the source pad PDS1a (10 V) and becomes, for example, 10.2 V. When the current ($I_{SE}$) flowing to the sense MOSFET 2 is compared between the case of the potential of the source pad PDS1a of 10 V and the case of 10.2 V without changing the drain voltage to be supplied to the back electrode BE and the gate voltage to be supplied to the trench gate electrode TG, the following result is obtained. That is, the current ($I_{SE}$) flowing to the sense MOSFET 2 in the case of the potential of the source pad PDS1a of 10.2 V is lower than the current ($I_{SE}$) flowing to the sense MOSFET 2 in the case of the potential of the source pad PDS1a of 10 V. This is because the current flowing between the source and the drain decreases as the voltage (potential difference) between the source and the drain decreases if the gate voltage is the same.

Thus, when the semiconductor chip CP1 (the case of providing the slit SL1) and the semiconductor chip CP101 (the case of not providing the slit SL1) are compared, the potential difference between the source pad PDS2 and the source pad PDS1a when the gate voltage to be supplied to the trench gate electrode TG is high can be increased in the semiconductor chip CP1. Accordingly, when the semiconductor chip CP1 and the semiconductor chip CP101 are compared, the current ($I_{SE}$) flowing to the sense MOSFET 2 when the gate voltage to be supplied to the trench gate electrode TG is high can be decreased in the semiconductor chip CP1. On the other hand, when the gate voltage to be supplied to the trench gate electrode TG is low, the potential difference is hardly generated between the source pad PDS2 and the source pad PDS1a regardless of presence or absence of the slit SL1, and thus, the current ($I_{SE}$) flowing to the sense MOSFET 2 when the gate voltage is low is substantially the same in the semiconductor chip CP1 and the semiconductor chip CP101.

Accordingly, the current ($I_{SE}$) flowing to the sense MOSFET 2 when the gate voltage is low is the same in the semiconductor chip CP1 (the case of providing the slit SL1) and the semiconductor chip CP101 (the case of not providing the slit SL1), and the current ($I_{SE}$) flowing to the sense MOSFET 2 when the gate voltage is high is lower in the semiconductor chip CP1 than in the semiconductor chip CP101.

As described above, providing the slit SL1 functions to decrease the current ($I_{SE}$) flowing to the sense MOSFET 2 when the gate voltage to be supplied to the trench gate electrode TG is high. Decreasing the current ($I_{SE}$) flowing to the sense MOSFET 2 leads to the increase in the sense ratio ($I_{PW}/I_{SE}$). Thus, providing the slit SL1 functions to increase the sense ratio ($I_{PW}/I_{SE}$) when the gate voltage to be supplied to the trench gate electrode TG is high.

Figure 17:
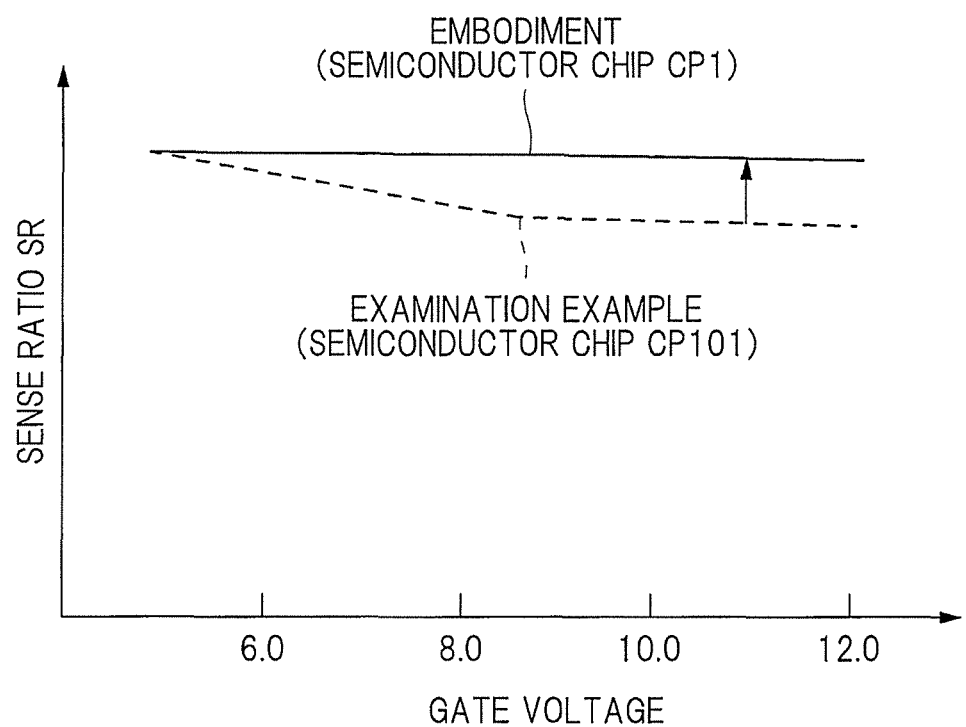
FIG. 17 is a graph showing a current sensing characteristic of the semiconductor chip according to the embodiment.

FIG. 17 is a graph showing a current sensing characteristic of the semiconductor chip CP1 according to this embodiment. The horizontal axis of the graph in FIG. 17 represents the gate voltage (more specifically, the voltage between the gate and the source) supplied to the trench gate electrode TG, and the vertical axis of the graph in FIG. 17 represents the sense ratio. Note that the graph in FIG. 17 shows the current sensing characteristic (corresponding to the graph in FIG. 14 described above) of the semiconductor chip CP101 according to the examination example with the dotted line for comparison.

As described above, in the case of the semiconductor chip CP101 according to the examination example, the above-described currents $I_{P2}$ and $I_{S2}$ in the oblique direction are generated when the gate voltage to be supplied to the trench gate electrode TG is high and the influence thereof becomes relatively greater in the sense MOS region RG2 than in the main MOS region RG1. Thus, in the case of the above-described semiconductor chip CP101, the sense ratio SR in the case where gate voltage is high becomes lower than the sense ratio SR in the case where the gate voltage is low as shown in FIG. 14 described above (or the graph of the dotted line in FIG. 17).

On the contrary, in this embodiment, the current ($I_{SE}$) flowing to the sense MOSFET 2 when the gate voltage to be supplied to the trench gate electrode TG is high can be decreased by providing the slit SL1 as compared to the case of not providing the slit SL1 (the case of the semiconductor chip CP101 according to the examination example), and accordingly, it is possible to increase the sense ratio SR in the case where the gate voltage is high. Accordingly, the dependence of the sense ratio with respect to the gate voltage can be suppressed by providing the slit SL1 like in this embodiment, and the sense ratio which does not depend on the gate voltage and is substantially constant can be obtained as shown in FIG. 17.

Namely, when the gate voltage to be supplied to the trench gate electrode TG is low, the above-described currents $I_{P2}$ and $I_{S2}$ in the oblique direction are hardly generated and the potential difference is hardly generated between the source pad PDS2 and the source pad PDS1a, and thus, the sense ratio SR in the case where the gate voltage is low can be made to be substantially the same value as the channel width ratio ($W_P/W_S$). On the other hand, when the gate voltage to be supplied to the trench gate electrode TG is high, the increase in current due to the above-described current $I_{S2}$ in the oblique direction is significantly generated in the sense MOS region RG2, but such increase in current can be canceled by the decrease in the current ($I_{SE}$) of the sense MOSFET 2 achieved by providing the slit SL1. Thus, the sense ratio SR in the case where the gate voltage is high can also be made to be a value close to the channel width ratio ($W_P/W_S$). Accordingly, the dependence of the sense ratio with respect to the gate voltage can be suppressed, and the sense ratio which does not depend on the gate voltage and is substantially constant can be obtained.

As described above, when the case of providing the slit SL1 (the semiconductor chip CP1 according to this embodiment) and the case of not providing the slit SL1 (the semiconductor chip CP101 according to the examination example) are compared, the dependence of the sense ratio with respect to the gate voltage can be more suppressed in the case of providing the slit SL1 (the semiconductor chip CP1).

Accordingly, in this embodiment, since the dependence of the sense ratio with respect to the gate voltage can be suppressed by providing the slit SL1, it is possible to suppress or prevent the occurrence of the detection error at the time of indirectly detecting the current ($I_{PW}$) flowing to the power MOSFET 1 by using the current ($I_{SE}$) flowing to the sense MOSFET 2. Namely, it is possible to more accurately detect the current ($I_{PW}$) flowing to the power MOSFET 1 by using the current ($I_{SE}$) flowing to the sense MOSFET 2 regardless of the gate voltage. Accordingly, it is possible to improve the performance of the semiconductor chip CP1. Also, it is possible to improve the reliability of the semiconductor chip CP1. In addition, it is possible to improve the performance and reliability of the electronic device using the semiconductor chip CP1.

Figure 18:
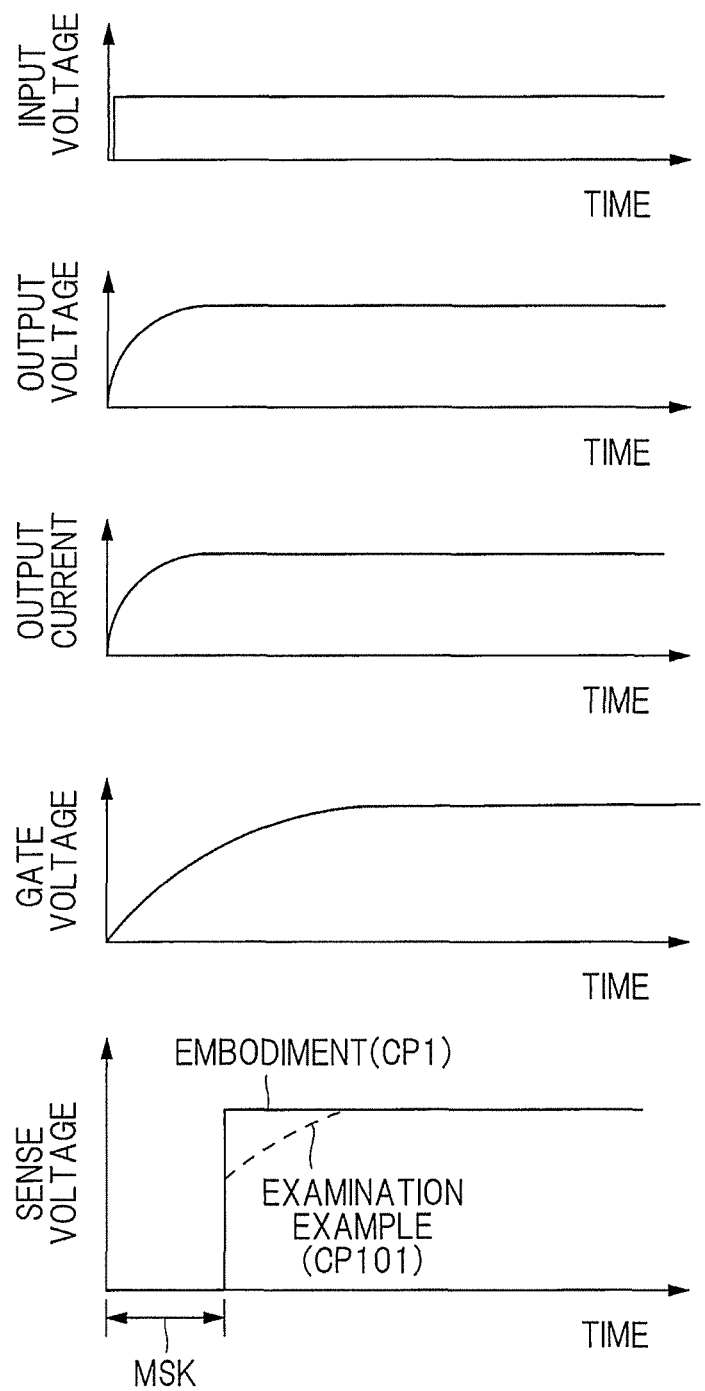
FIG. 18 is a graph showing a timing chart at the time of turning on a power MOSFET.

FIG. 18 is a graph showing a timing chart at the time of turning on the power MOSFET 1.

A graph on the top among five graphs shown in FIG. 18 corresponds to a graph indicating an input voltage (control signal) from the above-described control circuit unit CLC to the above-described driver circuit DR, the second graph from the top corresponds to a graph indicating an output voltage of the source pads PDS1a and PDS1b, and the third graph from the top corresponds to a graph indicating an output current of the source pads PDS1a and PDS1b. In addition, the fourth graph from the top among the five graphs shown in FIG. 18 corresponds to a graph indicating the gate voltage input from the driver circuit DR to the gate pad PDG described above, and a graph at the bottom corresponds to a graph indicating a sense voltage (voltage of the terminal TE1 described above).

In an initial time (mask time MSK shown in FIG. 18) at the time of turning on the power MOSFET 1, mask processing is performed so that the voltage (sense voltage) of the terminal TE1 described above is not monitored (output). As can be seen from the graph at the bottom among the five graphs shown in FIG. 18, the sense voltage becomes active and the sense voltage can be monitored after the predetermined mask time MSK elapses after turning on the power MOSFET 1, and accordingly, the current ($I_{PW}$) flowing to the power MOSFET 1 can be indirectly monitored.

In general, slow switching is desirable to reduce switching noise in the driving of the power MOSFET. Since a voltage increasing rate of the gate voltage is slow in the slow switching, it is desirable to start the monitoring of the sense voltage before the gate voltage reaches a saturation voltage value.

However, when the sense ratio has the dependence with respect to the gate voltage like in FIG. 14 described above, the sense ratio changes during a period until the gate voltage reaches the saturation voltage value after the elapse of the predetermined mask time MSK, and thus, the sense voltage does not become a value which is proportional to the output current (the output current of the source pads PDS1$a$ and PDS1$b$). This means that an error occurs in the indirect monitoring of the current ($I_{PW}$) flowing to the power MOSFET 1 by the monitoring of the sense voltage in the period until the gate voltage reaches the saturation voltage value after the elapse of the predetermined mask time MSK.

On the contrary, in this embodiment, the dependence of the sense ratio with respect to the gate voltage can be suppressed by providing the slit SL1 as shown in FIG. 17 described above. Therefore, the sense ratio is substantially constant even in the period until the gate voltage reaches the saturation voltage value after the elapse of the predetermined mask time MSK, and thus, the sense voltage becomes a value which is proportional to the output current (the output current of the source pads PDS1$a$ and PDS1$b$). Accordingly, even in the period until the gate voltage reaches the saturation voltage value after the elapse of the predetermined mask time MSK, the indirect monitoring of the current (IW) flowing to the power MOSFET 1 by the monitoring of the sense voltage can be more accurately performed while decreasing the error.

<Formation Position of Slit>

Next, a formation position of the slit SL1 will be described.

Figure 19:
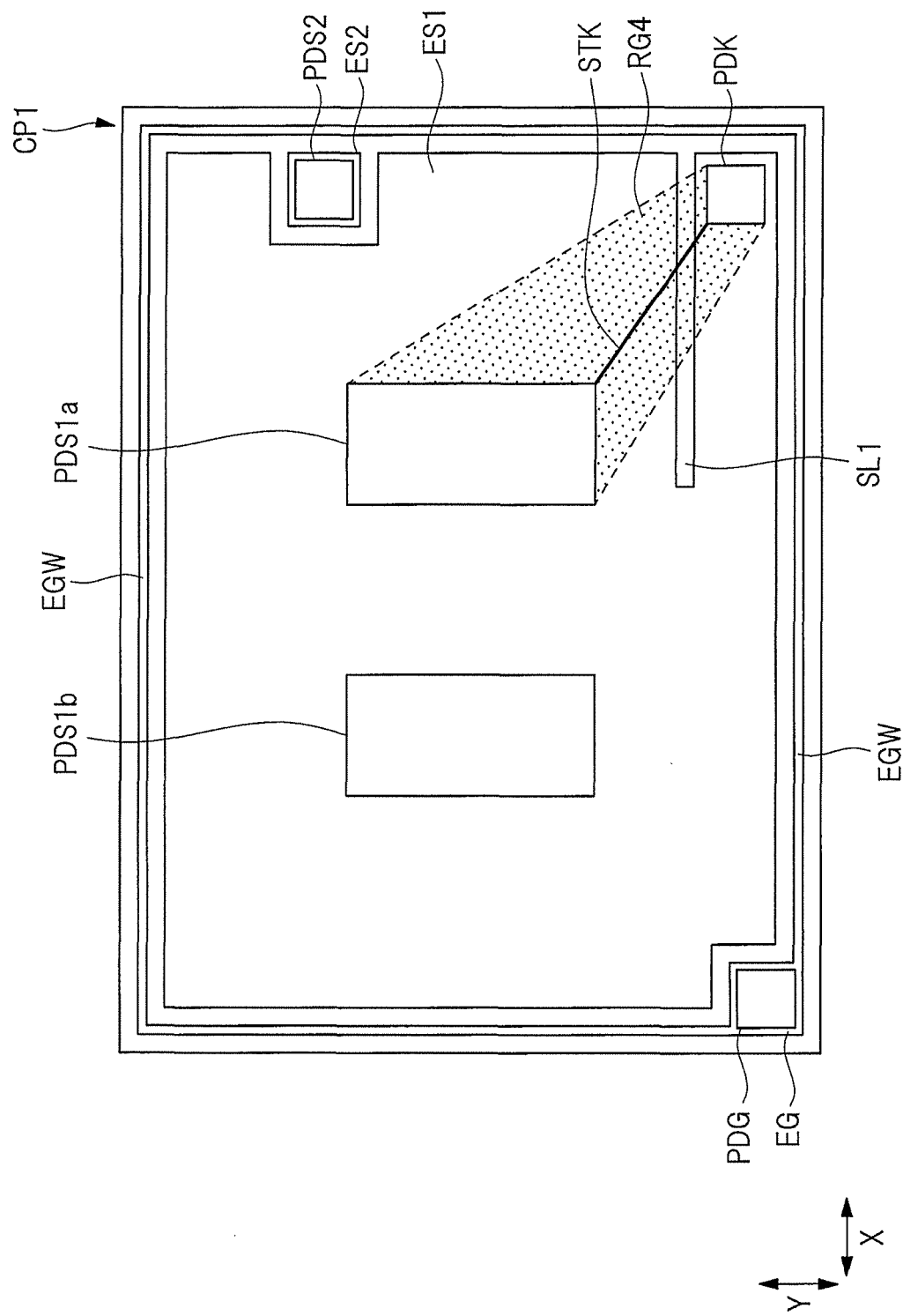
FIG. 19 is a plan view showing a chip layout of the semiconductor chip according to the embodiment.

FIG. 19 is a plan view showing a chip layout of the semiconductor chip CP1, and corresponds to FIGS. 3 and 16 described above. FIG. 19 also shows a planar layout of the metal layers (the gate electrode EG, the gate wiring EGW and the source electrodes ES1 and ES2) in the semiconductor chip CP1 in the same manner as FIGS. 3 and 16 described above. In FIG. 3 described above, the metal layers are shown with hatching, but the metal layers are shown without hatching in FIG. 19. In addition, each position of the bonding pads is shown with the dotted line in FIGS. 3 and 16 described above, but each position of the bonding pads (the gate pad PDG, the source pads PDS1$a$ and PDS1$b$, the source pad PDS2 and the Kelvin pad PDK) is shown with the solid line in FIG. 19. Also, FIG. 19 shows a region RG4 between the source pad PDS1$a$ and the Kelvin pad PDK seen in a plan view with dotted hatching. In addition, FIG. 19 shows a shortest path between the Kelvin pad PDK and the source pad PDS1$a$ with the bold line denoted by reference character STK. Note that the shortest path STK between the Kelvin pad PDK and the source pad PDS1$a$ is a path that links a portion of the Kelvin pad PDK closest to the source pad PDS1$a$ and a portion of the source pad PDS1$a$ closest to the Kelvin pad PDK by a straight line when seen in a plan view.

As described above, the slit SL1 is provided to generate the potential difference between the source pad PDS1$a$ and the Kelvin pad PDK when the gate voltage is high. Thus, it is necessary to form the slit SL1 so that the resistance of the current path between the source pad PDS1$a$ and the Kelvin pad PDK is increased in the case of providing the slit SL1 compared with the case of not providing the slit SL1. Accordingly, the slit SL1 is formed so as to inhibit (block or hinder) the current path between the source pad PDS1$a$ and the Kelvin pad PDK.

Specifically, at least a part of the slit SL1 is arranged between the source pad PDS1$a$ and the Kelvin pad PDK when seen in a plan view. Namely, at least a part of the slit SL1 is arranged inside the region RG4 shown with dotted hatching in FIG. 19 when seen in a plan view. Accordingly, the resistance of the current path between the source pad PDS1$a$ and the Kelvin pad PDK can be increased as compared to the case of not providing the slit SL1.

Namely, there is a possibility that the region RG4 between the source pad PDS1$a$ and the Kelvin pad PDK functions as the current path between the source pad PDS1$a$ and the Kelvin pad PDK. Thus, by providing the slit SL1 so that at least a part of the slit SL1 is arranged in the region RG4 between the source pad PDS1$a$ and the Kelvin pad PDK, it is possible to inhibit the current path between the source pad PDS1$a$ and the Kelvin pad PDK by the slit SL1. Accordingly, it is possible to increase the resistance of the current path between the source pad PDS1$a$ and the Kelvin pad PDK by providing the slit SL1, and to generate the potential difference between the source pad PDS1$a$ and the Kelvin pad PDK when the gate voltage is high, and thus, it is possible to suppress the dependence of the sense ratio with respect to the gate voltage as described above.

In addition, it is preferable that the shortest path (STK) between the source pad PDS1$a$ and the Kelvin pad PDK is blocked by the slit SL1 when seen in a plan view. Namely, it is preferable that the slit SL1 passes across the shortest path STK between the source pad PDS1$a$ and the Kelvin pad PDK in FIG. 19 when seen in a plan view. In other words, it is preferable that the slit SL1 intersects the shortest path STK between the source pad PDS1$a$ and the Kelvin pad PDK when seen in a plan view. In other words, it is preferable that a part of the slit SL1 overlaps the shortest path STK between the source pad PDS1$a$ and the Kelvin pad PDK when seen in a plan view. Accordingly, it is possible to more accurately increase the resistance of the current path between the source pad PDS1$a$ and the Kelvin pad PDK as compared to the case of not providing the slit SL1.

Namely, the shortest path STK between the source pad PDS1$a$ and the Kelvin pad PDK is most likely to function as the current path between the source pad PDS1$a$ and the Kelvin pad PDK. Therefore, by providing the slit SL1 so that the shortest path STK between the source pad PDS1$a$ and the Kelvin pad PDK is blocked by the slit SL1 when seen in a plan view, it is possible to more effectively inhibit the current path between the source pad PDS1$a$ and the Kelvin pad PDK by the slit SL1. Accordingly, the resistance of the current path between the source pad PDS1$a$ and the Kelvin pad PDK can be more accurately increased by providing the slit SL1, and the potential difference can be more accurately generated between the source pad PDS1$a$ and the Kelvin pad PDK when the gate voltage is high, so that it is possible to more accurately suppress the dependence of the sense ratio with respect to the gate voltage as described above.

In addition, it is more preferable that the slit SL1 is arranged closer to the Kelvin pad PDK than to the source pads PDS1a and PDS1b when seen in a plan view. Namely, it is more preferable that a distance (an interval or a minimum interval) between the slit SL1 and the Kelvin pad PDK is shorter than a distance (an interval or a minimum interval) between the slit SL1 and the source pad PDS1a and a distance (an interval or a minimum interval) between the slit SL1 and the source pad PDS1b. Accordingly, it is possible to increase the resistance of the current path between the source pad PDS1a and the Kelvin pad PDK while suppressing the area of the slit SL1.

Namely, the Kelvin pad PDK has a planar dimension (area) smaller than that of the source pads PDS1a and PDS1b. Thus, as can be seen from FIG. 19, a length of the slit SL1 required to inhibit the current path between the source pad PDS1a and the Kelvin pad PDK can be shortened in the case of forming the slit SL1 to be close to the Kelvin pad PDK than in the case of forming the slit SL1 to be close to the source pad PDS1a. Therefore, by arranging the slit SL1 to be closer to the Kelvin pad PDK than to the source pads PDS1a and PDS1b when seen in a plan view, the resistance of the current path between the source pad PDS1a and the Kelvin pad PDK can be increased while suppressing the area of the slit SL1. A decrease in the channel width (total channel width) of the power MOSFET 1 due to the presence of the slit SL1 can be suppressed by suppressing the area of the slit SL1. Accordingly, it is possible to suppress the ON-resistance (ON-voltage) of the power MOSFET 1.

In addition, there is a case in which a plurality of source pads (source pads of the power MOSFET 1) connected to the load LOD are present in the semiconductor chip CP1. In FIGS. 2 to 4 described above, the two source pads (source pads of the power MOSFET 1) connected to the load LOD, that is, the source pads PDS1a and PDS1b are provided. In such a case, it is preferable to arrange at least a part of the slit SL1 between a source pad (herein, the source pad PDS1a) which is the closest to the Kelvin pad PDK among the plurality of source pads (herein, the source pads PDS1a and PDS1b) connected to the load LOD and the Kelvin pad PDK. In addition, it is preferable to block a shortest path between the source pad closest to the Kelvin pad PDK among the plurality of source pads (herein, the source pads PDS1a and PDS1b) connected to the load LOD and the Kelvin pad PDK by the slit SL1. Accordingly, it is possible to efficiently increase the resistance of the current path between the plurality of source pads (herein, the source pads PDS1a and PDS1b) connected to the load LOD and the Kelvin pad PDK.

Namely, when the plurality of source pads connected to the load LOD are present, a path between the source pad (herein, the source pad PDS1a) closest to the Kelvin pad PDK and the Kelvin pad PDK becomes a main current path unless the slit SL1 is provided. Thus, it is preferable to provide the slit SL1 so as to inhibit the current path between the source pad (herein, the source pad PDS1a) closest to the Kelvin pad PDK among the plurality of source pads (herein, the source pads PDS1a and PDS1b) connected to the load LOD and the Kelvin pad PDK by the slit SL1. Accordingly, the resistance of the current path between the plurality of source pads (herein, the source pads PDS1a and PDS1b) connected to the load LOD and the Kelvin pad PDK can be efficiently increased.

In addition, it is also possible to block not only the shortest path between the source pad (PDS1a) closest to the Kelvin pad PDK among the plurality of source pads (PDS1a, PDS1b) connected to the load LOD and the Kelvin pad PDK but also a shortest path between the other source pad (PDS1b) and the Kelvin pad PDK by the slit SL1. Accordingly, it is possible to more reliably increase the resistance of the current path between the plurality of source pads (PDS1a, PDS1b) connected to the load LOD and the Kelvin pad PDK.

In addition, the processing of the slit SL1 becomes difficult if the width of the slit SL1 (width in a direction approximately perpendicular to the extending direction of the slit SL1) is too small, and the area of the slit SL1 increases and the channel width (total channel width) of the power MOSFET 1 decreases if the width is too large. From this viewpoint, it is preferable that the width of the slit SL1 is about 2 μm to 100 μm. Note that the width of the slit SL1 corresponds to a dimension (width) of the slit SL1 in the direction which is parallel to the main surface of the semiconductor substrate SB and approximately perpendicular to the extending direction of the slit SL1.

Second Embodiment

The second embodiment corresponds to a modified example of the above-described first embodiment.

Figure 20:
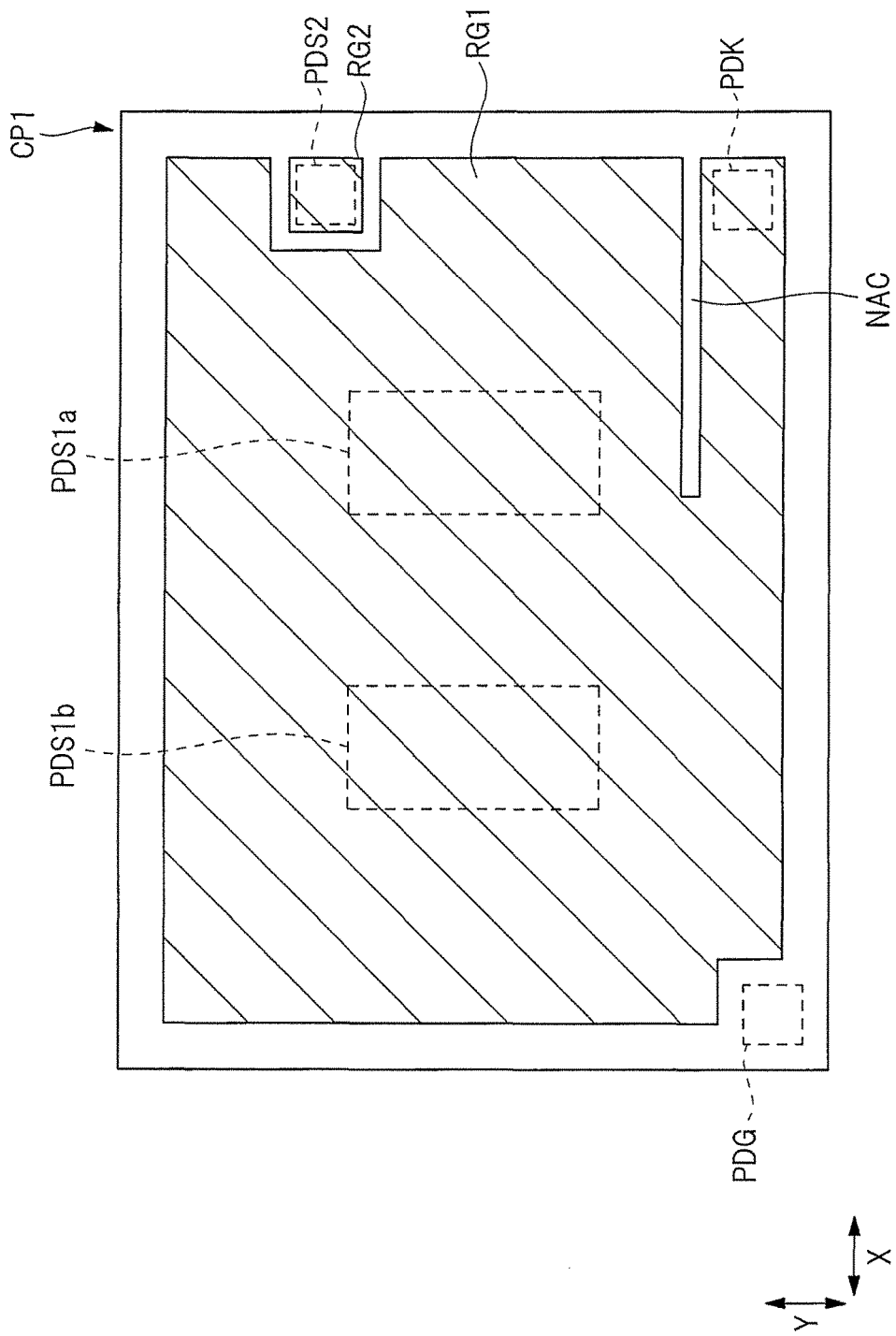
FIG. 20 is a plan view showing a chip layout of a semiconductor chip according to another embodiment.

FIG. 20 is a plan view showing a chip layout of the semiconductor chip CP1, and corresponds to FIG. 4 described above. Also in FIG. 20, the main MOS region RG1 and the sense MOS region RG2 in the semiconductor chip CP1 are shown with hatching, and each position of the bonding pads (the gate pad PDG, the source pads PDS1a and PDS1b, the source pad PDS2 and the Kelvin pad PDK) is shown with the dotted line like in FIG. 4 described above.

The semiconductor chip CP1 according to the second embodiment is different from the semiconductor chip CP1 according to the first embodiment described above in the following point.

A non-active region (NAC) is formed under the slit SL1 in the semiconductor chip CP1 according to the second embodiment. Namely, the power MOSFET 1 is formed of the plurality of unit transistor cells which are formed in the main MOS region RG1 of the main surface of the semiconductor substrate SB and are connected in parallel to each other, but the unit transistor cell is not formed under the slit SL1 in the main surface of the semiconductor substrate SB described above in the semiconductor chip CP1 according to the second embodiment. For example, the above-described p-type semiconductor region (p-type body region) PR1 is formed over substantially the entire main surface of the semiconductor substrate SB described above under the slit SL1, and the $n^+$ semiconductor region NR for source is not formed.

Meanwhile, as can be seen from FIG. 4 described above, the portion under the slit SL1 also forms a part of the main MOS region RG1 (active region) in the semiconductor chip CP1 according to the first embodiment described above, and the unit transistor cell is formed also under the slit SL1 in the main surface of the semiconductor substrate SB described above.

Namely, whether the unit transistor cell is formed or is not formed under the slit SL1 in the main surface of the semiconductor substrate SB is the difference between the semiconductor chip CP1 according to the second embodiment and the semiconductor chip CP1 according to the first embodiment described above. The other configuration of the semiconductor chip CP1 according to the second embodiment is substantially the same as the semiconductor chip CP1 according to the first embodiment described above, and thus, the repetitive description thereof will be omitted herein.

Since it is possible to deal with the case in which the unit transistor cell is formed also under the slit SL1 in the main surface of the semiconductor substrate SB like the above-described first embodiment by the specification change of providing the slit SL1 in the source electrode ES1, the design of the semiconductor chip is easy and versatility is high. Note that it is difficult to connect the source of the unit transistor cell arranged under the slit SL1 to the source electrode ES1. Therefore, the unit transistor cell arranged under the slit SL1 can be put into a floating state without being used as the unit transistor cell to form the power MOSFET 1.

On the other hand, in the case in which the unit transistor cell is not formed under the slit SL1 in the main surface of the semiconductor substrate SB like the second embodiment, it is possible to prevent the unit transistor cell in the floating state from being formed under the slit SL1, and this is advantageous from a viewpoint of improving tolerance with respect to electrostatic breakdown as much as possible.

Note that the technical idea of the second embodiment can be applied to third to ninth embodiments to be described later.

Third Embodiment

The third embodiment corresponds to a modified example of the above-described first embodiment.

Figure 21:
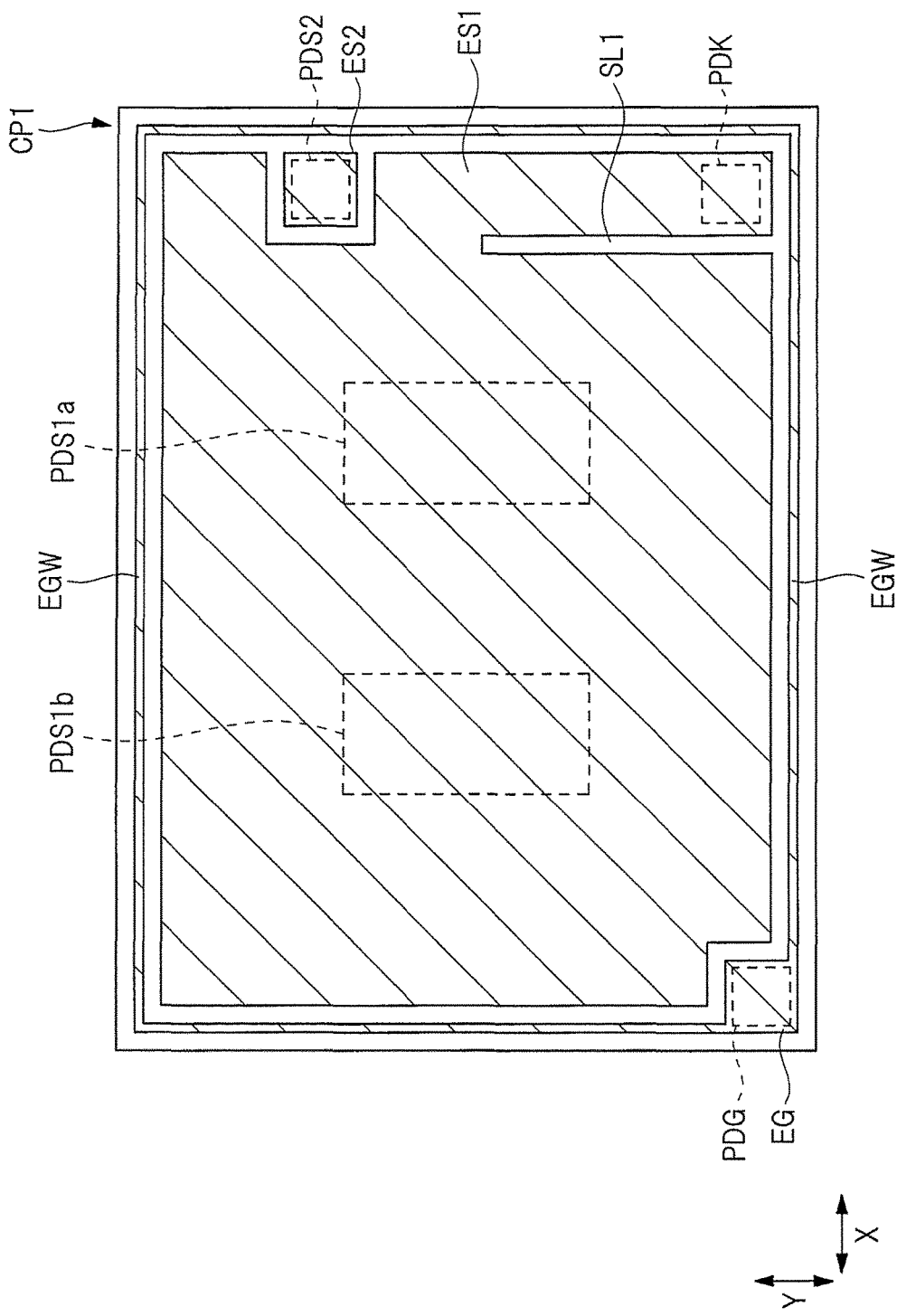
FIG. 21 is a plan view showing a chip layout of a semiconductor chip according to another embodiment.

FIG. 21 is a plan view showing a chip layout of the semiconductor chip CP1 and corresponds to FIG. 3 described above. Also in FIG. 21, the metal layers (the gate electrode EG, the gate wiring EGW and the source electrodes ES1 and ES2) in the semiconductor chip CP1 are shown with hatching, and each position of the bonding pads (the gate pad PDG, the source pads PDS1a and PDS1b, the source pad PDS2 and the Kelvin pad PDK) is shown with the dotted line like in FIG. 3 described above.

The slit SL1 extends in the X-direction in the above-described first embodiment as shown in FIG. 3 described above, but the slit SL1 extends in the Y-direction in the third embodiment as shown in FIG. 21.

Also in the third embodiment, at least a part of the slit SL1 is arranged between the source pad PDS1a and the Kelvin pad PDK when seen in a plan view as shown in FIG. 21. Accordingly, the resistance of the current path between the source pad PDS1a and the Kelvin pad PDK can be increased as compared to the case of not providing the slit SL1. In addition, since the shortest path between the source pad PDS1a and the Kelvin pad PDK is blocked by the slit SL1 when seen in a plan view, it is possible to more accurately increase the resistance of the current path between the source pad PDS1a and the Kelvin pad PDK. In addition, since the slit SL1 is arranged closer to the Kelvin pad PDK than to the source pads PDS1a and PDS1b when seen in a plan view, it is possible to increase the resistance of the current path between the source pad PDS1a and the Kelvin pad PDK while suppressing the area of the slit SL1.

Fourth Embodiment

The fourth embodiment corresponds to a modified example of the above-described first embodiment.

Figure 22:
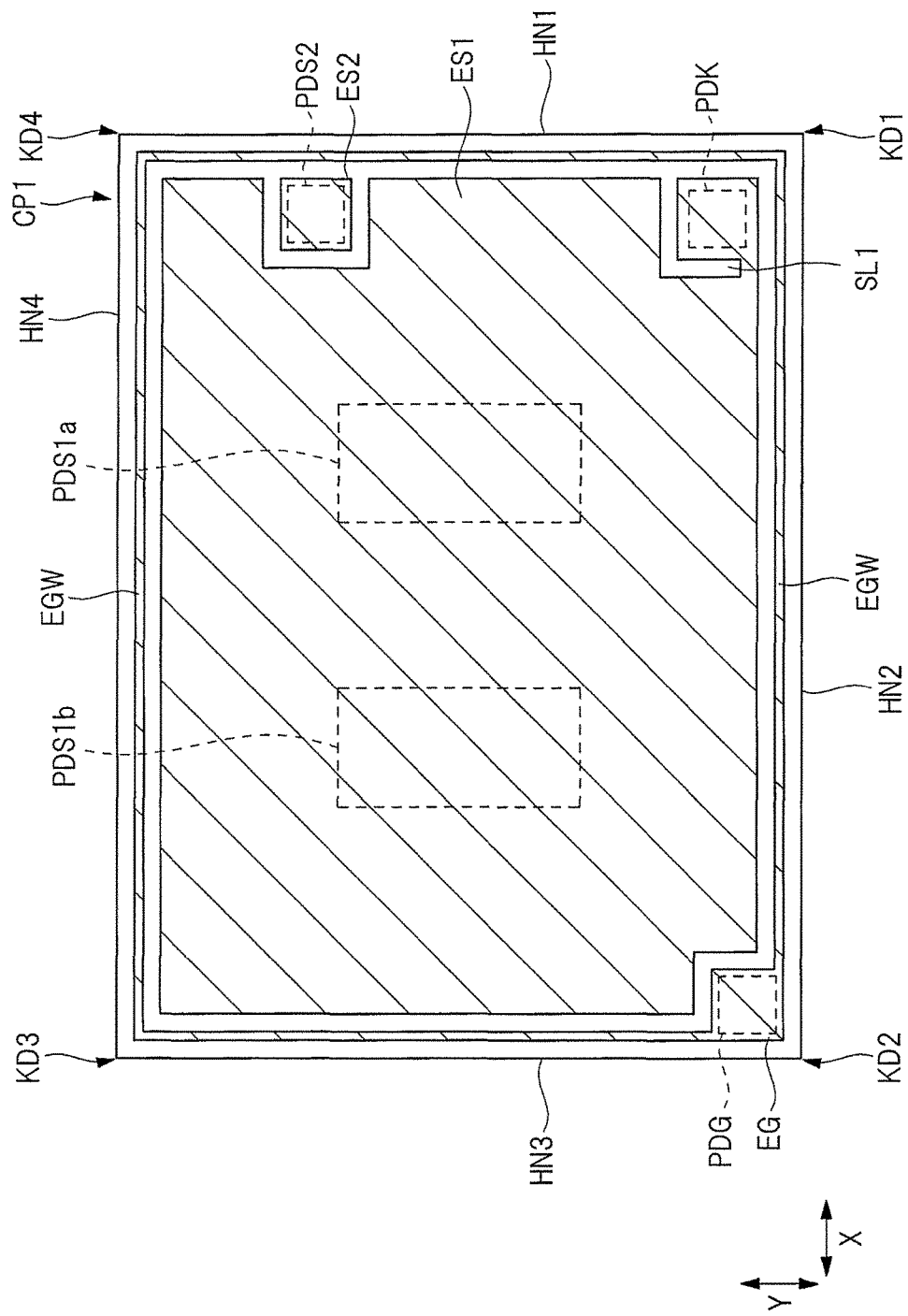
FIG. 22 is a plan view showing a chip layout of a semiconductor chip according to another embodiment.

FIG. 22 is a plan view showing a chip layout of the semiconductor chip CP1 and corresponds to FIG. 3 described above. Also in FIG. 22, the metal layers (the gate electrode EG, the gate wiring EGW and the source electrodes ES1 and ES2) in the semiconductor chip CP1 are shown with hatching, and each position of the bonding pads (the gate pad PDG, the source pads PDS1a and PDS1b, the source pad PDS2 and the Kelvin pad PDK) is shown with the dotted line like in FIG. 3 described above.

The slit SL1 extends in the X-direction in the above-described first embodiment as shown in FIG. 3 described above, and the slit SL1 extends in the Y-direction in the above-described third embodiment as shown in FIG. 21.

Meanwhile, in the fourth embodiment, as shown in FIG. 22, the Kelvin pad PDK is arranged closer to a corner KD1 than to other corners KD2, KD3 and KD4 other than the corner KD1 of the semiconductor chip CP1, and the slit SL1 is formed so that the Kelvin pad PDK is surrounded by two sides (HN1 and HN2) forming the corner KD1 of the semiconductor chip CP1 and the slit SL1 when seen in a plan view.

Namely, in the case of FIGS. 2 to 4, the Kelvin pad PDK is arranged near the corner KD1 among the four corners KD1, KD2, KD3 and KD4 of the main surface of the semiconductor chip CP1 when seen in a plan view. Further, the Kelvin pad PDK is in the state of being surrounded by the two sides HN1 and HN2 which form the corner KD1 among the four sides HN1, HN2, HN3 and HN4 of the semiconductor chip CP1 and the slit SL1 extending in the X-direction and the Y-direction along the Kelvin pad PDK when seen in a plan view. However, the Kelvin pad PDK is not completely surrounded by the two sides (HN1 and HN2) of the semiconductor chip CP1 and the slit SL1, and the source electrode ES1 constituting the Kelvin pad PDK and the source electrode ES1 constituting the source pad PDS1a are linked to each other without being separated from each other. Therefore, it is possible to secure a conductive path between the Kelvin pad PDK and the source pad PDS1a.

In the fourth embodiment, since the slit SL1 is formed so that the Kelvin pad PDK is surrounded by the two sides (HN1 and HN2) of the semiconductor chip CP1 and the slit SL1, it is possible to efficiently increase a resistance of a current path between the source pad PDS1a and the Kelvin pad PDK while suppressing a length (area) of the slit SL1. Therefore, the decrease of a channel width (total channel width) of the power MOSFET 1 due to the presence of the slit SL1 can be suppressed by suppressing the length (area) of the slit SL1, and the ON-resistance (ON-voltage) of the power MOSFET 1 can be suppressed.

Fifth Embodiment

The fifth embodiment corresponds to a modified example of the above-described first embodiment.

Figure 23:
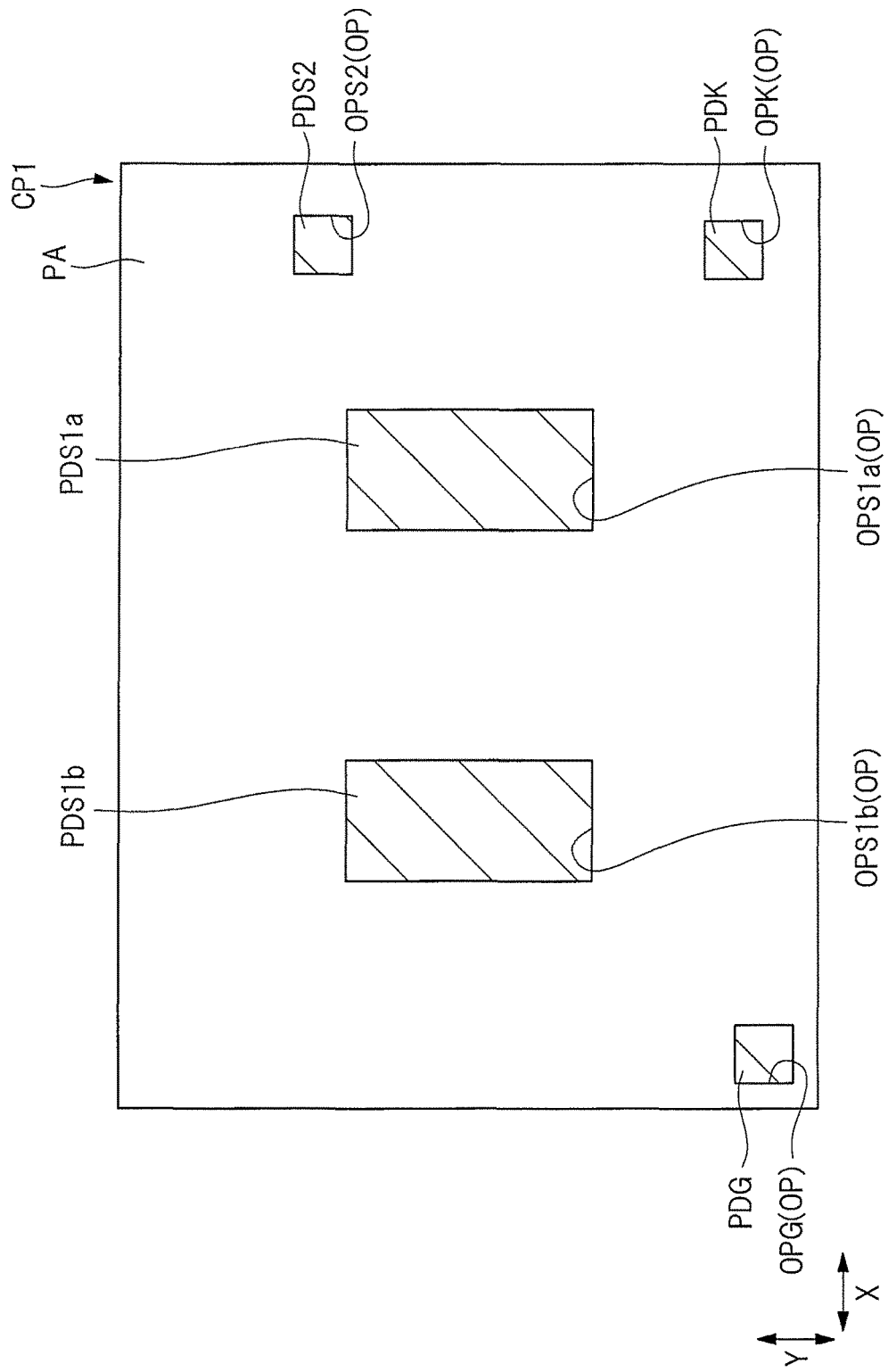
FIG. 23 is a plan view showing a chip layout of a semiconductor chip according to another embodiment.
Figure 24:
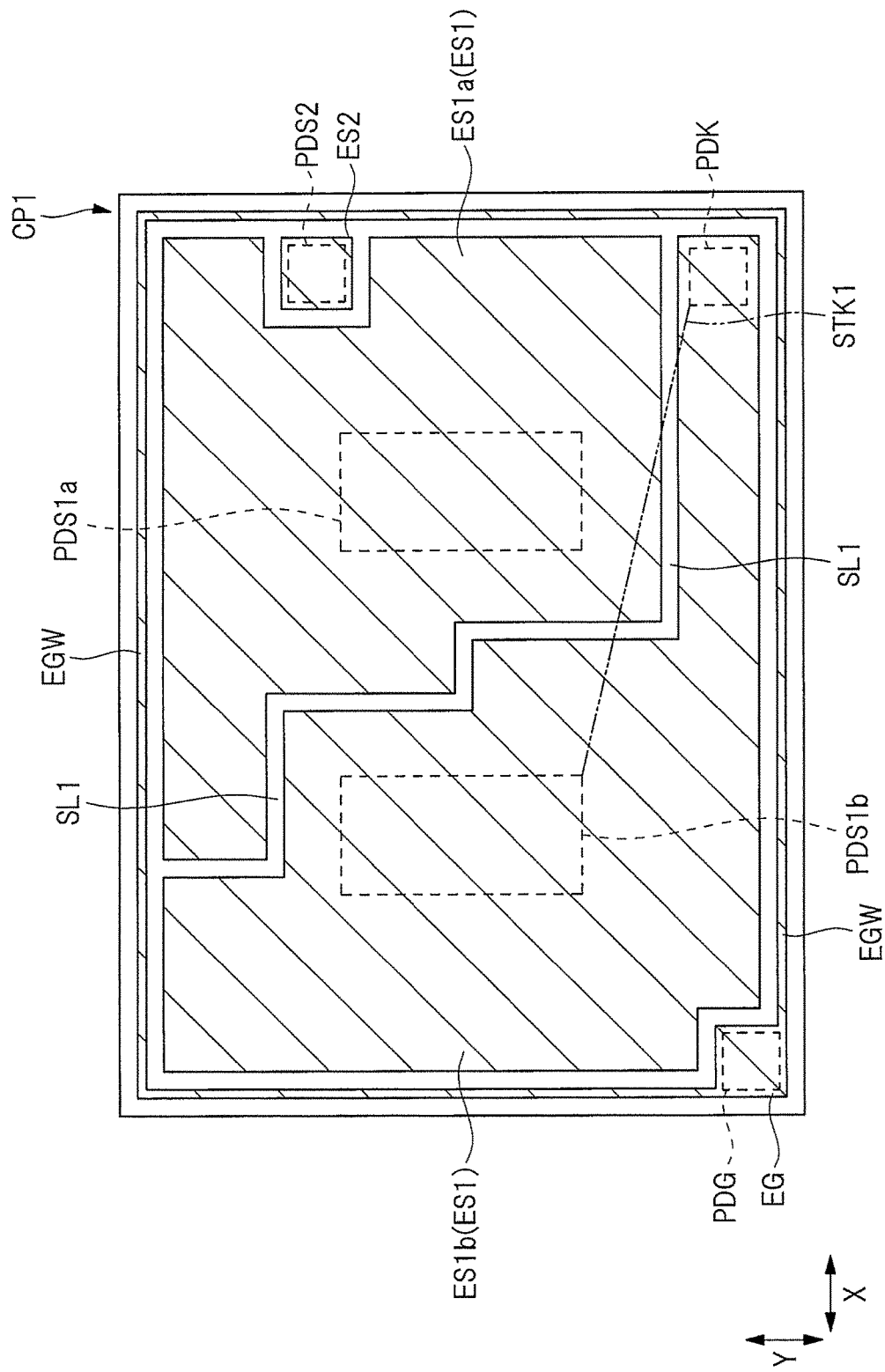
FIG. 24 is a plan view showing a chip layout of a semiconductor chip according to another embodiment.
Figure 25:
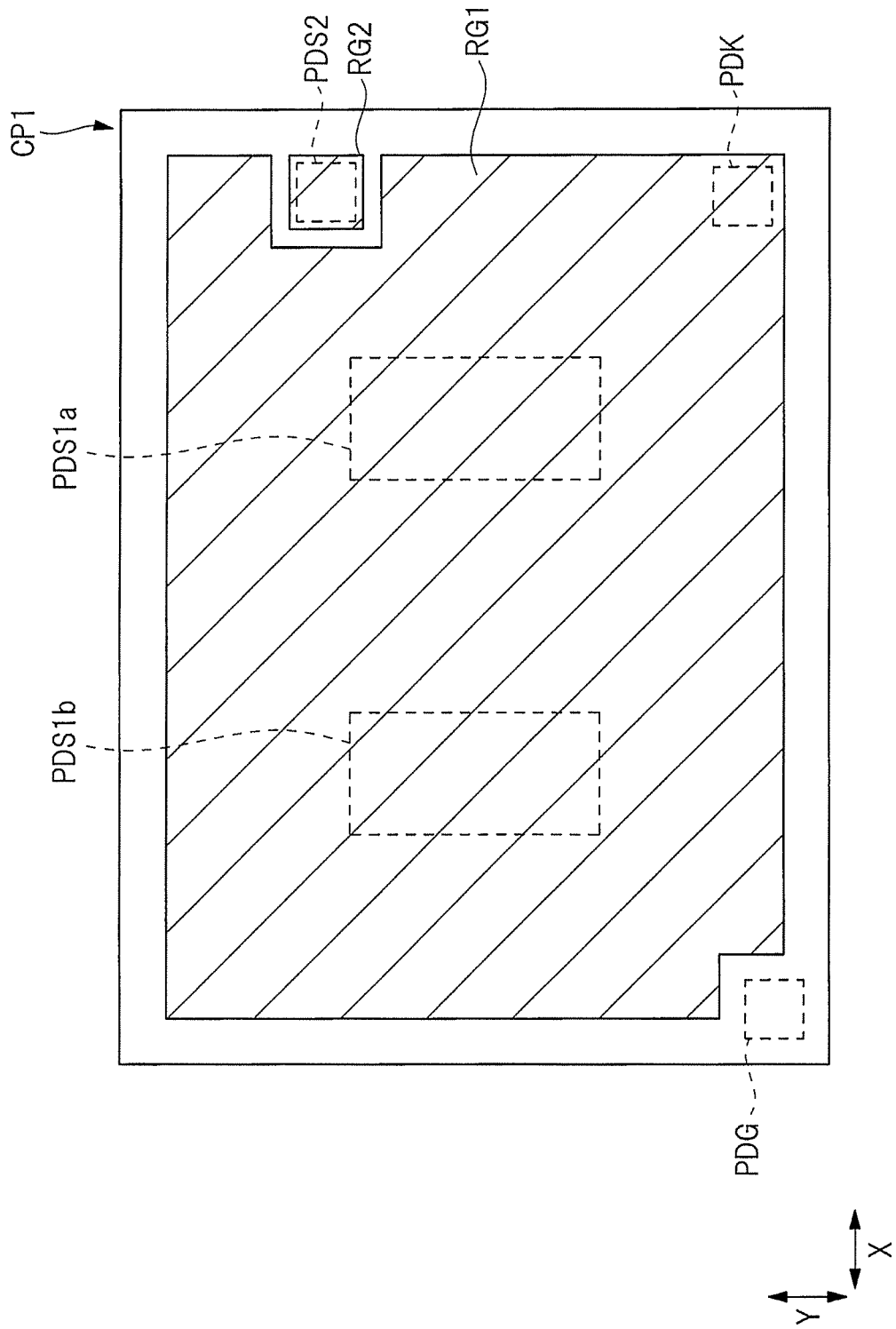
FIG. 25 is a plan view showing a chip layout of a semiconductor chip according to another embodiment.

FIGS. 23 to 25 are plan views showing a chip layout of the semiconductor chip CP1 and correspond to FIGS. 2 to 4 described above, respectively. Note that a shortest path between the Kelvin pad PDK and the source pad PDS1b is shown with the two-dot chain line denoted by reference character STK1 in FIG. 24.

In the fifth embodiment, the source electrode ES1 is divided into two by the slit SL1 provided in the source electrode ES1 as shown in FIG. 24. Namely, the source electrode ES1 is divided into a source electrode ES1a and a source electrode ES1b by the slit SL1. The source electrode ES1a and the source electrode ES1b are isolated from each other, and the slit SL1 is interposed therebetween.

In the case of FIGS. 23 to 25, the source opening portion OPS1*a* is arranged on the source electrode ES1*a*, and the source pad PDS1*a* is formed of the source electrode ES1*a* exposed from the source opening portion OPS1*a*. In addition, the source opening portion OPS1*b* is arranged on the source electrode ES1*b*, and the source pad PDS1*b* is formed of the source electrode ES1*b* exposed from the source opening portion OPS1*b*. In addition, the Kelvin opening portion OPK is arranged on the source electrode ES1*b*, and the Kelvin pad PDK is formed of the source electrode ES1*b* exposed from the Kelvin opening portion OPK.

In the case of FIGS. 23 to 25, since the source electrode ES1 is divided into the source electrode ES1*a* and the source electrode ES1*b* by the slit SL1, the Kelvin pad PDK is formed of the source electrode ES1*b*, and the source pad PDS1*a* is formed of the source electrode ES1*a*, a conductive path through a source electrode is not formed between the Kelvin pad PDK and the source pad PDS1*a*.

Since the Kelvin pad PDK is formed of the source electrode ES1*b* and the source pad PDS1*b* is also formed of the source electrode ES1*b*, a conductive path through the source electrode ES1*b* is formed between the Kelvin pad PDK and the source pad PDS1*b*. Therefore, even in the case where the source electrode ES1 is divided into the source electrode ES1*a* and the source electrode ES1*b* by the slit SL1, it is preferable to form the slit SL1 so that a potential difference is generated between the source pad PDS1*b* and the Kelvin pad PDK when the gate voltage is high and the resistance of the current path between the source pad PDS1*b* and the Kelvin pad PDK is increased.

Therefore, also in the fifth embodiment, at least a part of the slit SL1 is arranged between the source pad PDS1*b* and the Kelvin pad PDK when seen in a plan view as shown in FIG. 24. Accordingly, it is possible to increase the resistance of the current path between the source pad PDS1*b* and the Kelvin pad PDK. In addition, since the shortest path STK1 between the source pad PDS1*b* and the Kelvin pad PDK is blocked by the slit SL1 when seen in a plan view, it is possible to more accurately increase the resistance of the current path between the source pad PDS1*b* and the Kelvin pad PDK.

In addition, since the source electrode ES1*a* constituting the source pad PDS1*a* and the source electrode ES1*b* constituting the source pad PDS1*b* are isolated by the slit SL1, it becomes easy to detect the disconnection of the above-described wire WA connected to each of the source pads PDS1*a* and PDS1*b*.

Sixth Embodiment

Figure 26:
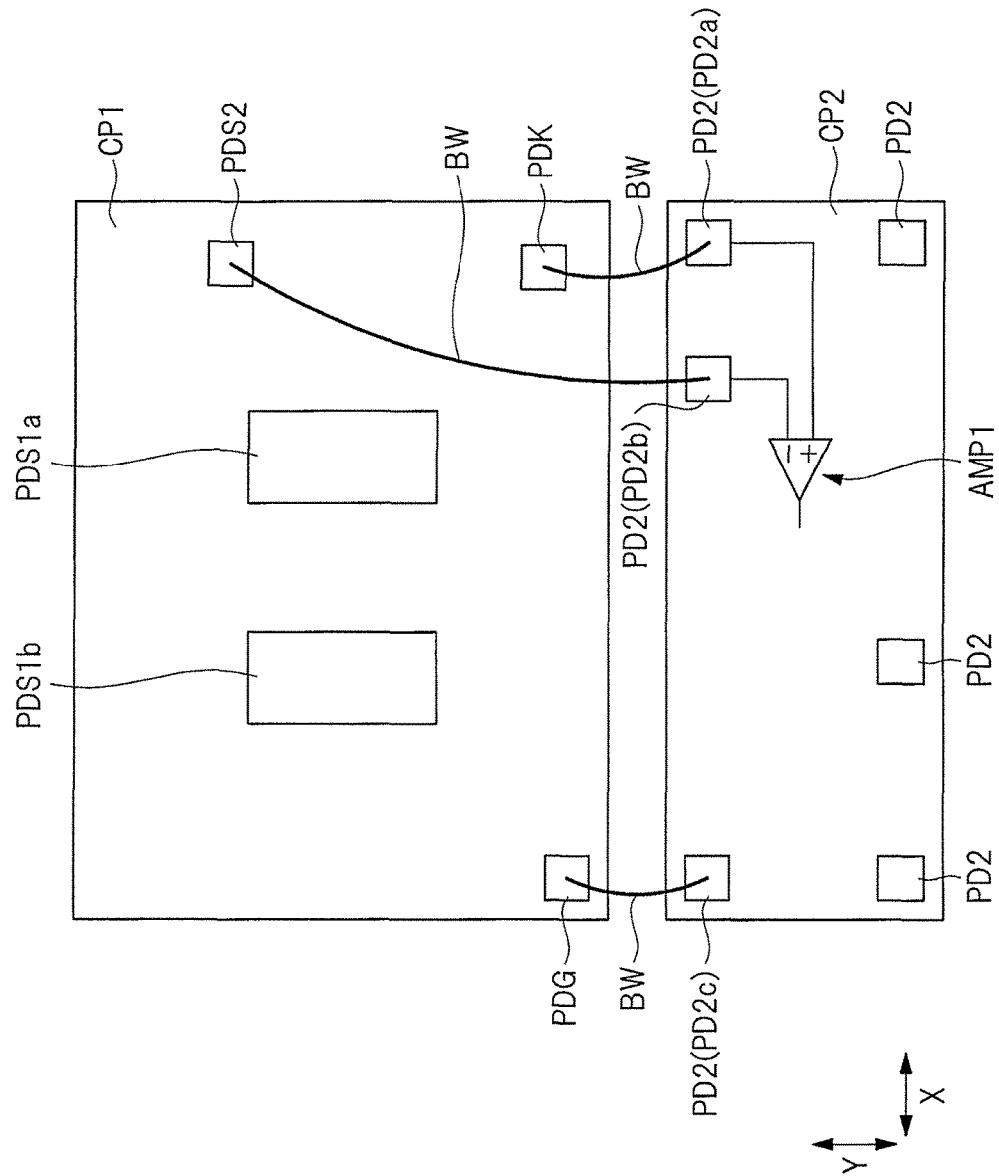
FIG. 26 is a plan view showing a connection structure between semiconductor chips.

In the sixth embodiment, a connection example between the semiconductor chip CP1 according to any one of the above-described first to fifth embodiments and another semiconductor chip CP2 will be described. FIG. 26 is a plan view showing a connection structure between the semiconductor chip CP1 and the semiconductor chip CP2.

The semiconductor chip CP1 shown in FIG. 26 corresponds to the semiconductor chip CP1 according to any one of the above-described first to fifth embodiments. A part or a whole of the above-described current detection circuit unit DKC and the above-described driver circuit DR are incorporated in the semiconductor chip CP2 shown in FIG. 26. At least the operational amplifier AMP1 of the above-described current detection circuit unit DKC is incorporated in the semiconductor chip CP2. In addition, a part or a whole of the above-described control circuit unit CLC may be further incorporated in the semiconductor chip CP2.

As shown in FIG. 26, the semiconductor chip CP2 has a plurality of pads (pad electrodes) PD2 including pads PD2*a*, PD2*b* and PD2*c*. The Kelvin pad PDK of the semiconductor chip CP1 is electrically connected to the pad PD2*a* of the semiconductor chip CP2 via a conductive connection member BW, and the source pad PDS2 of the semiconductor chip CP1 is electrically connected to the pad PD2*b* of the semiconductor chip CP2 via the conductive connection member BW. The gate pad PDG of the semiconductor chip CP1 is electrically connected to the pad PD2*c* of the semiconductor chip CP2 via the conductive connection member BW. The connection member BW is, for example, a bonding wire. The source pads PDS1*a* and PDS1*b* of the semiconductor chip CP1 are electrically connected to the above-described load LOD, and thus are not connected to the semiconductor chip CP2.

In the semiconductor chip CP2, the pad PD2*a* is electrically connected to one of the two input nodes of the operational amplifier AMP1 formed in the semiconductor chip CP2 via an internal wiring of the semiconductor chip CP2, and the pad PD2*b* is electrically connected to the other of the two input nodes of the operational amplifier AMP1 via an internal wiring of the semiconductor chip CP2. In addition, the pad PD2*c* is electrically connected to the driver circuit DR formed in the semiconductor chip CP2 via an internal wiring of the semiconductor chip CP2.

Therefore, the Kelvin pad PDK of the semiconductor chip CP1 is electrically connected to one input node of the operational amplifier AMP1 via the connection member BW, the pad PD2*a* of the semiconductor chip CP2 and the internal wiring of the semiconductor chip CP2. In addition, the source pad PDS2 of the semiconductor chip CP1 is electrically connected to the other input node of the operational amplifier AMP1 via the connection member BW, the pad PD2*b* of the semiconductor chip CP2 and the internal wiring of the semiconductor chip CP2. Accordingly, it is possible to detect the current of the sense MOSFET 2 while controlling a potential of the Kelvin pad PDK of the semiconductor chip CP1 and a potential of the source pad PDS2 of the semiconductor chip CP1 to be equal to each other by the above-described current detection circuit unit DKC including the operational amplifier AMP1.

Seventh Embodiment

FIGS. 27 to 30 are plan views showing a chip layout of the semiconductor chip CP1 according to the seventh embodiment and correspond to FIGS. 2 to 4 and 19, respectively.

Figure 27:
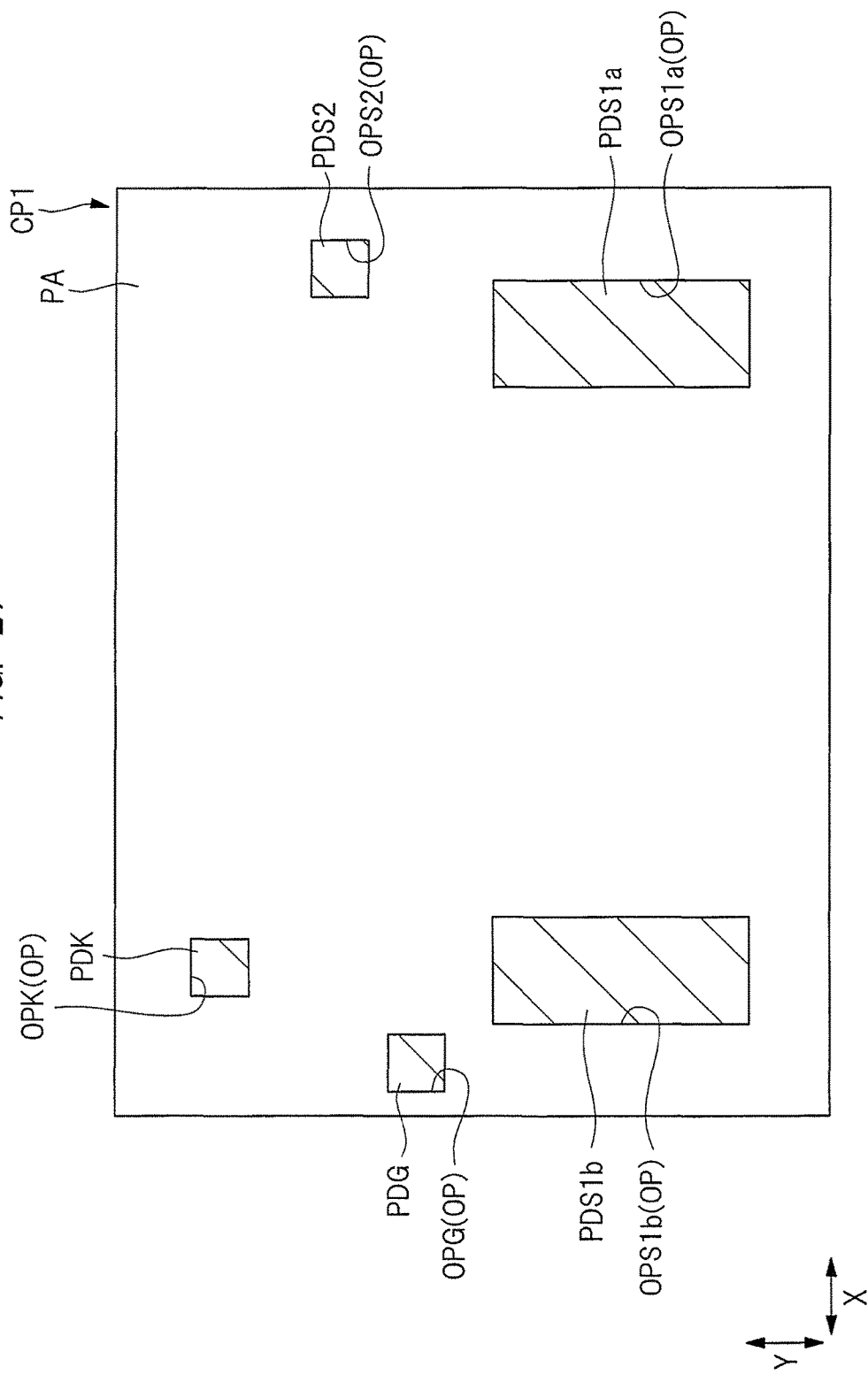
FIG. 27 is a plan view showing a chip layout of a semiconductor chip according to another embodiment.
Figure 28:
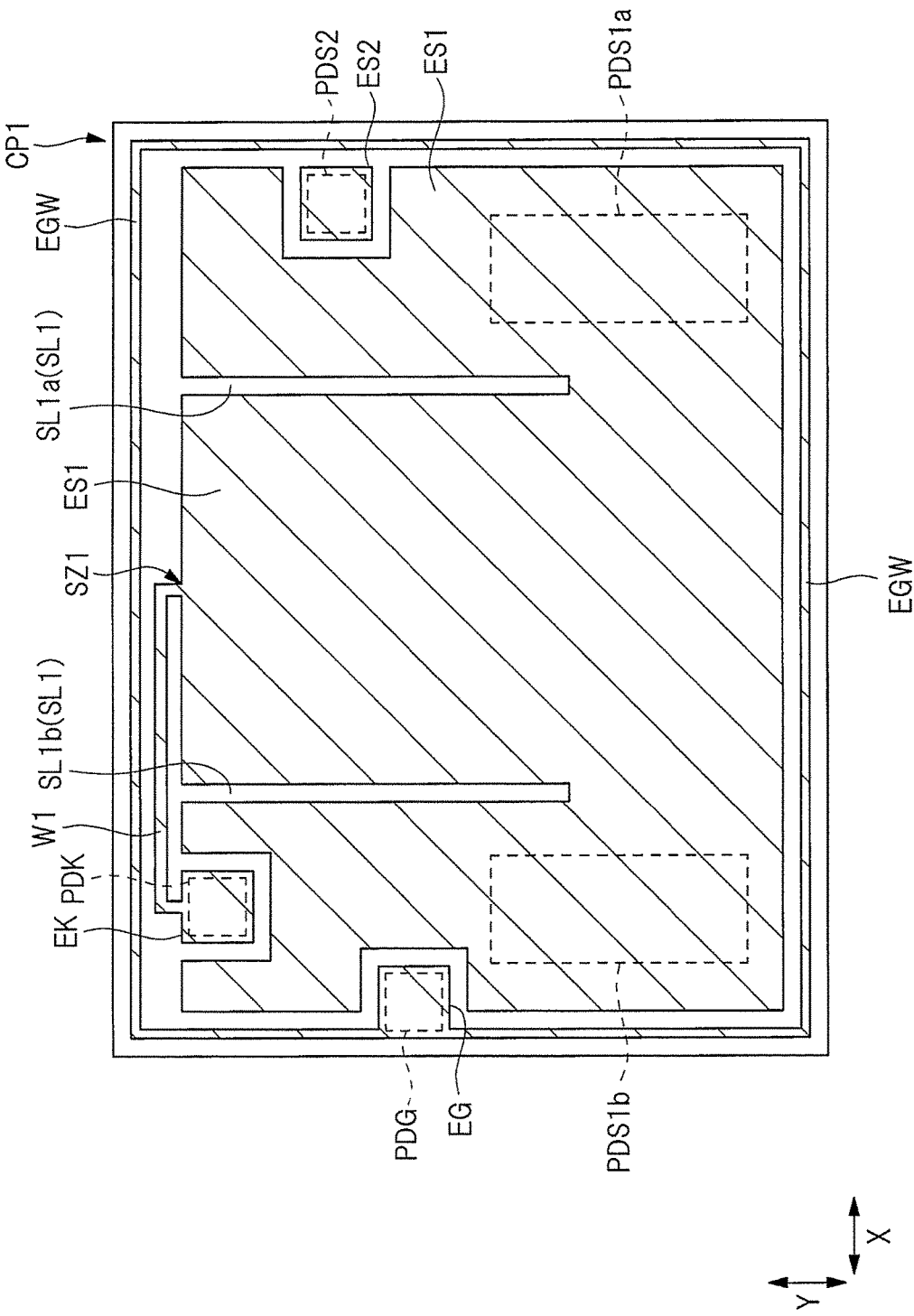
FIG. 28 is a plan view showing a chip layout of a semiconductor chip according to another embodiment.
Figure 29:
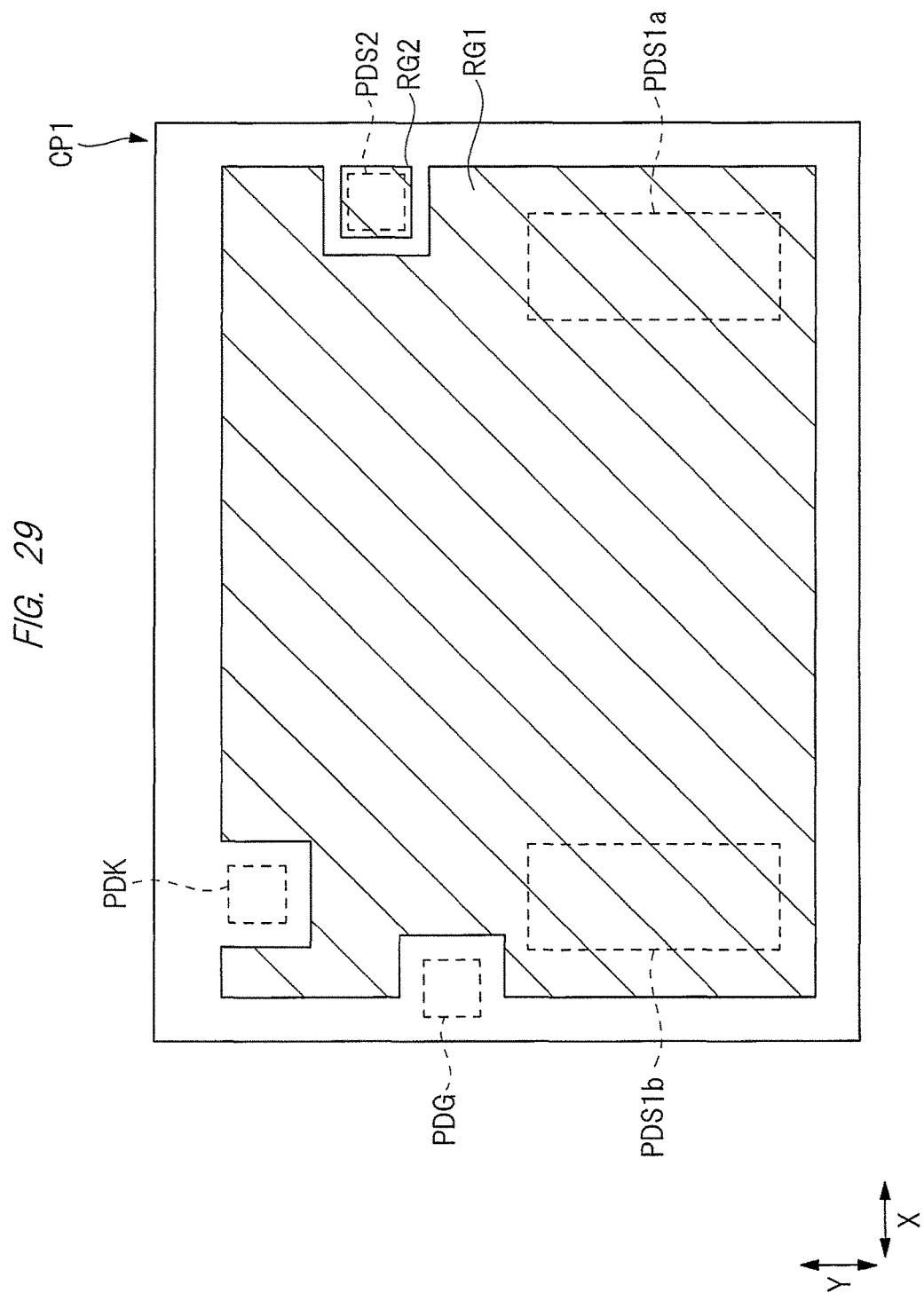
FIG. 29 is a plan view showing a chip layout of a semiconductor chip according to another embodiment.
Figure 30:
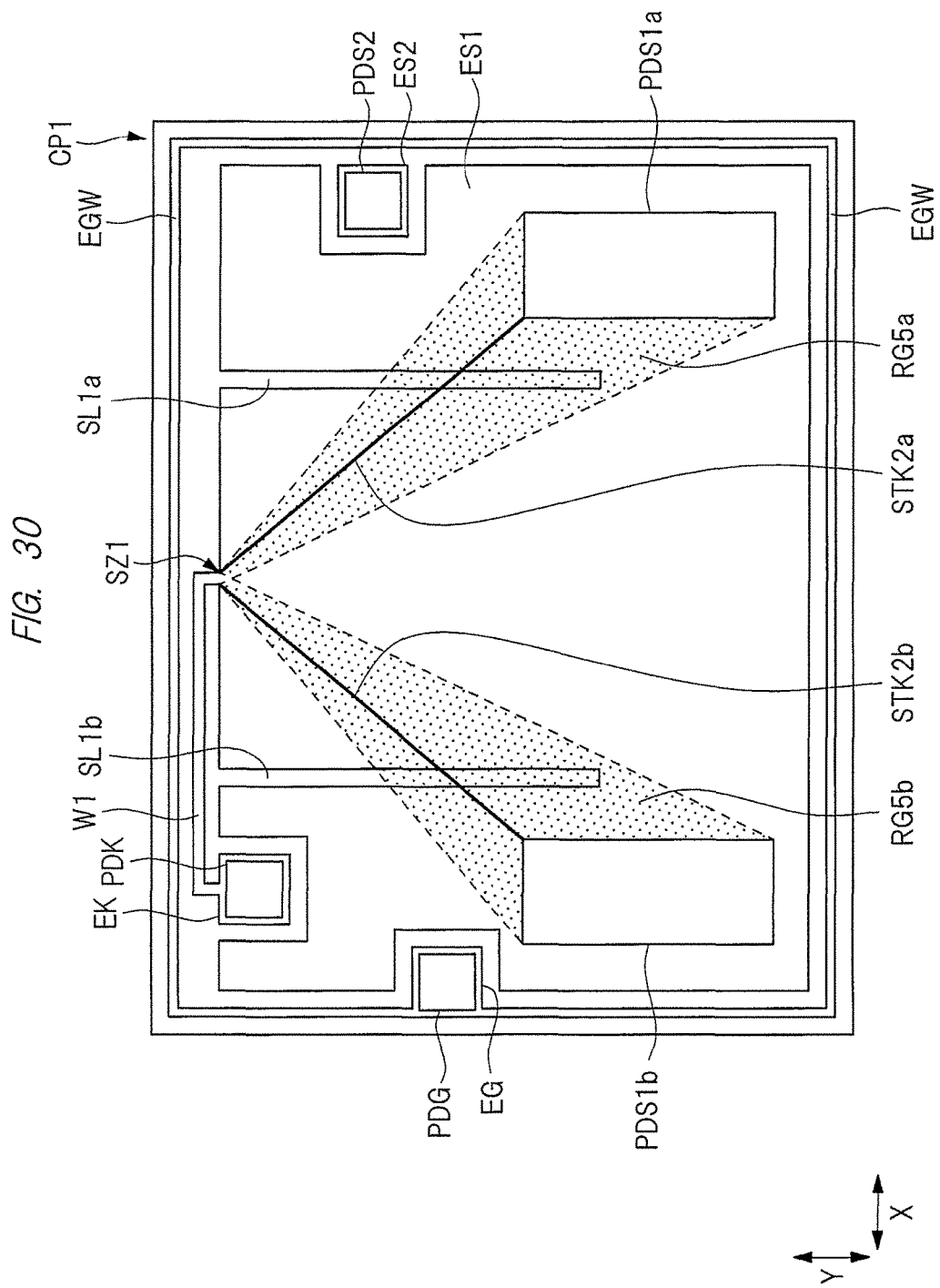
FIG. 30 is a plan view showing a chip layout of a semiconductor chip according to another embodiment.

Also in FIG. 27, the bonding pads (the gate pad PDG, the source pads PDS1*a* and PDS1*b*, the source pad PDS2 and the Kelvin pad PDK) are shown with hatching like in FIG. 2 described above. Further, also in FIG. 28, the metal layers (the gate electrode EG, the gate wiring EGW, the source electrodes ES1 and ES2 and a wiring W1) in the semiconductor chip CP1 are shown with hatching, and further, each position of the bonding pads (the gate pad PDG, the source pads PDS1*a* and PDS1*b*, the source pad PDS2 and the Kelvin pad PDK) is shown with the dotted line like in FIG. 3 described above. In addition, also in FIG. 29, the main MOS region RG1 and the sense MOS region RG2 in the semiconductor chip CP1 are shown with hatching, and further, each position of the bonding pads (the gate pad PDG, the source pads PDS1*a* and PDS1*b*, the source pad PDS2 and the Kelvin pad PDK) is shown with the dotted line like in FIG. 4 described above. In addition, also in FIG. 30, a planar layout of the metal layers (the gate electrode EG, the gate wiring EGW, the source electrodes ES1 and ES2 and the wiring W1) in the semiconductor chip CP1 is shown, and further, a region RG5a between the source pad PDS1a and a connection portion SZ1 and a region RG5b between the source pad PDS1b and the connection portion SZ1 when seen in a plan view are shown with dotted hatching like in FIG. 19 described above. Also, in FIG. 30, a shortest path between the source pad PDS1a and the connection portion SZ1 is shown with the bold line denoted by reference character STK2a, and a shortest path between the source pad PDS1b and the connection portion SZ1 is shown with the bold line denoted by reference character STK2b.

In the case of the first to sixth embodiments described above, the Kelvin pad PDK is formed of the source electrode ES1, and thus, the Kelvin pad PDK is arranged over the main MOS region RG1. Namely, the Kelvin pad PDK is arranged at the position enclosed by the main MOS region RG1 when seen in a plan view.

Meanwhile, in the case of the seventh embodiment, the Kelvin pad PDK is not arranged over the main MOS region RG1, but the Kelvin pad PDK is arranged at a position different from the main MOS region RG1 when seen in a plan view. Namely, the Kelvin pad PDK does not overlap the main MOS region RG1 when seen in a plan view. Therefore, the Kelvin pad PDK is formed of an electrode EK for forming the Kelvin pad (a Kelvin electrode or a source electrode) instead of the source electrode ES1. The electrode EK is electrically connected to the source electrode ES1 via the wiring W1.

Specifically, in the seventh embodiment, the electrode EK for forming the Kelvin pad PDK is formed at a planar position which is different from the main MOS region RG1 and the sense MOS region RG2, the Kelvin opening portion OPK is provided at a position to be enclosed by the electrode EK when seen in a plan view, and the Kelvin pad PDK is formed of the electrode EK exposed from the Kelvin opening portion OPK. Further, the Kelvin pad PDK is electrically connected to the source electrode ES1 via the electrode EK and the wiring W1 by linking the electrode EK and the source electrode ES1 by the wiring (connection wiring) W1. The electrode EK and the wiring W1 are integrally formed with the source electrode ES1, and the wiring W1 is interposed between the electrode EK and the source electrode ES1. A width of the wiring W1 is smaller than a width of the electrode EK. The electrode EK and the wiring W1 are formed in the same layer as the source electrode ES1, the source electrode ES2, the gate electrode EG and the gate wiring EGW. Namely, the gate electrode EG, the gate wiring EGW, the source electrode ES1, the source electrode ES2, the electrode EK and the wiring W1 are formed by patterning the common conductor film (CD).

In addition, also in the case of the seventh embodiment, the slit SL1 is provided in the source electrode ES1, and the slit SL1 has the same function as that in the above-described first to sixth embodiments. Namely, a resistance of a current path between the Kelvin pad PDK and the source pads PDS1a and PDS1b is increased by forming the slit SL1, and thus, it is possible to generate a potential difference between the source pads PDS1a and PDS1b and the Kelvin pad PDK when a gate voltage is high. Accordingly, it is possible to suppress the dependence of a sense ratio with respect to the gate voltage as described in the first embodiment above. Namely, the effect obtained by providing the slit SL1 in the seventh embodiment is the same as that described in the first embodiment above.

However, a concept regarding a formation position of the slit SL1 in the seventh embodiment is slightly different from that of the above-described first embodiment.

Namely, in the seventh embodiment, the source electrode ES1 is arranged over the main MOS region RG1, and the electrode EK and the wiring W1 are not arranged over the main MOS region RG1, but are arranged at the position different from the main MOS region RG1 when seen in a plan view. Therefore, the source electrode ES1 serves as a path of a current flowing to the power MOSFET 1 formed in the main MOS region RG1, but the electrode EK and the wiring W1 do not serve as the path of the current flowing to the power MOSFET 1 formed in the main MOS region RG1.

Therefore, in the seventh embodiment, the slit SL1 is formed so that a resistance of the current path between the source pads PDS1a and PDS1b and the connection portion SZ1 increases in the case of providing the slit SL1 as compared to the case of not providing the slit SL1. Herein, the connection portion SZ1 is a connection portion (connection point) between the wiring W1 and the source electrode ES1. The resistance of the current path between the connection portion SZ1 between the wiring W1 and the source electrode ES1 and the source pads PDS1a and PDS1b is increased by providing the slit SL1, so that potential difference is generated between the source pads PDS1a and PDS1b and the connection portion SZ1 when the gate voltage is high, thereby generating potential difference between the source pads PDS1a and PDS1b and the Kelvin pad PDK. Accordingly, it is possible to suppress the dependence of a sense ratio with respect to the gate voltage as described in the first embodiment above.

Thus, in the case of the seventh embodiment, the slit SL1 is formed so as to inhibit the current path between the source pads PDS1a and PDS1b and the connection portion SZ1. Note that the two slits SL1 (slits SL1a and SL1b) are provided in the case of FIG. 28. Namely, the slit SL1a is provided so as to increase a resistance of a current path between the connection portion SZ1 and the source pad PDS1a, and the slit SL1b is provided so as to increase a resistance of a current path between the connection portion SZ1 and the source pad PDS1b. Therefore, the description relating to "<Formation Position of Slit>" which has been given in the above-described first embodiment can be applied also to the seventh embodiment by replacing "Kelvin pad PDK" with "connection portion SZ1". This part of the description is given again as follows.

That is, it is preferable that at least a part of the slit SL1a is arranged between the source pad PDS1a and the connection portion SZ1 when seen in a plan view. Namely, it is preferable that at least a part of the slit SL1a is arranged inside the region RG5a shown with dotted hatching in FIG. 30 when seen in a plan view. Accordingly, it is possible to increase the resistance of the current path between the source pad PDS1a and the connection portion SZ1 as compared to the case of not providing the slit SL1a. Also, at least a part of the slit SL1b is arranged between the source pad PDS1b and the connection portion SZ1 when seen in a plan view. Namely, at least a part of the slit SL1b is arranged inside the region RG5b shown with dotted hatching in FIG. 30 when seen in a plan view. Accordingly, it is possible to increase the resistance of the current path between the source pad PDS1b and the connection portion SZ1 as compared to the case of not providing the slit SL1b. This is because since there is a possibility that the region RG5a functions as the current path between the source pad PDS1a and the connection portion SZ1, it is possible to inhibit the current path between the source pad PDS1a and the connection portion SZ1 by the slit SL1a by providing the slit SL1a so that at least a part of the slit SL1a is arranged in the region RG5a. The same goes for the descriptions regarding the region RG5b and the slit SL1b.

In addition, it is preferable that the shortest path STK2a between the source pad PDS1a and the connection portion SZ1 is blocked by the slit SL1a when seen in a plan view. Namely, it is preferable that the slit SL1a passes across the shortest path STK2a between the source pad PDS1a and the connection portion SZ1 in FIG. 30 when seen in a plan view. In other words, it is preferable that a part of the slit SL1a overlaps the shortest path STK2a between the source pad PDS1a and the connection portion SZ1 when seen in a plan view. Accordingly, it is possible to more accurately increase the resistance of the current path between the source pad PDS1a and the connection portion SZ1 as compared to the case of not providing the slit SL1a. This is because since the shortest path STK2a between the source pad PDS1a and the connection portion SZ1 is most likely to function as the current path between the source pad PDS1a and the connection portion SZ1, it is particularly effective to block the shortest path STK2a by the slit SL1a for increasing the resistance of the current path between the source pad PDS1a and the connection portion SZ1.

Similarly, it is preferable that the shortest path (STK2b) between the source pad PDS1b and the connection portion SZ1 is blocked by the slit SL1b when seen in a plan view. Namely, it is preferable that the slit SL1b passes across the shortest path STK2b between the source pad PDS1b and the connection portion SZ1 in FIG. 30 when seen in a plan view. In other words, it is preferable that a part of the slit SL1b overlaps the shortest path STK2b between the source pad PDS1b and the connection portion SZ1 when seen in a plan view. Accordingly, it is possible to more accurately increase the resistance of the current path between the source pad PDS1b and the connection portion SZ1 as compared to the case of not providing the slit SL1b.

The resistance of the current path between the source pads PDS1a and PD1b and the connection portion SZ1 can be increased by providing the above-described slits SL1a and SL1b, and the potential difference can be generated between the source pads PDS1a and PDS1b and the Kelvin pad PDK when the gate voltage is high, and thus, it is possible to suppress the dependence of the sense ratio with respect to the gate voltage as described above.

In addition, in the seventh embodiment, the electrode EK for forming the Kelvin pad PDK is provided at a different planar position from the main MOS region RG1, the Kelvin opening portion OPK is provided on the electrode EK to form the Kelvin pad PDK, and the electrode EK is electrically connected to the source electrode ES1 via the wiring W1. The same technique can be applied also to the source pad PDS2.

Namely, it can be configured so that an electrode for forming the source pad PDS2 is provided at a different planar position from the sense MOS region RG2, the source opening portion OPS2 is provided on the electrode to form the source pad PDS2, and the electrode is electrically connected to the source electrode ES2 via a wiring. The electrode for forming the source pad PDS2 and the wiring which electrically connects the electrode and the source electrode ES2 can be integrally formed with the source electrode ES2 in the same layer as the source electrode ES2. Note that this technique can be applied also to the above-described first to sixth embodiments in addition to the seventh embodiment, and the source pad PDS2 is arranged at a position different from the sense MOS region RG2 when seen in a plan view if applied.

Eighth Embodiment

Figure 31:
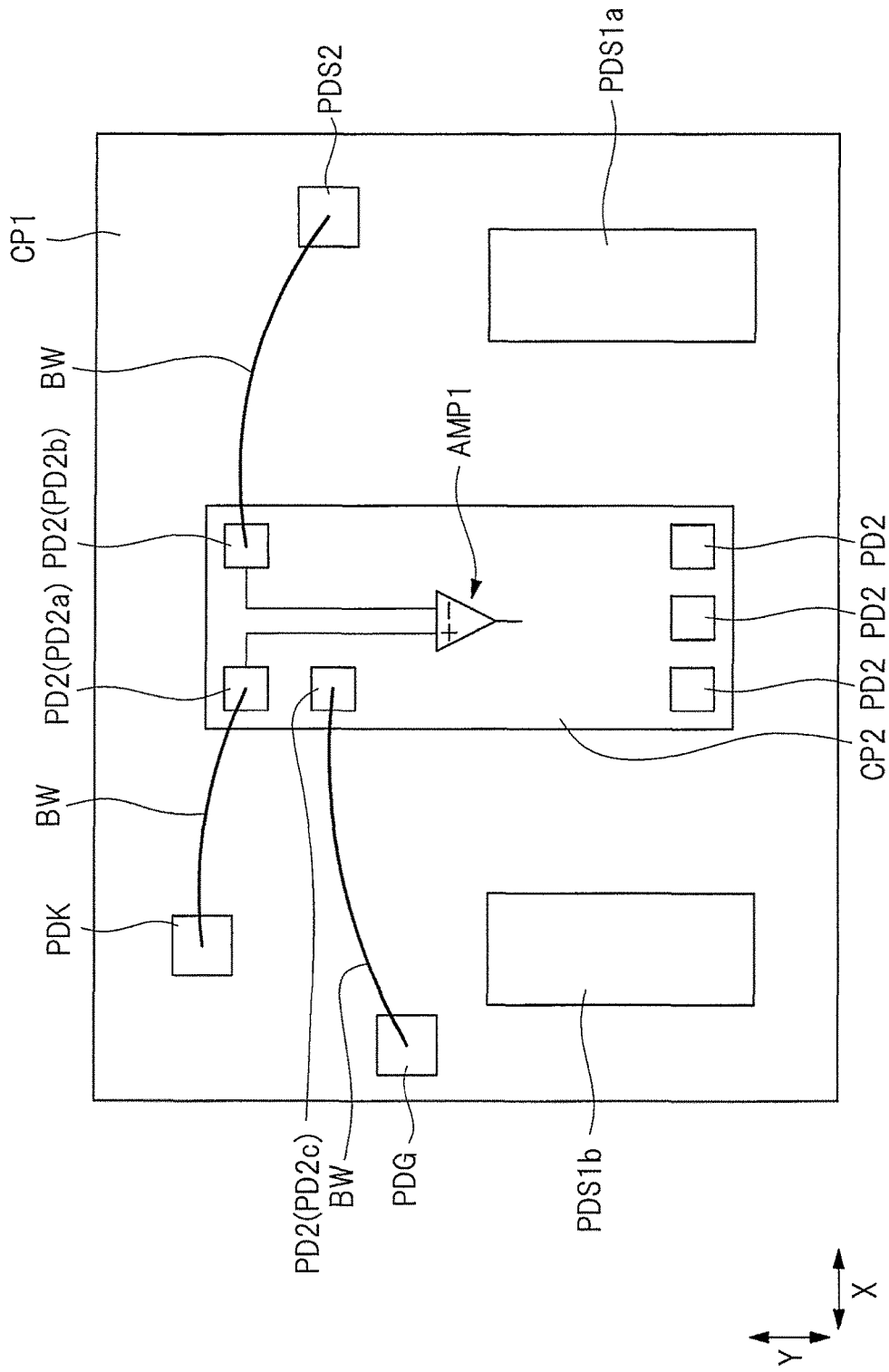
FIG. 31 is a plan view showing a connection structure between semiconductor chips.

In the eighth embodiment, a connection example between the semiconductor chip CP1 according to the above-described seventh embodiment and another semiconductor chip CP2 will be described. FIG. 31 is a plan view showing a connection structure between the semiconductor chip CP1 and the semiconductor chip CP2.

The semiconductor chip CP1 shown in FIG. 31 corresponds to the semiconductor chip CP1 according to the above-described seventh embodiment. The semiconductor chip CP2 shown in FIG. 31 is basically the same as the semiconductor chip CP2 of the above-described sixth embodiment (FIG. 26), and thus, the repetitive description thereof will be omitted herein.

The semiconductor chip CP2 is mounted on the semiconductor chip CP1, and a so-called chip-on-chip structure is formed in FIG. 31. The semiconductor chip CP2 is mounted on an upper surface of the semiconductor chip CP1 and is bonded thereto via a bonding material (not shown). The semiconductor chip CP2 is mounted at a position which does not overlap the pads (PDG, PDK, PDS1a and PDS1b) of the semiconductor chip CP1 in the upper surface of the semiconductor chip CP1 when seen in a plan view.

The connection relation between the pads (PDG, PDK, PDS1a and PDS1b) of the semiconductor chip CP1 and the pad PD2 of the semiconductor chip CP2 in FIG. 31 is the same as that in FIG. 26 described above. Namely, also in the case of FIG. 31, the Kelvin pad PDK of the semiconductor chip CP1 is electrically connected to the pad PD2a of the semiconductor chip CP2 via a conductive connection member BW, and the source pad PDS2 of the semiconductor chip CP1 is electrically connected to the pad PD2b of the semiconductor chip CP2 via the conductive connection member BW. The gate pad PDG of the semiconductor chip CP1 is electrically connected to the pad PD2c of the semiconductor chip CP2 via the conductive connection member BW. The connection member BW is, for example, a bonding wire. The source pads PDS1a and PDS1b of the semiconductor chip CP1 are electrically connected to the above-described load LOD, and thus are not connected to the semiconductor chip CP2.

Therefore, also in the case of FIG. 31, the Kelvin pad PDK of the semiconductor chip CP1 is electrically connected to one input node of the operational amplifier AMP1 via the connection member BW, the pad PD2a of the semiconductor chip CP2 and the internal wiring of the semiconductor chip CP2. In addition, the source pad PDS2 of the semiconductor chip CP1 is electrically connected to the other input node of the operational amplifier AMP1 via the connection member BW, the pad PD2b of the semiconductor chip CP2 and the internal wiring of the semiconductor chip CP2. Accordingly, it is possible to detect the current of the sense MOSFET 2 while controlling a potential of the Kelvin pad PDK of the semiconductor chip CP1 and a potential of the source pad PDS2 of the semiconductor chip CP1 to be equal to each other by the above-described current detection circuit unit DKC including the operational amplifier AMP1.

Ninth Embodiment

FIGS. 32 to 35 are plan views showing a chip layout of the semiconductor chip CP1 according to the ninth embodiment and correspond to FIGS. 2 to 4 and 19, respectively.

Figure 32:
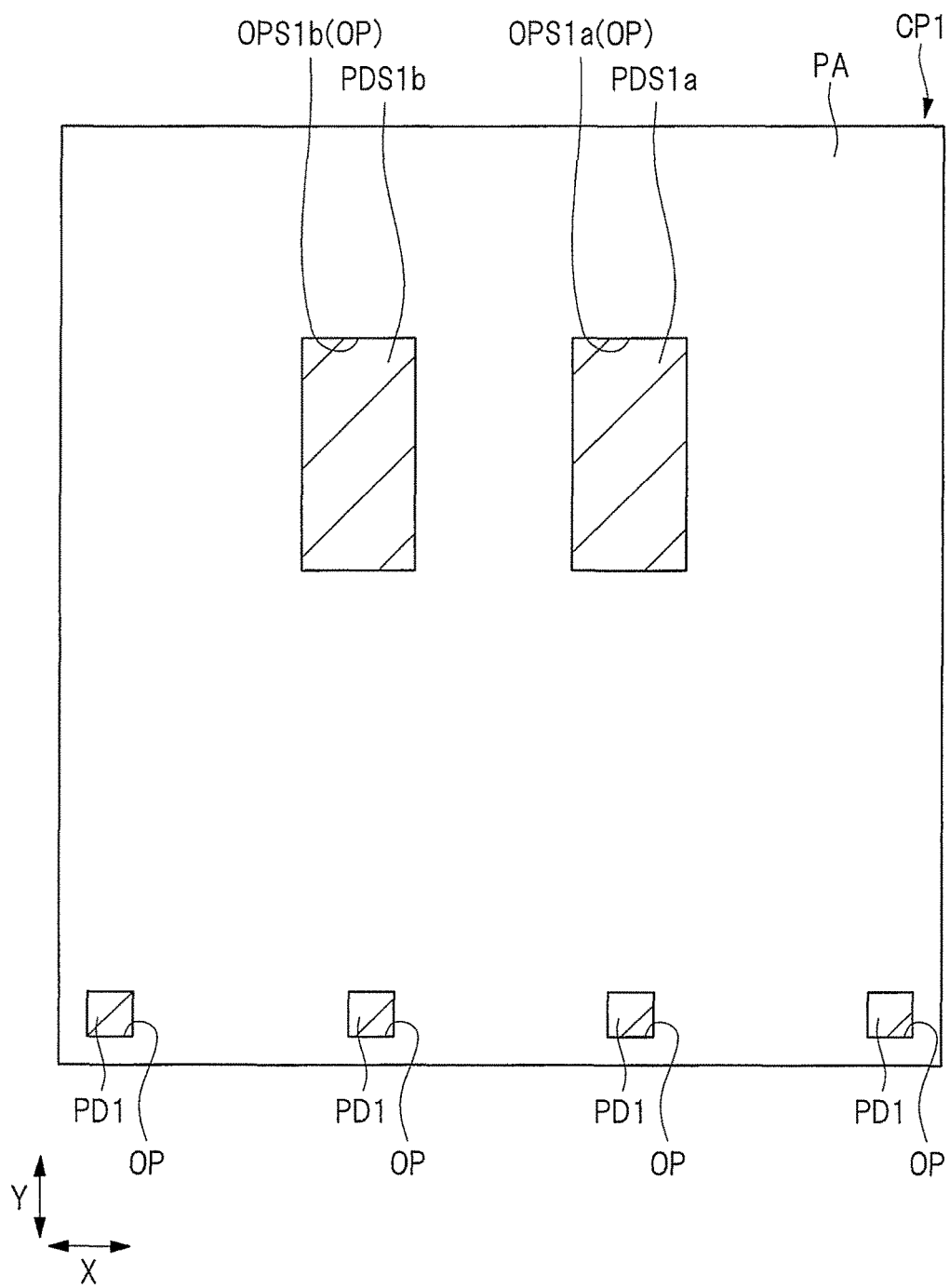
FIG. 32 is a plan view showing a chip layout of a semiconductor chip according to another embodiment.
Figure 33:
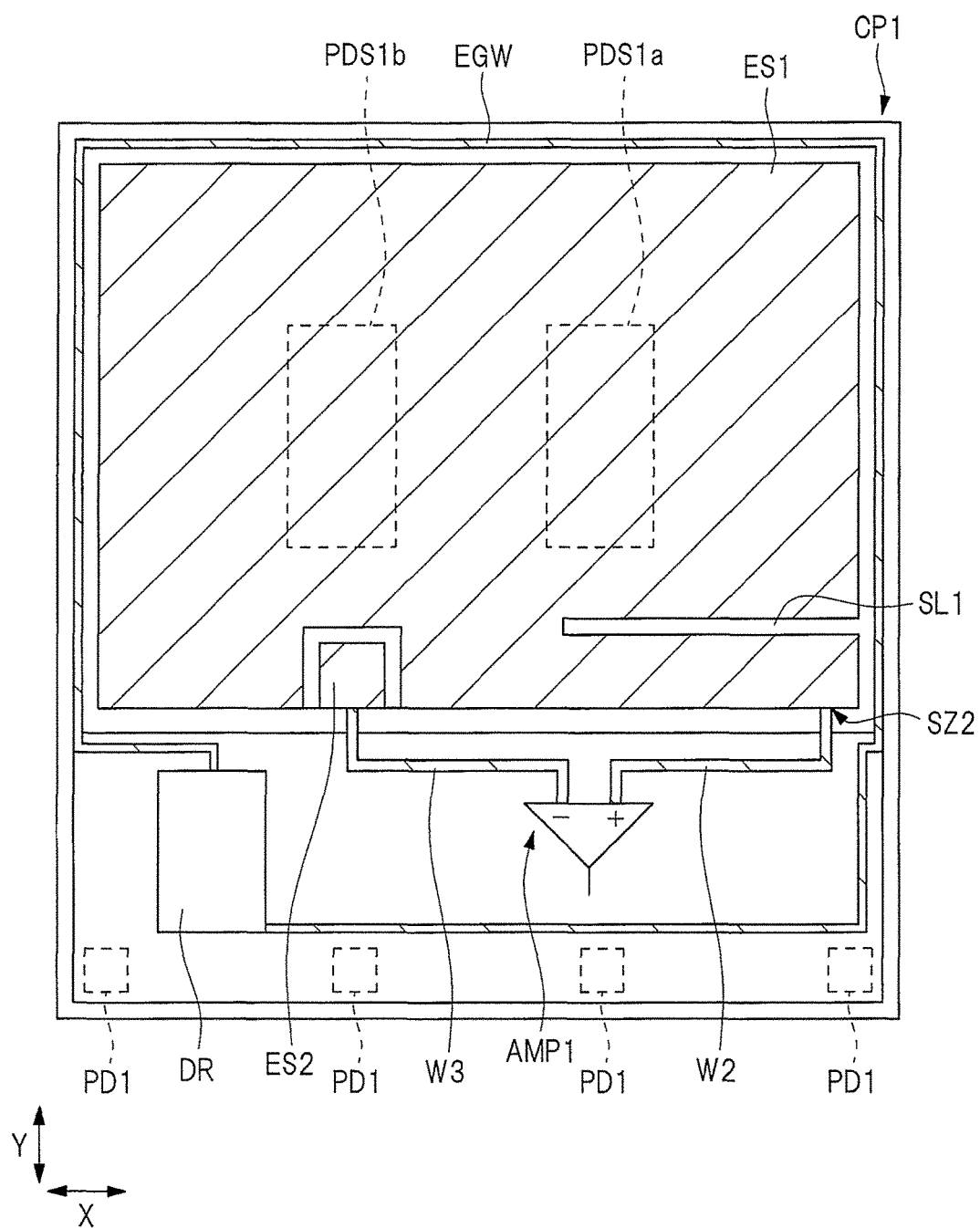
FIG. 33 is a plan view showing a chip layout of a semiconductor chip according to another embodiment.
Figure 34:
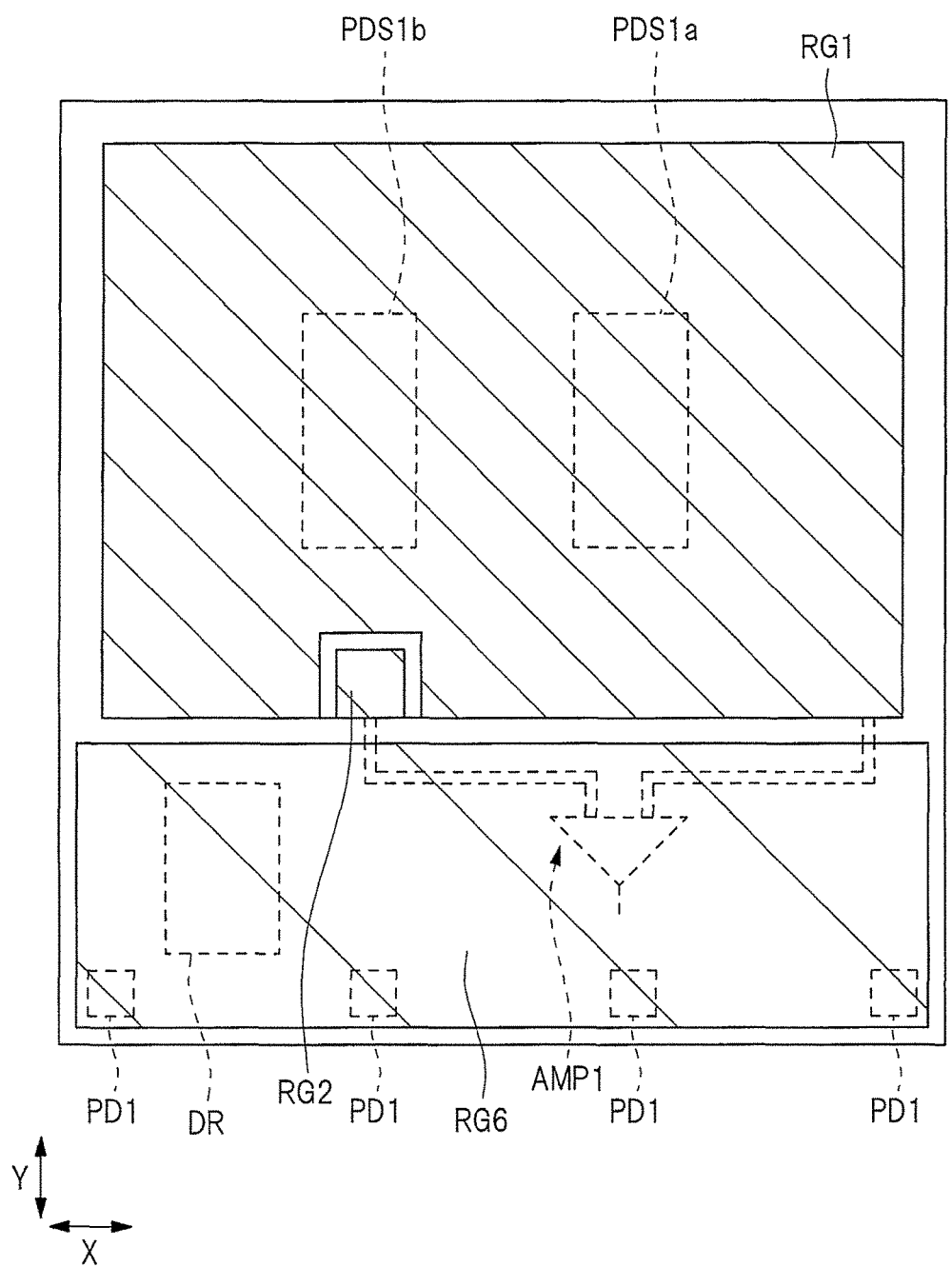
FIG. 34 is a plan view showing a chip layout of a semiconductor chip according to another embodiment.
Figure 35:
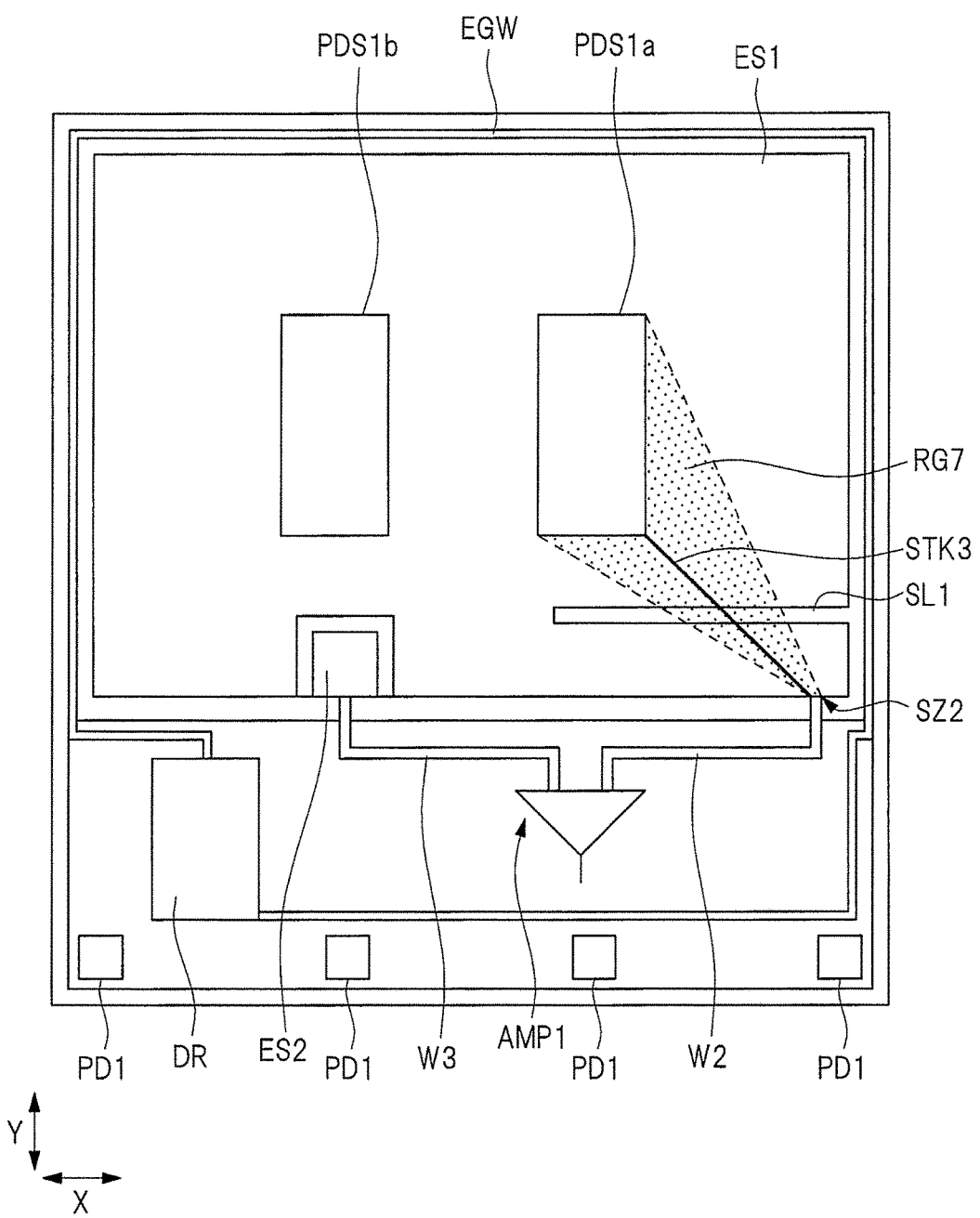
FIG. 35 is a plan view showing a chip layout of a semiconductor chip according to another embodiment.

Also in FIG. 32, the bonding pads (the pad PD1 and the source pads PDS1a and PDS1b) are shown with hatching like in FIG. 2 described above. In addition, also in FIG. 33, the metal layers (the gate wiring EGW, the source electrodes ES1 and ES2 and wirings W2 and W3) in the semiconductor chip CP1 are shown with hatching and each position of the bonding pads (the pad PD1 and the source pads PDS1a and PDS1b) is shown with the dotted line like in FIG. 3 described above. In addition, also in FIG. 34, the main MOS region RG1 and the sense MOS region RG2 in the semiconductor chip CP1 are shown with hatching and each position of the bonding pads (the pad PD1 and the source pads PDS1a and PDS1b) is shown with the dotted line like in FIG. 4 described above. In addition, in FIG. 34, a control circuit region RG6 in which the driver circuit DR, the current detection circuit unit DKC and the like are formed is also shown with hatching. In addition, also in FIG. 35, a planar layout of the metal layers (the gate wiring EGW, the source electrodes ES1 and ES2 and the wirings W2 and W3) in the semiconductor chip CP1 is shown and a region RG7 between the source pad PDS1a and a connection portion SZ2 when seen in a plan view is shown with dotted hatching like in FIG. 19 described above. In addition, in FIG. 35, a shortest path between the source pad PDS1a and the connection portion SZ2 is shown with the bold line denoted by reference character STK3.

In the case of the above-described first to eighth embodiments, the current detection circuit unit DKC is formed outside the semiconductor chip CP1, and the current detection circuit unit DKC is not formed inside the semiconductor chip CP1.

On the contrary, not only the power MOSFET 1 and the sense MOSFET 2 but also a part or a whole of the current detection circuit unit DKC and the driver circuit DR are incorporated in the semiconductor chip CP1 in the ninth embodiment. At least the operational amplifier AMP1 of the above-described current detection circuit unit DKC is incorporated in the semiconductor chip CP1. In addition, there may be the case in which a part or a whole of the above-described control circuit unit CLC is further incorporated in the semiconductor chip CP1.

Thus, in the case of the ninth embodiment, the gate pad PDG, the Kelvin pad PDK and the source pad PDS2 are not formed in the semiconductor chip CP1.

Instead, in the ninth embodiment, the gate wiring EGW is electrically connected to the driver circuit DR in the semiconductor chip CP1. In addition, one (corresponding to the node N1 in FIG. 1 described above) of the two input nodes of the operational amplifier AMP1 formed in the semiconductor chip CP1 is electrically connected to the source electrode ES1 via the wiring W2 formed in the semiconductor chip CP1. Further, the other (corresponding to the node N2 in FIG. 1 described above) of the two input nodes of the operational amplifier AMP1 formed in the semiconductor chip CP1 is electrically connected to the source electrode ES2 via the wiring W3 formed in the semiconductor chip CP1, and accordingly, is electrically connected to the source of the sense MOSFET 2. Namely, the source electrode ES1 is electrically connected to one input node of the operational amplifier AMP1 via the wiring W2 and the source electrode ES2 is electrically connected to the other input node of the operational amplifier AMP1 via the wiring W3 in the semiconductor chip CP1. Accordingly, it is possible to detect the current of the sense MOSFET 2 while controlling a potential of the connection portion SZ2 of the semiconductor chip CP1 and a potential of the source electrode ES2 of the semiconductor chip CP1 to be equal to each other by the above-described current detection circuit unit DKC including the operational amplifier AMP1. Herein, the connection portion SZ2 is a connection portion (connection point) between the wiring W2 and the source electrode ES1.

At least a part of the wiring W2 which is in the vicinity of the connection portion SZ2 between the wiring W2 and the source electrode ES1 is formed in the same layer as the source electrode ES1 and is integrally formed with the source electrode ES1. The wiring W2 is the wiring which electrically connects the source electrode ES1 and one input node of the operational amplifier AMP1 in the semiconductor chip CP1. In addition, at least a part of the wiring W3 which is in the vicinity of a connection portion between the wiring W3 and the source electrode ES2 is formed in the same layer as the source electrode ES2 and is integrally formed with the source electrode ES2. The wiring W3 is the wiring which electrically connects the source electrode ES2 and the other input node of the operational amplifier AMP1 in the semiconductor chip CP1.

Also in the case of the ninth embodiment, the slit SL1 is provided in the source electrode ES1 and a function of the slit SL1 is basically the same as that in the above-described first to eighth embodiments. However, a concept of the ninth embodiment is slightly different due to the absence of the Kelvin pad PDK, and is close to the above-described seventh embodiment.

Namely, in the case of the ninth embodiment, the Kelvin pad PDK is not provided and the source electrode ES1 is electrically connected to the current detection circuit unit DKC (more specifically, the operational amplifier AMP1) via the wiring W2. The source electrode ES1 is arranged over the main MOS region RG1, and the wiring W2 is not arranged over the main MOS region RG1, but is arranged at the position different from the main MOS region RG1 when seen in a plan view. Therefore, the source electrode ES1 serves as a path of a current flowing to the power MOSFET 1 formed in the main MOS region RG1, but the wiring W2 does not serve as the path of the current flowing to the power MOSFET 1 formed in the main MOS region RG1.

Therefore, in the ninth embodiment, the slit SL1 is formed so that a resistance of the current path between the source pads PDS1a and PDS1b and the connection portion SZ2 increases in the case of providing the slit SL1 as compared to the case of not providing the slit SL1. The resistance of the current path between the connection portion SZ2 between the wiring W2 and the source electrode ES1 and the source pads PDS1a and PDS1b is increased by providing the slit SL1, so that a potential difference can be generated between the source pads PDS1a and PDS1b and the connection portion SZ2 when the gate voltage is high. Accordingly, it is possible to generate a potential difference between the potential of the source pads PDS1a and PDS1b and the potential which is input from the connection portion SZ2 to the current detection circuit unit DKC (more specifically, the operational amplifier AMP1) via the wiring W2. Consequently, it is possible to suppress the dependence of the sense ratio with respect to the gate voltage as described in the first embodiment above. Namely, the effect obtained by providing the slit SL1 in the ninth embodiment is the same as that described in the first embodiment above.

Therefore, in the case of the ninth embodiment, the slit SL1 is formed so as to inhibit the current path between the source pads PDS1a and PDS1b and the connection portion SZ2. Thus, the description relating to "<Formation Position of Slit>" which has been given in the above-described first embodiment can be applied also to the ninth embodiment by replacing "Kelvin pad PDK" with "connection portion SZ2". This part of the description is given again as follows.

That is, it is preferable that at least a part of the slit SL1 is arranged between the source pad PDS1a and the connection portion SZ2 when seen in a plan view. Namely, it is preferable that at least a part of the slit SL1 is arranged inside the region RG7 shown with dotted hatching in FIG. 35 when seen in a plan view. Accordingly, it is possible to increase the resistance of the current path between the source pad PDS1a and the connection portion SZ2 as compared to the case of not providing the slit SL1. This is because since there is a possibility that the region RG7 functions as the current path between the source pad PDS1a and the connection portion SZ2, it is possible to inhibit the current path between the source pad PDS1a and the connection portion SZ2 by the slit SL1 by providing the slit SL1 so that at least a part of the slit SL1 is arranged in the region RG7. Of the source pads PDS1a and PDS1b, the source pad PDS1a is closer to the connection portion SZ2.

In addition, it is preferable that the shortest path STK3 between the source pad PDS1a and the connection portion SZ2 is blocked by the slit SL1 when seen in a plan view. Namely, it is preferable that the slit SL1 passes across the shortest path STK3 between the source pad PDS1a and the connection portion SZ2 in FIG. 35 when seen in a plan view. In other words, it is preferable that a part of the slit SL1 overlaps the shortest path STK3 between the source pad PDS1a and the connection portion SZ2 when seen in a plan view. Accordingly, it is possible to more accurately increase the resistance of the current path between the source pad PDS1a and the connection portion SZ2 as compared to the case of not providing the slit SL1. This is because since the shortest path STK3 between the source pad PDS1a and the connection portion SZ2 is most likely to function as the current path between the source pad PDS1a and the connection portion SZ2, it is particularly effective to block the shortest path STK3 by the slit SL1 for increasing the resistance of the current path between the source pad PDS1a and the connection portion SZ2.

The resistance of the current path between the source pads PDS1a and PD1b and the connection portion SZ2 can be increased by providing the above-described slit SL1, and the potential difference can be generated between the source pads PDS1a and PDS1b and the connection portion SZ2 when the gate voltage is high, and thus, it is possible to suppress the dependence of the sense ratio with respect to the gate voltage as described above.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:
1. A semiconductor device comprising:
a semiconductor substrate;
a first MOSFET formed in a first region of a main surface of the semiconductor substrate;
a second MOSFET formed in a second region of the main surface of the semiconductor substrate;
a first source electrode formed over the first region and electrically connected to a source of the first MOSFET;
a second source electrode formed over the main surface of the semiconductor substrate and electrically connected to a source of the second MOSFET;
a gate electrode formed over the main surface of the semiconductor substrate and electrically connected to a gate of the first MOSFET and a gate of the second MOSFET;
a drain electrode formed on a back surface on an opposite side of the main surface of the semiconductor substrate and electrically connected to a drain of the first MOSFET and a drain of the second MOSFET;
an insulating film formed over the main surface of the semiconductor substrate and covering the first source electrode, the second source electrode and the gate electrode;
a first source pad formed of the first source electrode exposed from a first opening portion of the insulating film;
a second source pad formed of the first source electrode exposed from a second opening portion of the insulating film;
a third source pad formed of the second source electrode exposed from a third opening portion of the insulating film; and
a gate pad formed of the gate electrode exposed from a fourth opening portion of the insulating film,
wherein the second MOSFET is an element for detecting a current flowing to the first MOSFET,
wherein the second region is an area which is smaller than the first region on the main surface of the semiconductor substrate,
wherein the first source pad and the second source pad are arranged over the first region,
wherein the first source pad is a pad for outputting the current flowing to the first MOSFET,
wherein the second source pad is a pad for detecting a source potential of the first MOSFET,
wherein the first source electrode has a slit, and
wherein at least a part of the slit is arranged between the first source pad and the second source pad when seen in a plan view.

2. The semiconductor device according to claim 1,
wherein a shortest path between the first source pad and the second source pad is blocked by the slit when seen in a plan view.

3. The semiconductor device according to claim 2,
wherein the slit is arranged closer to the second source pad than to the first source pad when seen in a plan view.

4. The semiconductor device according to claim 2,
wherein the second source pad is arranged closer to a first corner of the semiconductor device than to other corners of the semiconductor device other than the first corner when seen in a plan view, and
wherein the slit is formed so that the second source pad is surrounded by two sides which form the first corner of the semiconductor device and the slit when seen in a plan view.

5. The semiconductor device according to claim 1,
wherein the first MOSFET is formed of a plurality of unit transistor cells which are formed in the first region of the main surface of the semiconductor substrate and are connected in parallel to each other.

6. The semiconductor device according to claim 5,
wherein the unit transistor cell is not formed under the slit in the main surface of the semiconductor substrate.

7. The semiconductor device according to claim 1,
wherein the second source pad and the third source pad are electrically connected to a current detection circuit unit for detecting a current flowing to the second MOSFET, and
wherein the current detection circuit unit is provided outside the semiconductor device.

8. The semiconductor device according to claim 7,
wherein the current detection circuit unit includes a differential amplifier,
wherein the second source pad is electrically connected to a first input node of the differential amplifier of the current detection circuit unit, and
wherein the third source pad is electrically connected to a second input node of the differential amplifier of the current detection circuit unit.

9. A semiconductor device comprising:
a semiconductor substrate;
a first MOSFET formed in a first region of a main surface of the semiconductor substrate;
a second MOSFET formed in a second region of the main surface of the semiconductor substrate;
a first source electrode formed over the first region and electrically connected to a source of the first MOSFET;
a second source electrode formed over the main surface of the semiconductor substrate and electrically connected to a source of the second MOSFET;
a third source electrode formed over the main surface of the semiconductor substrate and electrically connected to the first source electrode via a first wiring;
a gate electrode formed over the main surface of the semiconductor substrate and electrically connected to a gate of the first MOSFET and a gate of the second MOSFET;
a drain electrode formed on a back surface on an opposite side of the main surface of the semiconductor substrate and electrically connected to a drain of the first MOSFET and a drain of the second MOSFET;
an insulating film formed over the main surface of the semiconductor substrate and covering the first source electrode, the second source electrode and the gate electrode;
a first source pad formed of the first source electrode exposed from a first opening portion of the insulating film;
a second source pad formed of the third source electrode exposed from a second opening portion of the insulating film;
a third source pad formed of the second source electrode exposed from a third opening portion of the insulating film; and
a gate pad formed of the gate electrode exposed from a fourth opening portion of the insulating film,
wherein the second MOSFET is an element for detecting a current flowing to the first MOSFET,
wherein the second region is an area which is smaller than the first region on the main surface of the semiconductor substrate,
wherein the first source pad is arranged over the first region,
wherein the second source pad is arranged over a region other than the first region,
wherein the first source pad is a pad for outputting the current flowing to the first MOSFET,
wherein the second source pad is a pad for detecting a source potential of the first MOSFET,
wherein the first source electrode has a slit, and
wherein at least a part of the slit is arranged between a connection portion between the first wiring and the first source electrode and the first source pad when seen in a plan view.

10. The semiconductor device according to claim 9,
wherein a shortest path between the connection portion and the first source pad is blocked by the slit when seen in a plan view.

11. A semiconductor device comprising:
a semiconductor substrate;
a first MOSFET formed in a first region of a main surface of the semiconductor substrate;
a second MOSFET formed in a second region of the main surface of the semiconductor substrate;
a current detection circuit unit formed in a third region of the main surface of the semiconductor substrate;
a first source electrode formed over the first region and electrically connected to a source of the first MOSFET;
a drain electrode formed on a back surface on an opposite side of the main surface of the semiconductor substrate and electrically connected to a drain of the first MOSFET and a drain of the second MOSFET;
an insulating film formed over the main surface of the semiconductor substrate and covering the first source electrode; and
a first source pad formed of the first source electrode exposed from a first opening portion of the insulating film,
wherein the drains the first MOSFET and the second MOSFET are electrically connected to each other, and gates thereof are electrically connected to each other,
wherein the second MOSFET is an element for detecting a current flowing to the first MOSFET,
wherein the second region is an area which is smaller than the first region on the main surface of the semiconductor substrate,
wherein the first source pad is a pad for outputting the current flowing to the first MOSFET and is arranged over the first region,
wherein the current detection circuit unit is a circuit for detecting a current flowing to the second MOSFET,
wherein the first source electrode is electrically connected to the current detection circuit unit via a first wiring,
wherein a source of the second MOSFET is electrically connected to the current detection circuit unit,
wherein the first source electrode has a slit, and
wherein at least a part of the slit is arranged between a connection portion between the first wiring and the first source electrode and the first source pad when seen in a plan view.

12. The semiconductor device according to claim 11,
wherein a shortest path between the connection portion and the first source pad is blocked by the slit when seen in a plan view.

13. The semiconductor device according to claim 11,
wherein the current detection circuit unit includes a differential amplifier,
wherein the first source electrode is electrically connected to a first input node of the differential amplifier of the current detection circuit unit via the first wiring, and
wherein the source of the second MOSFET is electrically connected to a second input node of the differential amplifier of the current detection circuit unit.

* * * * *